United States Patent
Sakurai et al.

(10) Patent No.: US 6,397,376 B1
(45) Date of Patent: May 28, 2002

(54) METHOD AND APPARATUS FOR DETERMINING WIRING ROUTE IN CIRCUIT BOARD AND INFORMATION STORAGE MEDIUM

(75) Inventors: Kazunori Sakurai, Chino; Susumu Naitoh, Nagano, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/462,837
(22) PCT Filed: May 13, 1999
(86) PCT No.: PCT/JP99/02491
§ 371 (c)(1),
(2), (4) Date: May 16, 2000
(87) PCT Pub. No.: WO99/59090
PCT Pub. Date: Nov. 18, 1999

(30) Foreign Application Priority Data

May 13, 1998 (JP) .......................... 10-148312

(51) Int. Cl.[7] .............................. G06F 17/50
(52) U.S. Cl. .......................... 716/15; 716/12
(58) Field of Search ..................... 716/13, 15

(56) References Cited

U.S. PATENT DOCUMENTS 5,032,991 A * 7/1991 Davidson et al. ............. 716/15

FOREIGN PATENT DOCUMENTS

| JP | 63-027977 | 2/1988 |
| JP | 2-140967 | 5/1990 |
| JP | 9-331014 | 12/1997 |

* cited by examiner

Primary Examiner—Matthew Smith
Assistant Examiner—Jibreel Speight
(74) Attorney, Agent, or Firm—Hogan & Hartson, L.L.P.

(57) ABSTRACT

A method of determining interconnect routes from a plurality of inner leads to lands 32 arranged in a matrix around the inner leads. The method comprises: a step of virtually placing a plurality of counters 300 between each of the lands 32 arranged in a matrix, the counters being opened by a specified rule and counting the number of interconnect routes passing through a space between adjoining lands; an interconnect route determination step in which processing for determining an interconnect route is repeatedly performed, the processing for determining an interconnect route between a next inner lead adjacent to another inner lead of which an interconnect route has been determined and a next interconnect land 32 which is selected by a specified rule, so that an interconnect, running through a space between lands in which an open counter exists, passes without intersecting with an interconnect route which has already been determined; and a counter control step in which, when a count value of an open counter has reached the set amount, the open counter is closed and another open counter of which an interconnect route to an assigned land thereof has been determined is also closed, then closed counters which are positioned on the opposite side of the open counters to be closed interposing assigned lands therebetween are opened, thereby setting a route for leading a new interconnect.

23 Claims, 61 Drawing Sheets

FIG. 5A
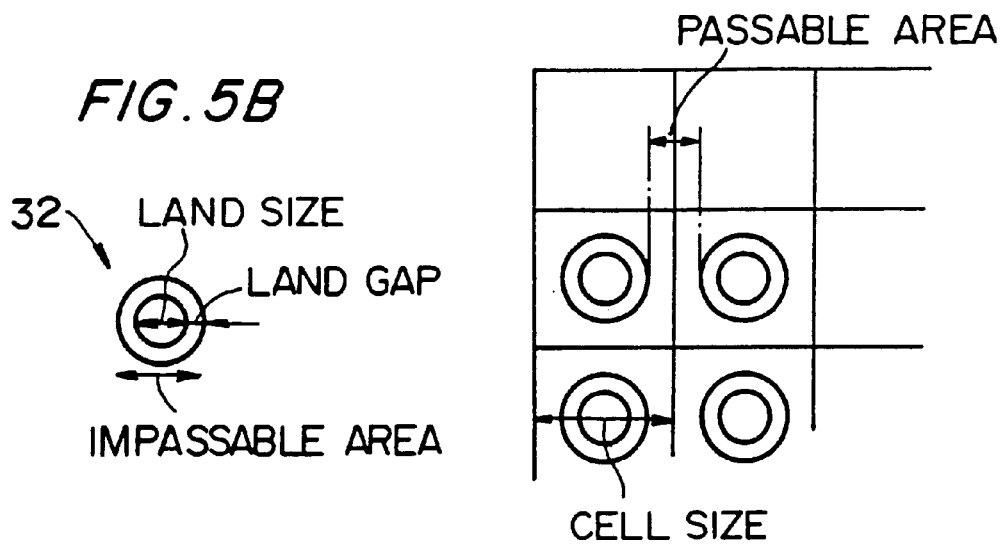
FIG. 5B
FIG. 5C
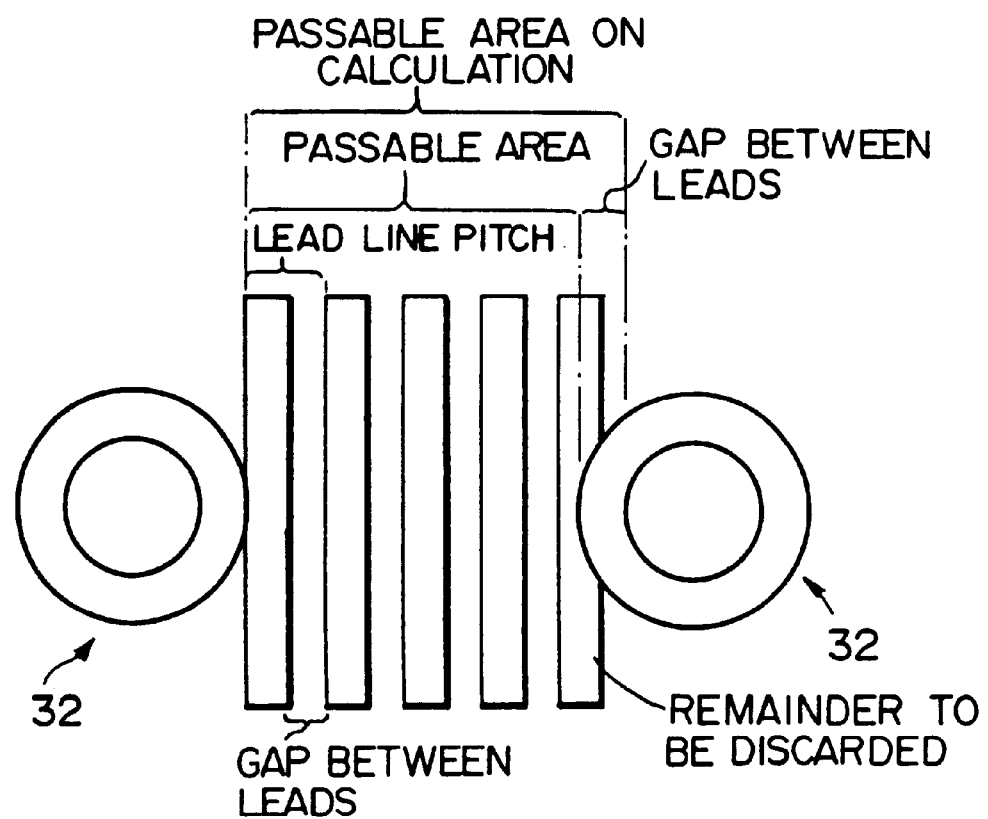

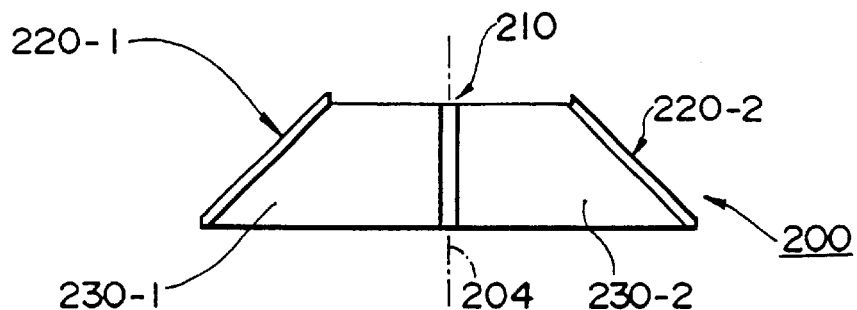
FIG. 7
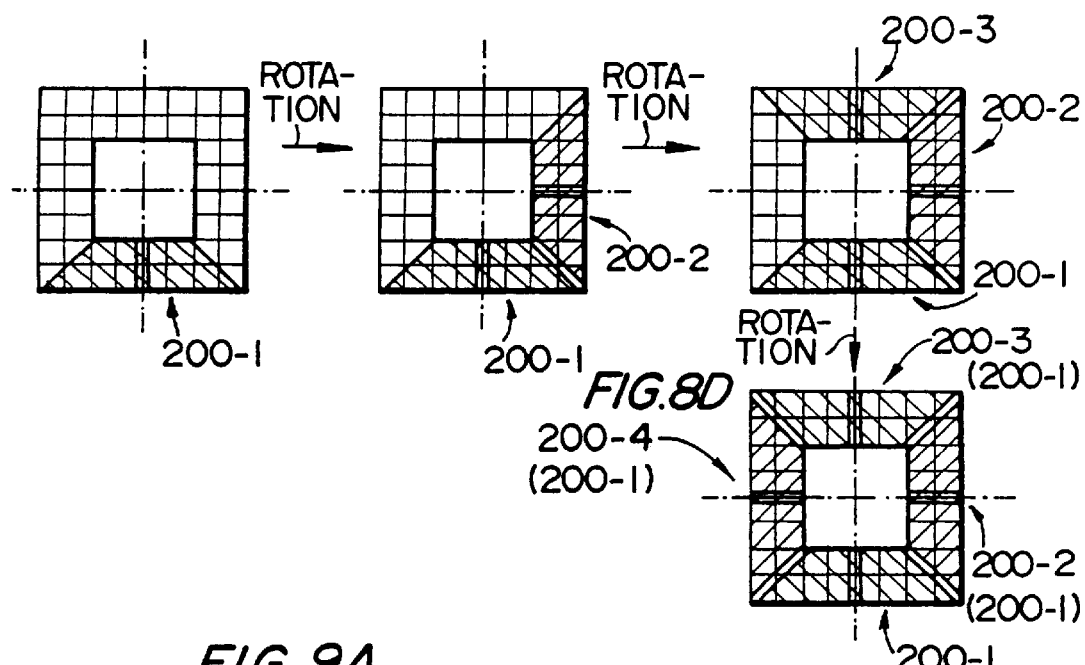
FIG. 8A  FIG. 8B  FIG. 8C
FIG. 8D
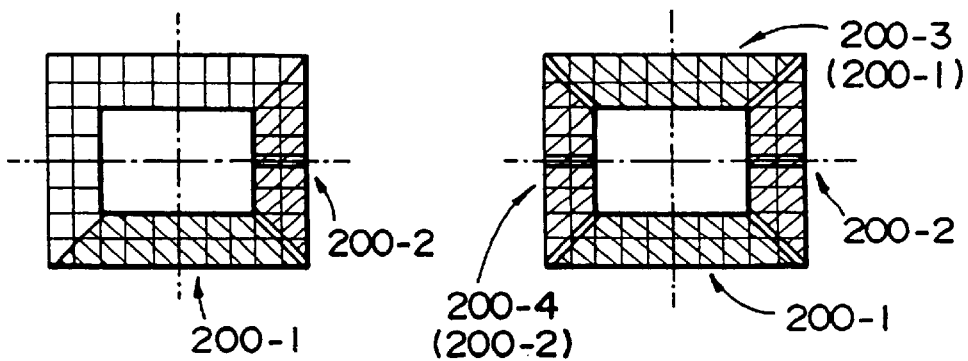
FIG. 9A  FIG. 9B FIG. 12
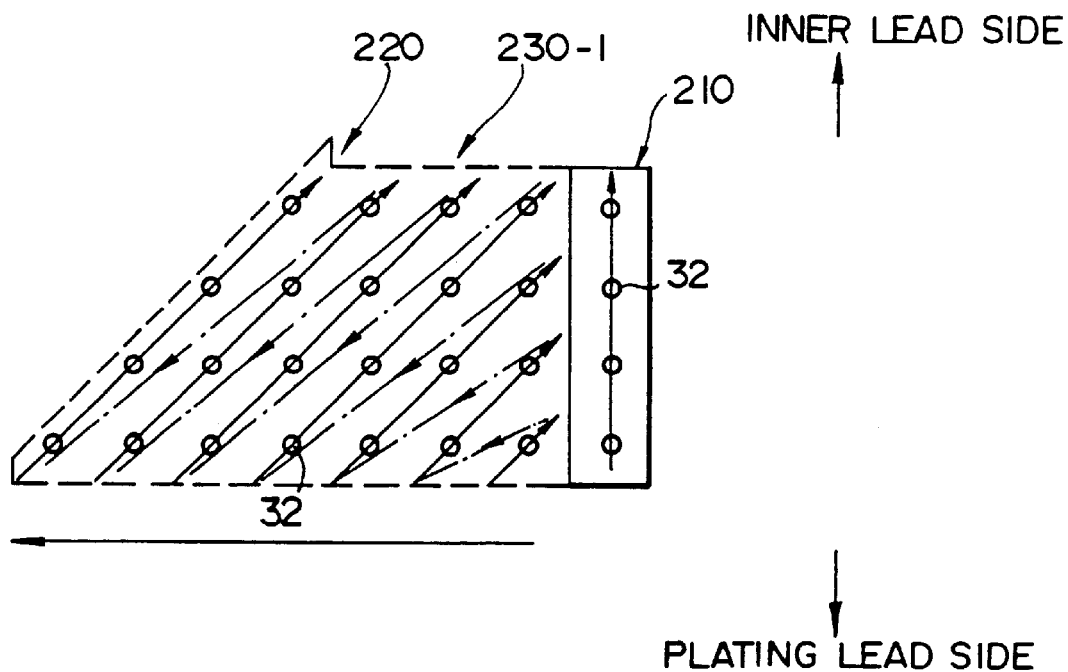
FIG. 13A
FIG. 13B
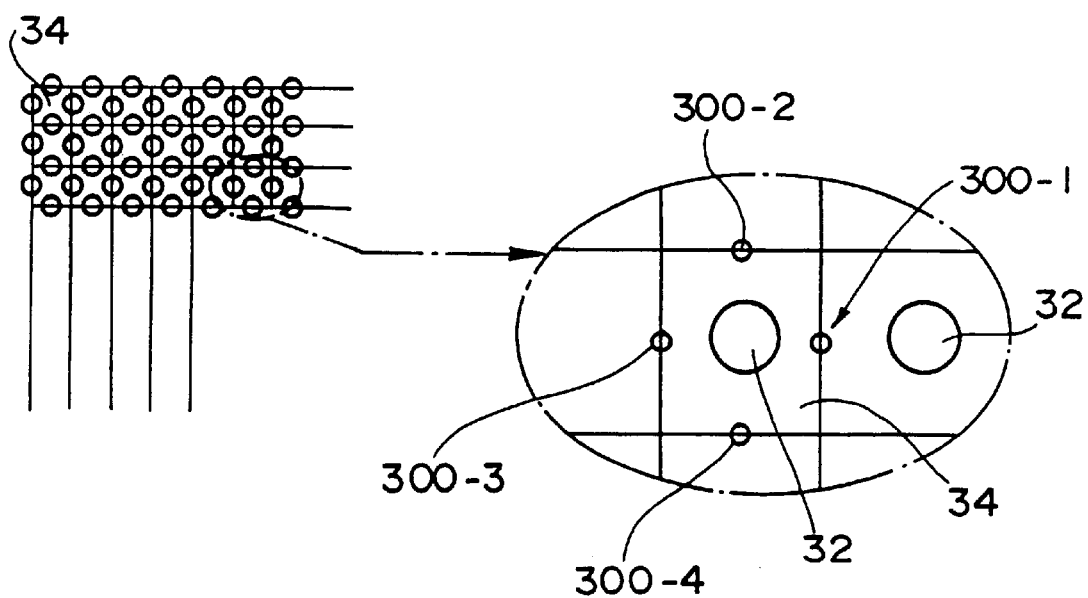

FIG. 27 — FLOW OF DETERMINATION PROCESSING FOR LEAD LINE INTERCONNECT ROUTES

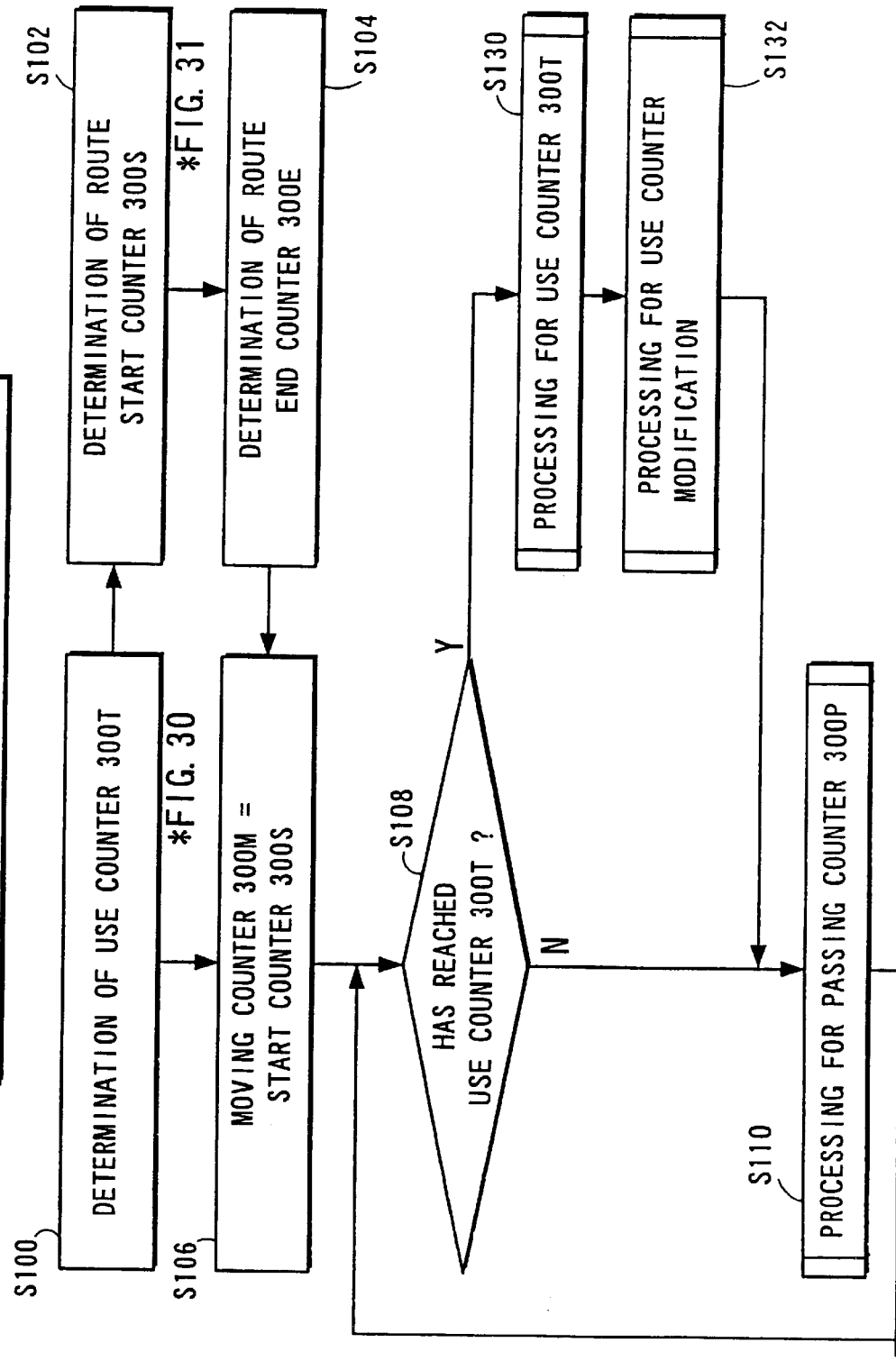

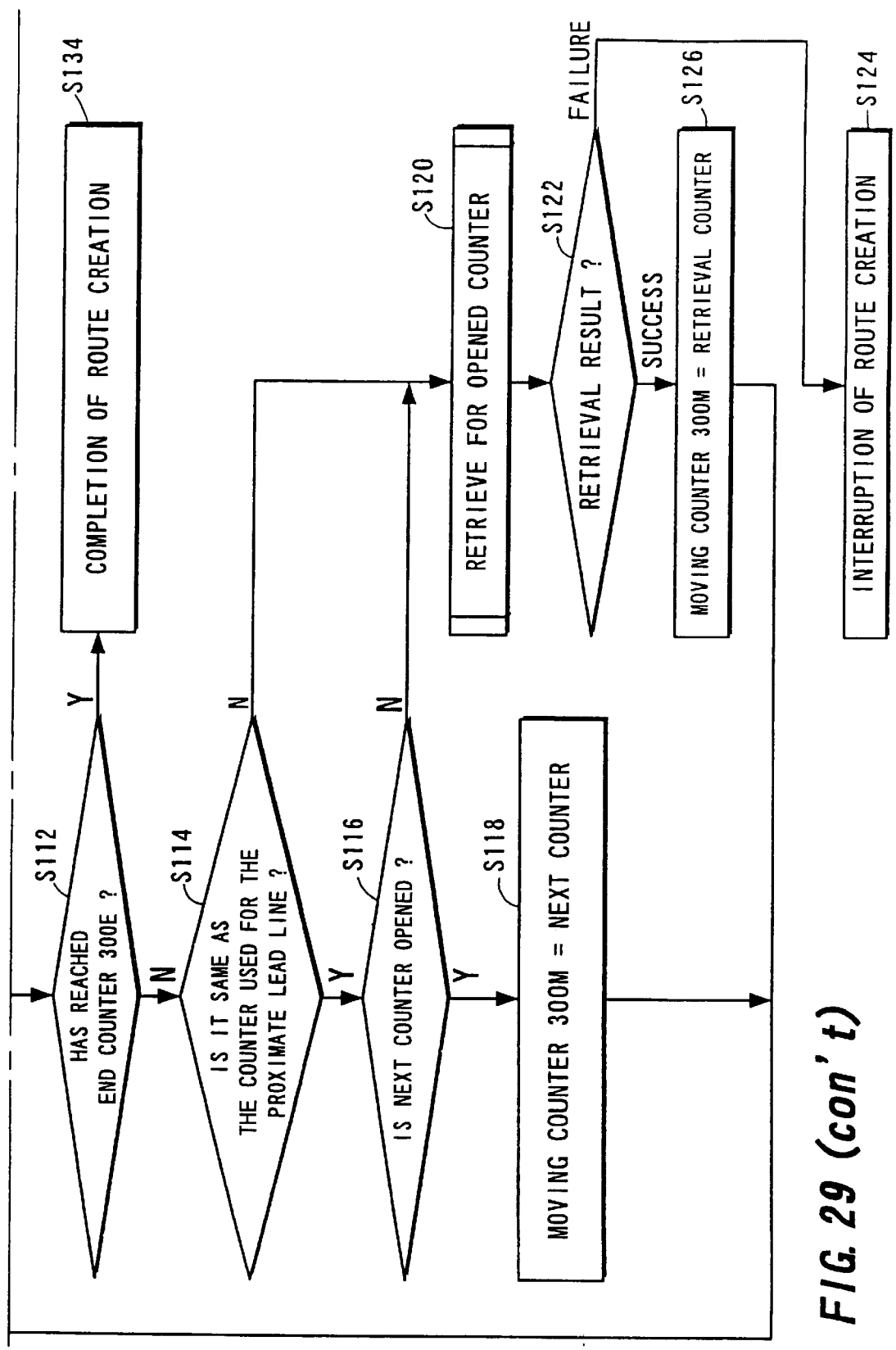
FIG. 29 (con't)

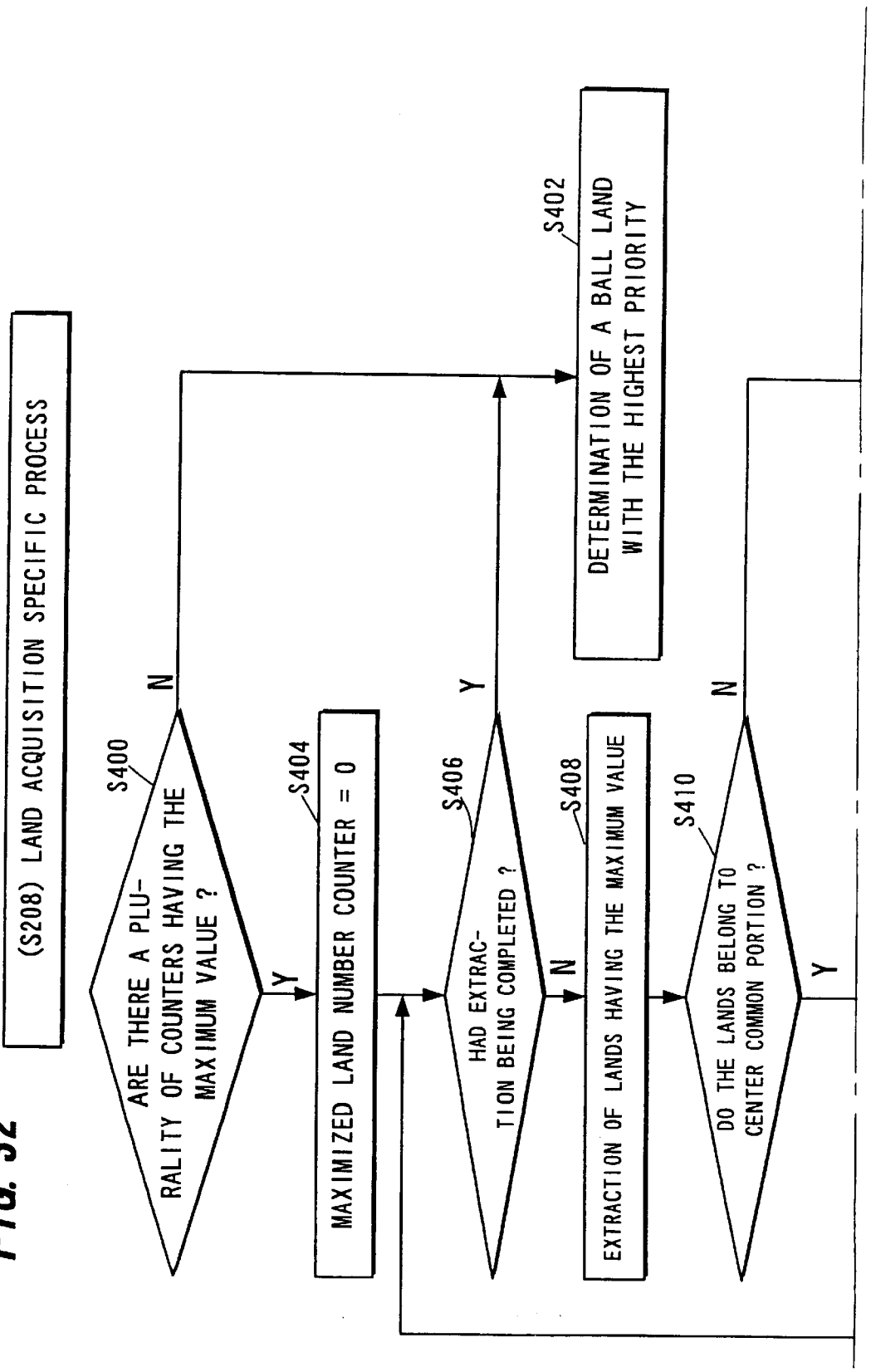

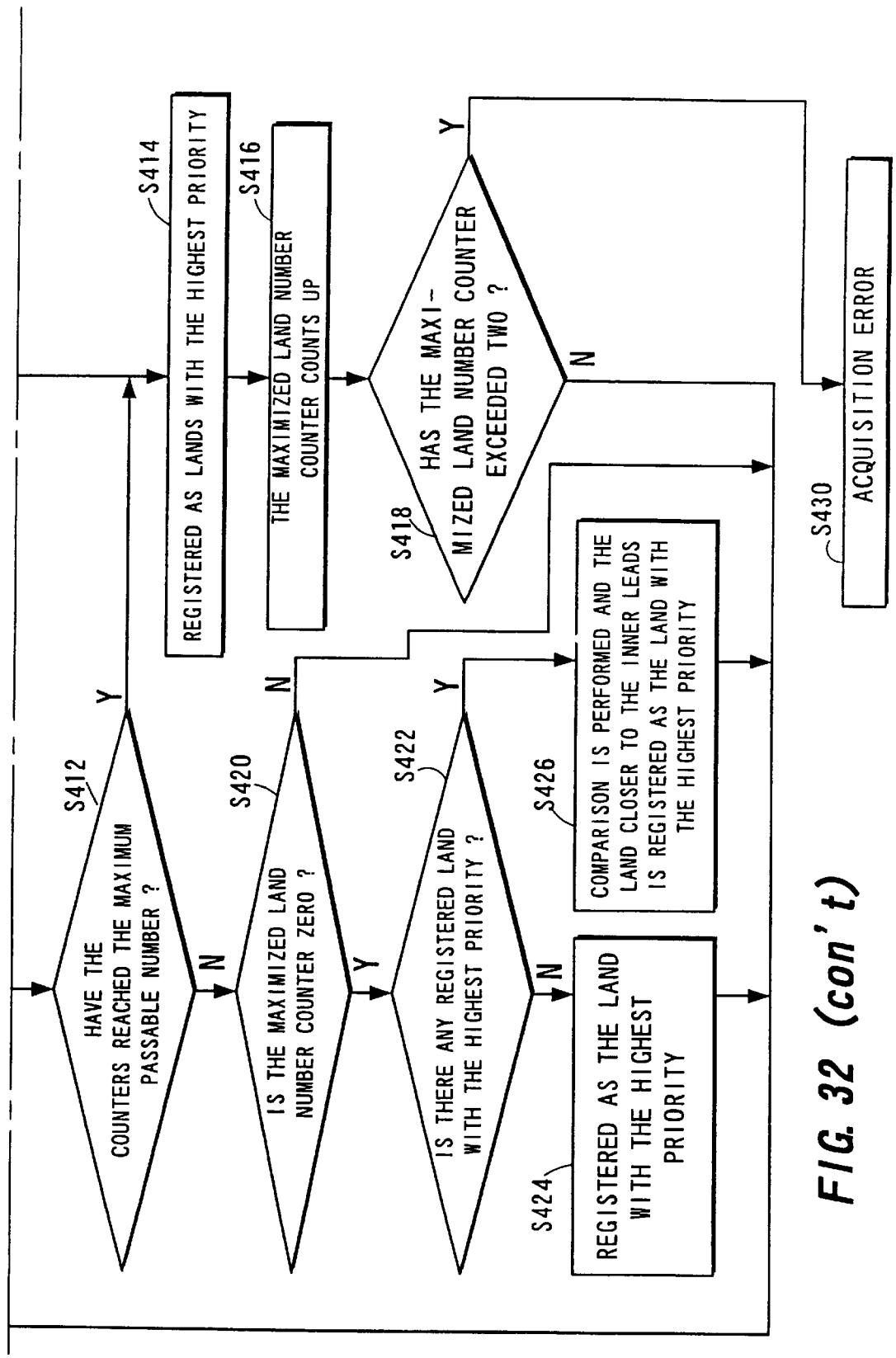
FIG. 32 (con't)

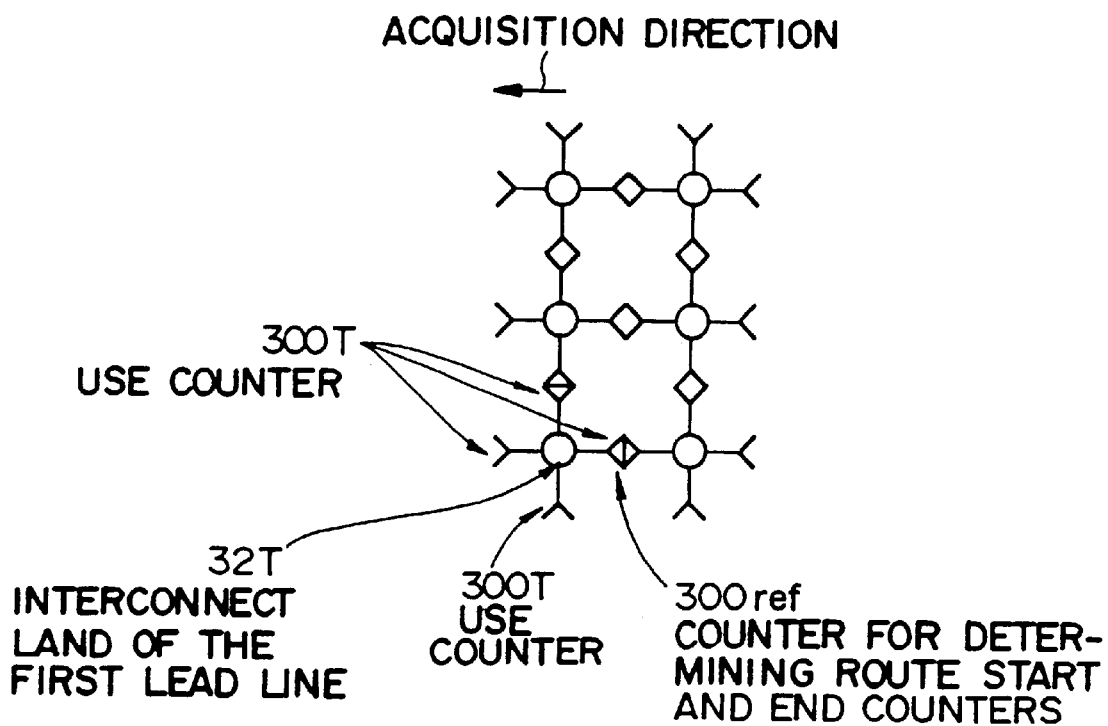

WHEN THERE ARE NO ADJOINING BALL LANDS, A PROCESS SAME AS THAT OF THE ACQUIRED BALL LAND IS PERFOMED

END COUNTER

WHEN COUNTER IS CLOSED, A NEW ROUTE IS RETRIEVED

FIG. 47A

HIGHEST PRIORITY DETERMINATION METHOD FOR ACQUISITION CANDIDATES

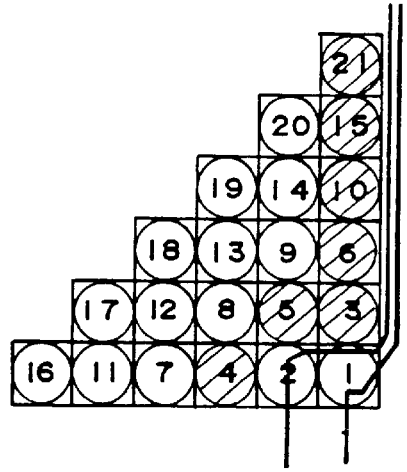

⊘ ACQUISITION CANDIDATES

ACQUIRE THE LAND WITH THE HIGHEST ORDER OF PRIORITY AMONG ACQUISITION CANDIDATES

▧ ③ ACQUIRED BALL LAND

FIG. 47B

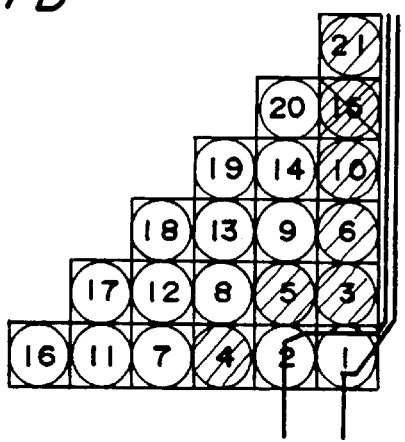

✕ PASSING NUMBER HAS REACHED THE MAXIMUM

WHEN PASSING NUMBER HAS REACHED THE MAXIMUM, THE LAND THAT HAS REACHED THE MAXIMUM VALUE IS GIVEN THE HIGHEST PRIORITY.

▧ ⑮ ACQUIRED BALL LAND

FIG. 47C

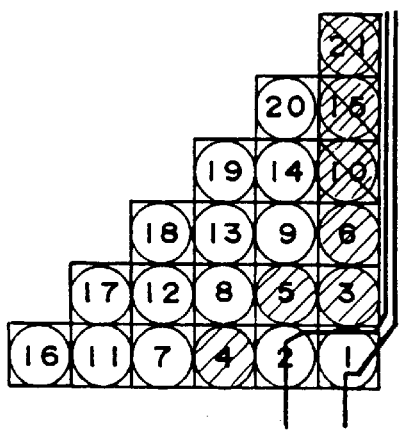

WHEN PASSING NUMBER HAS REACHED THE MAXIMUM IN TWO OR MORE LANDS, THE LAND CLOSEST TO THE INNER LEADS IS GIVEN THE HIGHEST PRIORITY, IF IT HAS OCCURRED IN THE CENTER COMMON PORTION, OTHERWISE, THE PROCESSING IS CANCELLED BECAUSE THE INTERCONNECT IS IMPOSSIBLE.

▧ ㉑ ACQUIRED BALL LAND (OUTER PERIPHERAL DIRECTION)

1. IN CASE NO.1 IS THE INTERCONNECT LAND
   - 01 IS APPLIED. NO COUNT-UP OCCURS.
2. IN CASE NO.2 IS THE INTERCONNECT LAND
   - 02 IS APPLIED. LEAD LINE PROCEEDS TO ①, WHERE COUNT-UP OCCURS.
   - C2 IS APPLIED BECAUSE ① HAS REACHED THE MAXIMUM. COUNTERS OF ①, ② AND ③ ARE CLOSED. ④ IS NOT PROCESSED, BECAUSE C3 IS APPLIED.
   - L1 IS APPLIED
3. IN CASE NO.3 IS THE INTERCONNECT LAND
   - 01 IS APPLIED. NO COUNT-UP OCCURS.

4. IN CASE NO.4 IS THE INTERCONNECT LAND

- O3 IS APPLIED. LEAD LINE PROCEEDS TO ⑤, WHERE COUNT-UP OCCURS. ⑥ AND ⑦ ARE CLOSED.
- L3 IS APPLIED. LEAD LINE PROCEEDS TO ⑧, WHERE COUNT-UP OCCURS.
- L1 IS APPLIED.

5. IN CASE NO.5 IS THE INTERCONNECT LAND
   - O2 IS APPLIED. LEAD LINE PROCEEDS TO ⑧, WHERE COUNT-UP OCCURS.
   - C2 IS APPLIED BECAUSE ⑧ HAS REACHED THE MAXIMUM. ⑧, ⑤ AND ⑨ ARE CLOSED.
   - L1 IS APPLIED.

6. IN CASE NO.6 IS THE INTERCONNECT LAND
   - O1 IS APPLIED. NO COUNT-UP OCCURS.

7. IN CASE NO.7 IS THE INTERCONNECT LAND

- O3 IS APPLIED. LEAD LINE PROCEEDS TO ⑩ , WHERE COUNT-UP OCCURS. ⑪ AND ⑫ ARE CLOSED.

- L4 IS APPLIED. LEAD LINE PROCEEDS TO ⑬ , WHERE COUNT-UP OCCURS.

- L3 IS APPLIED. LEAD LINE PROCEEDS TO ⑭ , WHERE COUNT-UP OCCURS.

- L3 IS APPLIED. LEAD LINE PROCEEDS TO ⑮ , WHERE COUNT-UP OCCURS.

- L1 IS APPLIED.

8. IN CASE NO.7 IS THE INTERCONNECT LAND
  - O3 IS APPLIED. LEAD LINE PROCEEDS TO ⑭, WHERE COUNT-UP OCCURS. COUNTERS OF ⑩ AND ⑬ ARE CLOSED.
  - C2 IS APPLIED BECAUSE ⑭ HAS REACHED THE MAXIMUM. ⑭, ⑩ AND ⑬ ARE CLOSED.
  - L3 IS APPLIED. LEAD LINE PROCEEDS TO ⑮, WHERE COUNT-UP OCCURS.
  - C2 IS APPLIED BECAUSE ⑮ HAS REACHED THE MAXIMUM. ⑮, ⑩ AND ⑬ ARE CLOSED.
  - L1 IS APPLIED.

9. IN CASE NO.9 IS THE INTERCONNECT LAND
•03 IS APPLIED. LEAD LINE PROCEEDS TO ⑰, WHERE COUNT-UP OCCURS. ⑭ AND ⑯ ARE CLOSED.
•L1 IS APPLIED.

10. IN CASE NO.10 IS THE INTERCONNECT LAND
•01 IS APPLIED. NO COUNT-UP OCCURS.

FIG. 71

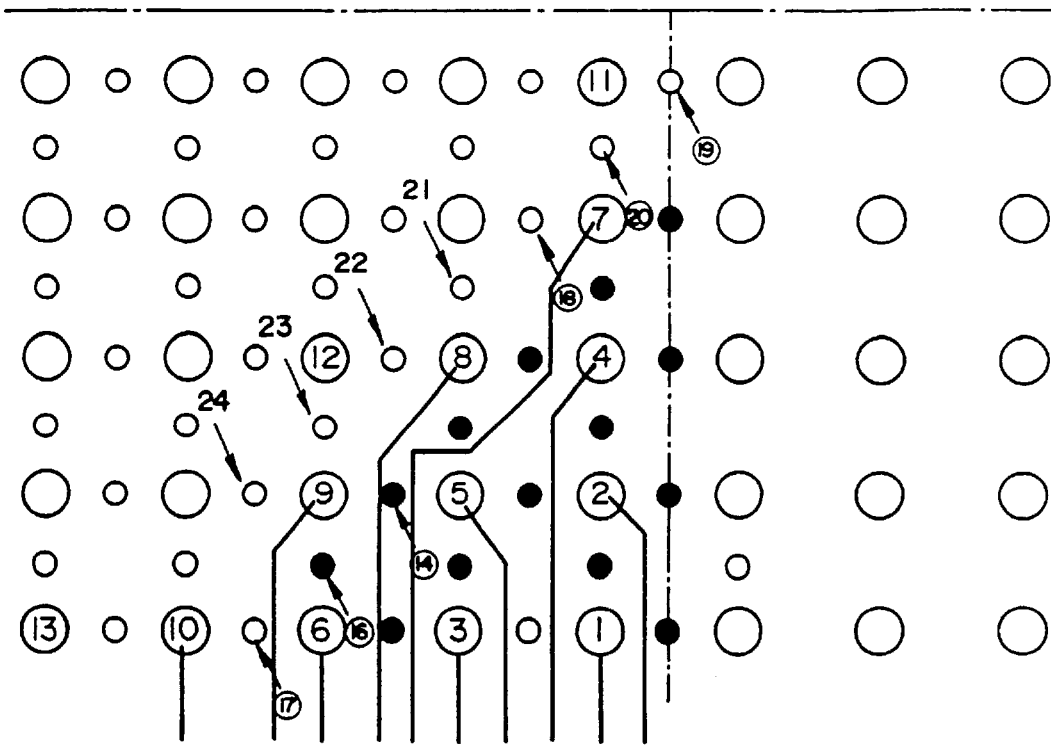

11. IN CASE NO.11 IS THE INTERCONNECT LAND

- L3 IS APPLIED. LEAD LINE PROCEEDS TO ⑱, WHERE COUNT-UP OCCURS. COUNTERS OF ⑲ AND ⑳ ARE CLOSED.
- L4 IS APPLIED. LEAD LINE PROCEEDS TO ㉑.
- L7 AND L3 ARE APPLIED. LEAD LINE PROCEEDS TO ㉒.
- L4 IS APPLIED. LEAD LINE PROCEEDS TO ㉓.
- L7 AND L3 ARE APPLIED. LEAD LINE PROCEEDS TO ㉔.
- L3 IS APPLIED. LEAD LINE PROCEEDS TO ⑰, WHERE COUNT-UP OCCURS.
- C2 IS APPLIED BECAUSE ⑰ HAS REACHED THE MAXIMUM. ⑰, ⑲ AND ⑳ ARE CLOSED.
- L1 IS APPLIED.

12. IN CASE NO. 12 IS THE INTERCONNECT LAND

- 03 IS APPLIED. LEAD LINE PROCEEDS TO 24, WHERE COUNT-UP OCCURS. 22 AND 23 ARE CLOSED.
- C2 IS APPLIED BECAUSE 24 HAS REACHED THE MAXIMUM. 24, 22 AND 23 ARE CLOSED.
- L4 IS APPLIED. LEAD LINE PROCEEDS TO 25.
- L7 AND L3 ARE APPLIED. LEAD LINE PROCEEDS TO 26, WHERE COUNT-UP OCCURS.
- L1 IS APPLIED.

13. IN CASE NO.13 IS THE INTERCONNECT LAND
•01 IS APPLIED.

14. IN CASE THE RIGHT PROCESSING SURFACE IS PROCESSED BY THE SAME METHOD.

METHOD AND APPARATUS FOR DETERMINING WIRING ROUTE IN CIRCUIT BOARD AND INFORMATION STORAGE MEDIUM

TECHNICAL FIELD

The present invention relates to a method and device for determining an interconnect route in a circuit board from a plurality of virtual interconnect targets to lands which are arranged in a matrix around the virtual interconnect targets, and also relates to an information storage medium.

BACKGROUND OF ART

A bare tip mounting is ideal for pursuing miniaturization of semiconductor devices. However, because bare-chip mounting results in difficulty in assuring quality and in handling, the semiconductor device is processed into a package form to deal with this problem. As a package form meeting the requirements, particularly, for multi-terminal arrangement, a BGA (Ball Grid Array) package has been developed in recent years.

A flexible circuit board is used as one BGA type package. Such a circuit board is provided with a lead group connected to an IC terminal group, and a ball land group are arranged in a matrix around the lead group. Each land is provided with a solder ball, as required. This circuit board mounted with an IC is surface-mounted on a motherboard or the like through the solder balls.

An important subject in using such a circuit board is how to determine interconnect routes between each lead (a virtual interconnect target) in the lead group and each land ball in the land group arranged around the lead group.

In particular, circuit boards recently used have many leads and land balls provided on a circuit board for mounting ICs due to the increased number of terminals of the ICs to be mounted. Accordingly, how efficiently the interconnect routes are designed from each lead to each ball land without intersecting the interconnect route becomes important for shortening the development period and reducing the cost of a circuit board.

However, in a conventional technique, a designer determines interconnect routes between each lead and each land manually on a drawing by trial and error. Because such a design work requires time and labor, it was impossible to design a circuit board in a short time at a low cost.

Specifically, the amount of interconnect which can pass through a space between each of the lands differs depending on various parameters such as spaces between ball lands and widths of interconnect leads used. Therefore, it is necessary that the interconnect route should be determined so that the amount of interconnect between the lands may not exceed the allowable amount and also that the interconnects may not intersect each other.

However, if a land which cannot be interconnected should be found during a design work using a conventional technique in which a designer determines the interconnect routes between each lead and each land manually on a drawing by trial and error, the determination of the interconnect routes has to be repeated from the beginning by changing the parameters. Thus, the design work must be dependent on the experience and intuition of the designer.

The present invention has been made in view of the above-described conventional problems. An object of the present invention is to provide a method, device, and information storage medium for determining interconnect routes in a circuit board between virtual interconnect target group and lands which are arranged in at least one of inside and outside of the column, efficiently in a short period of time.

DISCLOSURE OF THE INVENTION (1) To achieve the above object, the present invention provides a method of determining interconnect routes in a circuit board, the interconnect routes running from a plurality of virtual interconnect targets to lands arranged in a matrix on at least one of inside and outside of the virtual interconnect target, the virtual interconnect target forming a target group arranged into a substantially rectangular frame, the method comprising:

a first step of assigning an order of priority to each of the lands; and a second step of performing processing for determining an interconnect route between a next virtual interconnect target adjacent to another virtual interconnect target of which an interconnect route has been determined and a next interconnect land according to the order of priority, wherein, in the first step, when a rectangle formed by the lands is divided into eight areas by centerlines and diagonals, and when a plurality of oblique lines connecting lands included in the lands which are adjoining each other in a direction parallel to the diagonals are priority order setting lines, priority of each land included in each of the divided areas is set so that higher priority is assigned to a land on one of the priority order setting lines further from the diagonals, and higher priority is assigned to a land positioned further from the target group, on the same priority order setting line.

The present invention also provides a program for performing the above-mentioned method of determining an interconnect route.

The present invention further provides a computer readable information storage medium which stores information (for example, a program) for determining interconnect routes in a circuit board, the interconnect routes running from a plurality of virtual interconnect targets to lands arranged in a matrix on at least one of inside and outside of the virtual interconnect target, the virtual interconnect target forming a target group arranged into a substantially rectangular frame, the information comprising:

a first information (for example, a program) for assigning an order of priority to each of the lands; and a second information (for example, a program) for performing processing for determining an interconnect route between a next virtual interconnect target adjacent to another virtual interconnect target of which an interconnect route has been determined and a next interconnect land according to the order of priority, wherein the first information comprises information (for example, a program) for setting priority of each land included in each of the divided areas, when a rectangle formed by the lands is divided into eight areas by centerlines and diagonals, and when a plurality of oblique lines connecting lands included in the lands which are adjoining each other in a direction parallel to the diagonals are priority order setting lines, so that higher priority is assigned to a land on one of the priority order setting lines further from the diagonals, and higher priority is assigned to a land positioned further from the target group, on the same priority order setting line.

According to the present invention, a land which should be the interconnect land can be automatically determined based on the order of priority assigned to each land. Therefore, the interconnect routes can be determined efficiently and certainly.

When there is no other restriction, the order of priority means an order by which a land with a higher priority is selected as the interconnect land.

In the present invention, an interconnect route to lands arranged in a matrix on at least either inside or outside of the target group can be determined.

In the case where the interconnect routes for outer lands positioned outside the target group are determined, it is preferable that, in the second step, a number of interconnect routes being able to pass through a space between adjoining lands is previously set to a certain value and when the number of determined interconnect routes has reached the set value in the space between the adjoining lands, the processing for determining an interconnect route is performed to a next interconnect land that is an unconnected land and is one of the lands forming the space in which the number of the interconnects has reached the set value, instead of using the order of priority.

In addition, in the case where the interconnect routes for outer lands positioned outside the target group are determined, the second information preferably comprise information for:

previously setting a number of interconnect routes being able to pass through a space between adjoining lands to a certain value, and when the number of determined interconnect routes has reached the set value in the space between the adjoining lands, performing the processing for determining an interconnect route to a next interconnect land that is an unconnected land and is one of the lands forming the space in which the number of the interconnects has reached the set value, instead of using the order of priority.

The above constitution ensures more certain determination of a land which should be the next interconnect land for the outside land group locating outside the target group.

Therefore, the interconnect routes can be determined more efficiently and certainly.

(2) The present invention further provides a method of determining interconnect routes in a circuit board, the interconnect routes running from a plurality of virtual interconnect targets to lands arranged in a matrix on at least one of inside and outside of the virtual interconnect target, the virtual interconnect target forming a target group arranged into a substantially rectangular frame, the method comprising:

a step of virtually placing a plurality of counters between each of the lands arranged in a matrix, the counters being opened by a specified rule and counting the number of interconnect routes passing through a space between adjoining lands;

an interconnect route determination step in which processing for determining an interconnect route is repeatedly performed, the processing for determining an interconnect route between a next virtual interconnect target adjacent to another virtual interconnect target of which an interconnect route has been determined and a next interconnect land which is selected by a specified rule, so that an interconnect, running through a space between lands in which an open counter exists, passes without intersecting with an interconnect route which has already been determined; and a counter control step in which, when count value of an open counter has reached a set amount, the open counter is closed and another counter associated with the open counter is opened or closed according to a specified rule, so as to set a route for leading a new interconnect.

The present invention also provides a program for performing the method of interconnect route determination.

The present invention further provides a computer readable information storage medium which stores an information (for example, a program) for determining interconnect routes in a circuit board, the interconnect routes running from a plurality of virtual interconnect targets to lands arranged in a matrix on at least one of inside and outside of the virtual interconnect target, the virtual interconnect target forming a target group arranged into a substantially rectangular frame, the information comprising:

information (for example, a program) for virtually placing a plurality of counters between each of the lands arranged in a matrix, the counters being opened by a specified rule and counting the number of interconnect routes passing through a space between adjoining lands;

information (for example, a program) for determining an interconnect route in which processing for determining an interconnect route is repeatedly performed, the processing for determining an interconnect route between a next virtual interconnect target adjacent to another virtual interconnect target of which an interconnect route has been determined and a next interconnect land which is selected by a specified rule, so that an interconnect, running through a space between lands in which an open counter exists, passes without intersecting with an interconnect route which has already been determined; and information (for example, a program) for counter control which, when count value of an open counter has reached a set amount, closes the open counter and opens or closes another counter associated with the open counter according to a specified rule, so as to set a route for leading a new interconnect.

According to the present invention, a plurality of counters which count the number of leads passing through the areas between the adjoining lands are virtually arranged around each land which is arranged in a matrix. For example, giving attention to one land, there are at least four lands arranged in a matrix around that particular land. In this instance, four counters are virtually arranged between this land and adjoining lands. These counters are opened according to a specified rule.

The interconnect route between each target and each land is determined so that the interconnect passes through the spaces between the lands where open counters exist without intersecting the previously determined interconnect routes.

When an interconnect route passes through the spaces between the lands, the open counter performs the counting operation. When the number of interconnect routes which pass through the spaces between the lands reaches the predetermined reference number, i.e., typically the number of interconnect routes capable of providing interconnect between the lands, the count value of the counter is judged to reach the maximum (i.e., judged to be impossible to route any further), the open counter is closed.

By repeating such determinations for the interconnect routes and counter control, the interconnect routes between the target group and land group can be determined automatically so that an allowable number of interconnect routes may pass between each land without intersection of the interconnect routes.

In particular, according to the present invention, the automatic interconnect between the target leads and lands can be efficiently performed in a short time based on the count data of the counters virtually placed around each land arranged in a matrix.

In this application, the corresponding land means, for example, the lands adjacent to the target lead side, when viewed from the counter to be closed, or the lands positioned in the direction of deciding the subsequent interconnect route, when viewed from the interconnect routes already determined.

In the present invention, an interconnect route to lands arranged in a matrix on at least either inside or outside the target group can be automatically determined.

In the case where the interconnect routes for outer lands positioned outside the target group are determined, in the counter control step, it is preferable that opening and closing conditions of the virtual counter are initially set according to a specified rule, and when a count value of an open counter has reached the set amount, the open counter is closed and another open counter of which an interconnect route to an assigned land thereof has been determined is also closed, then closed counters which are positioned on the opposite side of the open counters to be closed interposing assigned lands therebetween are opened, thereby setting a route for leading a new interconnect.

In addition, in the case where the interconnect routes for outer lands positioned outside the target group are determined, the information for counter control preferably comprise information for:

initially setting opening and closing conditions of the virtual counter according to a specified rule, and when a count value of an open counter has reached the set amount, closing the open counter and another open counter of which interconnect route to an assigned land thereof has been determined, then opening closed counters which are positioned on the opposite side of the open counters to be closed interposing assigned lands therebetween, thereby setting a route for leading a new interconnect.

By adopting such a constitution, the interconnect route to an outside land group which is located outside the target group can be determined automatically and efficiently.

The following constitution can be adopted to determine the interconnect route for an inner land group which is located inside the target group.

Specifically, in the case where the interconnect routes for inner lands positioned inside the target group are determined, in the counter control step, it is preferable that opening and closing conditions of the virtually placed counter are initially set according to a specified rule, and when a count value of an open counter has reached the set amount, the open counter is closed, and other open counters on a centerline side and a target group side of a starting land of an interconnect, running through a space between lands in which the open counter is located are closed, is also closed, thereby setting a route for leading a new interconnect.

In addition, in the case where the interconnect routes for inner lands positioned inside the target group are determined, the information for counter control preferably comprise information for:

initially setting opening and closing conditions of the virtually placed counter according to a specified rule, and when a count value of an open counter has reached the set amount, closing the open counter and other open counters on a centerline side and a target group side of a starting land of an interconnect which runs through a space between lands in which the open counter is located, thereby setting a route for leading a new interconnect.

The above constitution ensures more certain determination of a land which should be the next interconnect land for the inside land group locating inside the target group.

(3) In the case where the interconnect routes for outer lands positioned outside the target group are determined, in the interconnect route determination step, it is preferable that each of interconnect routes from lands arranged in a matrix to plating leads disposed in the outer periphery of the lands is determined so that an interconnect, running through a space between lands in which an open counter exists, passes without intersecting with an interconnect route which has already been determined, and wherein, in the counter control step, when a count value of an open counter has reached the set amount due to the processing for determining an interconnect route between the plating leads and the lands, the open counter is closed, then a closed counter which is positioned on the opposite side of the open counter to be closed interposing an assigned land therebetween is opened, thereby setting a route for leading a new interconnect.

In the case where the interconnect routes for outer lands positioned outside the target group are determined, the information for determining an interconnect route preferably comprise information for determining each of interconnect routes from lands arranged in a matrix to plating leads disposed in the outer periphery of the lands so that an interconnect, running through a space between lands in which an open counter exists, passes without intersecting with an interconnect route which has already been determined, and wherein the information for counter control comprises information for, when a count value of an open counter has reached the set amount due to the processing for determining an interconnect route between the plating leads and the lands, closing the open counter, then opening a closed counter which is positioned on the opposite side of the open counter to be closed interposing an assigned land therebetween, thereby setting a route for leading a new interconnect.

This allows the interconnect routes between the lands and the plating leads, as well as the interconnect routes between the inner leads and the lands, to be determined automatically and efficiently.

(4) In addition, it is preferable in the present invention that an order of priority is previously assigned to each of the lands arranged in a matrix, and wherein the interconnect route determination step comprises:
   a third step of determining a next interconnect land based on the order of priority of each of the lands and a presence or absence of the open counter; and
   a fourth step of performing processing for determining an interconnect route between the determined interconnect land and a virtual interconnect target based on a position of the open counter.

In addition, it is preferable in the information medium of the present invention that an order of priority is previously assigned to each of the lands arranged in a matrix, and
   wherein the information for determining an interconnect route comprises:
      a third information for determining a next interconnect land based on the order of priority of each of the lands and a presence or absence of the open counter; and
      a fourth information for performing processing for determining an interconnect route between the determined interconnect land and a virtual interconnect target based on a position of the open counter.

Specifically, in the present invention, when one interconnect route is determined, a subsequent interconnect land is determined based on the order of priority previously assigned to each land and the positions at which counters are opened as the count value has reaches the maximum owing to immediately preceding interconnect route determination. The interconnect route between the determined interconnect land and a target interconnect route is determined based on the position in which an open counter exists.

In this manner, the subsequent interconnect land can be decided automatically in the present invention based on the order of priority assigned to each land and the occurrence of open counters of which count value has reached the set value. Therefore, the interconnect routes can be determined more efficiently and certainly.

When there is no other restriction, the order of priority means an order by which a land with a higher priority is selected as the interconnect land.

(5) Further, in the present invention the order of priority of each land arranged in a matrix is preferably determined that,
   when a rectangle formed by the lands arranged in a matrix is divided into eight areas by centerlines and diagonals, and when a plurality of oblique lines connecting lands included in the lands which are adjoining each other in a direction parallel to the diagonals are priority order setting lines,
   priority of each land included in each of the divided areas is set so that higher priority is assigned to a land on one of the priority order setting lines further from the diagonals, and higher priority is assigned to a land positioned further from the target group, on the same priority order setting line.

This causes the interconnect lands to be selected one after another from the lands which are positioned remote from the target when viewed from the entire interconnect route, so that shortest interconnect routes between each lead and land can be determined, when viewed from the entire circuit.

In the case where the interconnect routes for inner lands positioned inside the target group are determined, it is preferable to adopt following constitution.

Specifically, when a plurality of oblique lines connecting lands included in the inner lands which are adjoining each other in a oblique direction intersecting with each of priority order setting lines are intersecting lines, an interconnect proceeding point is virtually positioned at each position where a plurality of intersecting lines and the plurality of priority order setting lines intersect each other.

Then the third step further comprises:
   a step of setting an order of priority among four interconnect proceeding points around an interconnect land, in the order of a first point on the target group side and the centerline side, and a second point on the target group side and the diagonal side, determining an interconnect drawing route from the interconnect land toward a point having higher priority on condition that an interconnect route exists, and, when an interconnect drawing route to the second point has been determined, closing a virtual counter on the target group side and the centerline side of the interconnect land; and
   a step of setting the order of priority for determining an interconnect route from an interconnect proceeding point selected as an interconnect route to a next interconnect proceeding point adjoining to the selected interconnect proceeding point, in the order of the target group side and the diagonal side, and determining an interconnect route toward a point positioned in a direction having higher priority, on condition that a virtual counter positioned on a route toward the next point is open.

Furthermore, the third information which performs the process of interconnect route determination may comprises:
   information for setting an order of priority among four interconnect proceeding points around an interconnect land, in the order of a first point on the target group side and the centerline side, and a second point on the target group side and the diagonal side, determining an interconnect drawing route from the interconnect land toward a point having higher priority on condition that an interconnect route exists, and, when an interconnect drawing route to the second point has been determined, closing a virtual counter on the target group side and the centerline side of the interconnect land; and
   information for setting the order of priority for determining an interconnect route from an interconnect proceeding point selected as an interconnect route to a next interconnect proceeding point adjoining to the selected interconnect proceeding point, in the order of the target group side and the diagonal side, and determining an interconnect route toward a point positioned in a direction having higher priority, on condition that the a virtual counter positioned on a route toward the next point is open.

(6) In addition, the method of the present invention preferably include a step of inputting an interconnect parameter,
   wherein, in the interconnect route determination step, the processing for determining an interconnect route is performed based on the inputted parameter.

The present invention also provides a program for performing the above method.

The information storage medium of the present invention preferably include information (for example, a program) for inputting an interconnect parameter,
   wherein the information for determining an interconnect route comprises information for performing the processing for determining an interconnect route based on the inputted parameter.

The device for determining interconnect routes of the present invention preferably comprise:
   means for inputting an interconnect parameter, and means for determining an interconnect route between a virtual interconnect target group arranged in a rectangular shape and at least one of a land group rectangularly arranged around outside the virtual interconnect target group and a rectangular land group arranged inside the virtual interconnect target group, by using any one of the methods described above.

The information storage medium of the present invention preferably store a program for performing:

means for inputting an interconnect parameter, and means for determining an interconnect route between a virtual interconnect target group arranged in a rectangular shape and at least one of a land group rectangularly arranged around outside the virtual interconnect target group and a rectangular land group arranged inside the virtual interconnect target group, by using any one of the methods described above.

According to the present invention, if parameters for interconnect are input, a process for determining the interconnect routes between the above-described interconnect lands is performed based on the inputted parameters.

Therefore, when it is judged that the routing can not be performed with the parameters entered, new parameters may be entered.

Optimal parameters which enables routing between the target group and land group can be input in this manner, so that the optimal circuit conditions for manufacturing circuit boards can be determined prior to manufacturing the circuit boards.

In this case, as the parameters described above, items such as the following may be selectively used, for example, sizes of the land group arranged in a matrix, number of cells (number of lands) constituting the matrix, sizes of each land, sizes of land gaps (sizes of non-interconnect area residing around the lands), width of each interconnect pattern, and gaps between leads which are distances between the interconnect patterns.

(7) The semiconductor device of the present invention comprises the interconnect route which is determined using at least one of the above-described method, device, and information stored in the information storage medium.

BRIEF DESCRIPTION OF DRAWINGS

FIGS. 5A, 5B, and 5C are drawings for illustrating the other input items input in the condition input step shown in FIG. 3.

FIG. 7 is an illustration of a divided area sub-divided into a center common portion, process surfaces, and surface common portions.

FIGS. 8A to 8D are drawings for illustrating a series of processings for determining the interconnect routes of the entire circuit by applying the interconnect pattern determined for one divided area to other divided areas.

FIGS. 9A and 9B are drawings for illustrating processing for determining a series of interconnect routes of the entire circuit by applying the interconnect route determined for a plurality of divided areas to other interconnect routes.

FIG. 12 is an illustration of an order of priority assigned to a land group.

FIGS. 13A and 13B are drawings for illustrating counters virtually disposed to each land.

FIG. 29 is a flow chart showing detailed processings in step S76 of FIG. 27.

FIG. 32 is a flow chart showing detailed processings in step S208 of FIG. 30.

FIG. 33 is an illustration of the specific process for the initial route determination process in step S74 of FIG. 27.

FIGS. 47A to 47C are drawings for illustrating an embodiment of the process for determining the interconnect land according to the order of priority previously set for each land and the existing positions of counters reached the maximum.

FIG. 49A is a plane view schematically explaining a fan-in type semiconductor device and FIG. 48B is a sectional view schematically illustrating along the B—B line of FIG. 48A.

FIG. 71 is a diagram illustrating an interconnect rout determination process when the eleventh priority land is the interconnect land.

BEST MODE FOR CARRYING OUT THE INVENTION

Preferred embodiments of the present invention will be described in detailed with reference to the drawings.

Figure 48A:
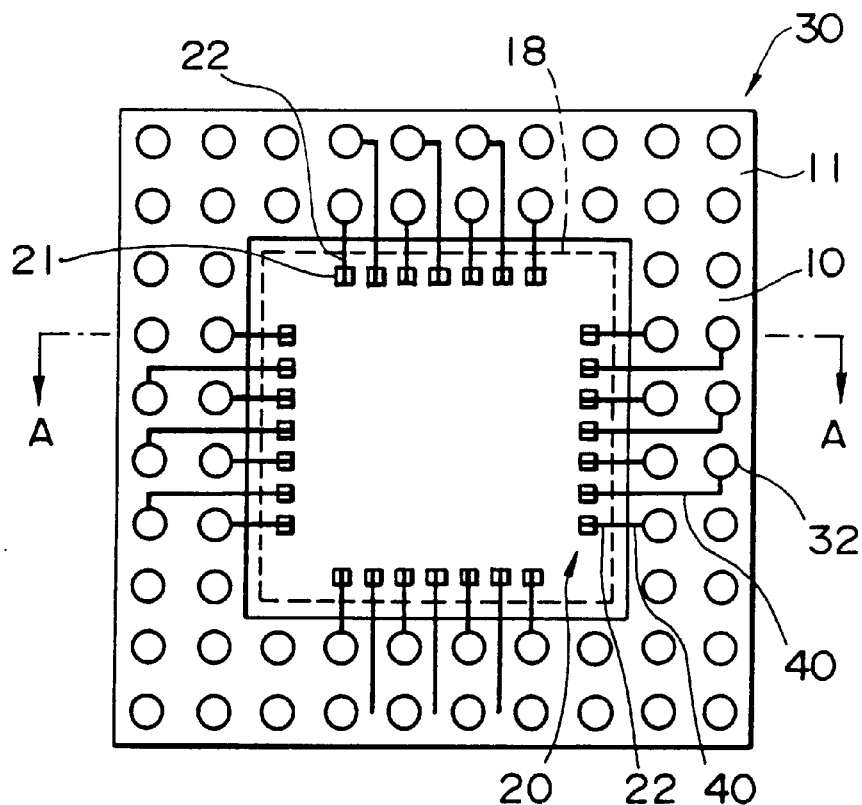
FIG. 48A is a plane view schematically explaining a fan-out type semiconductor device and FIG. 48B is a schematic sectional illustration along the A—A line of FIG. 48A.
Figure 48B:
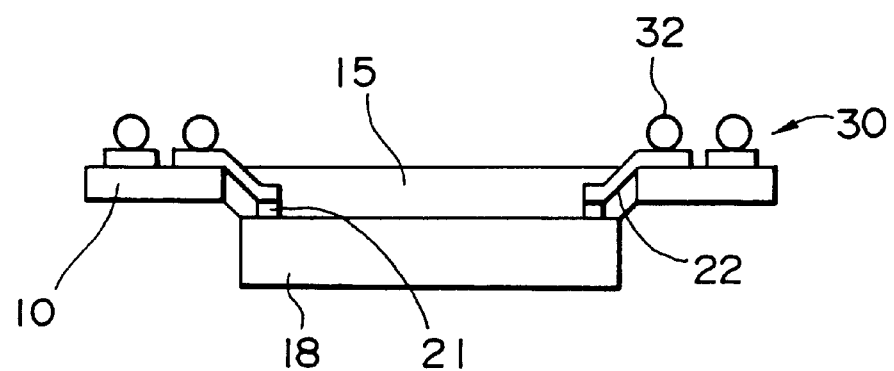
Figure 49A:
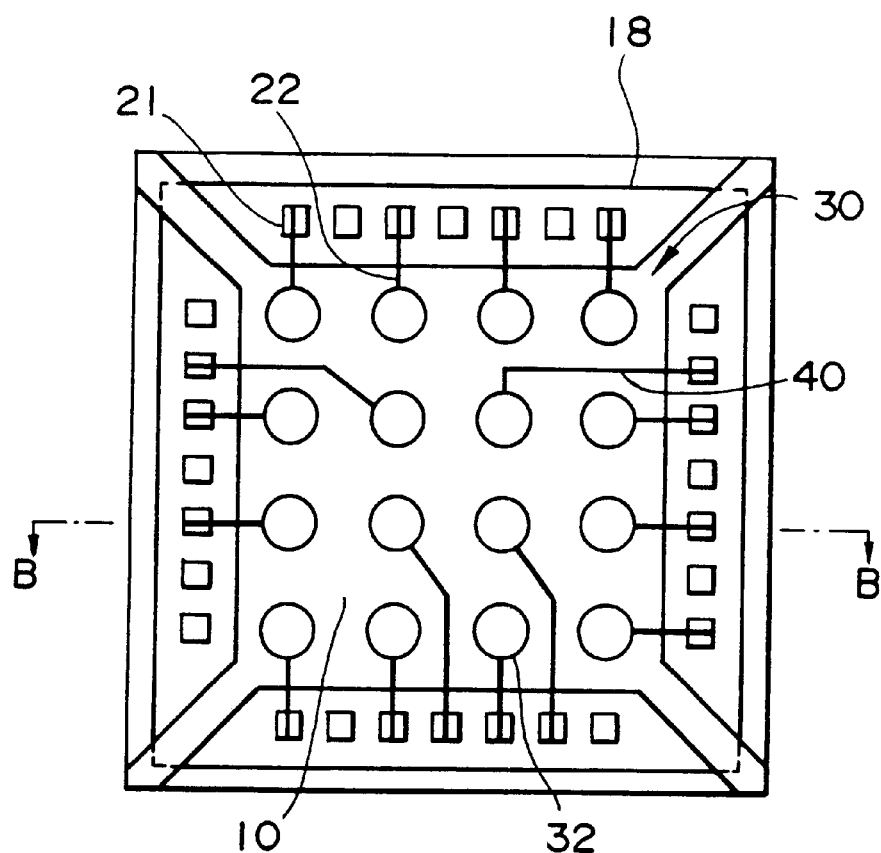
Figure 49B:
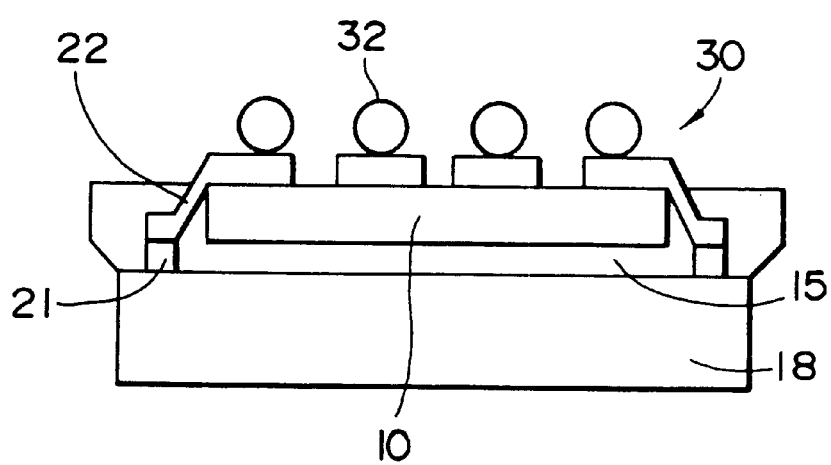
Figure 50A:
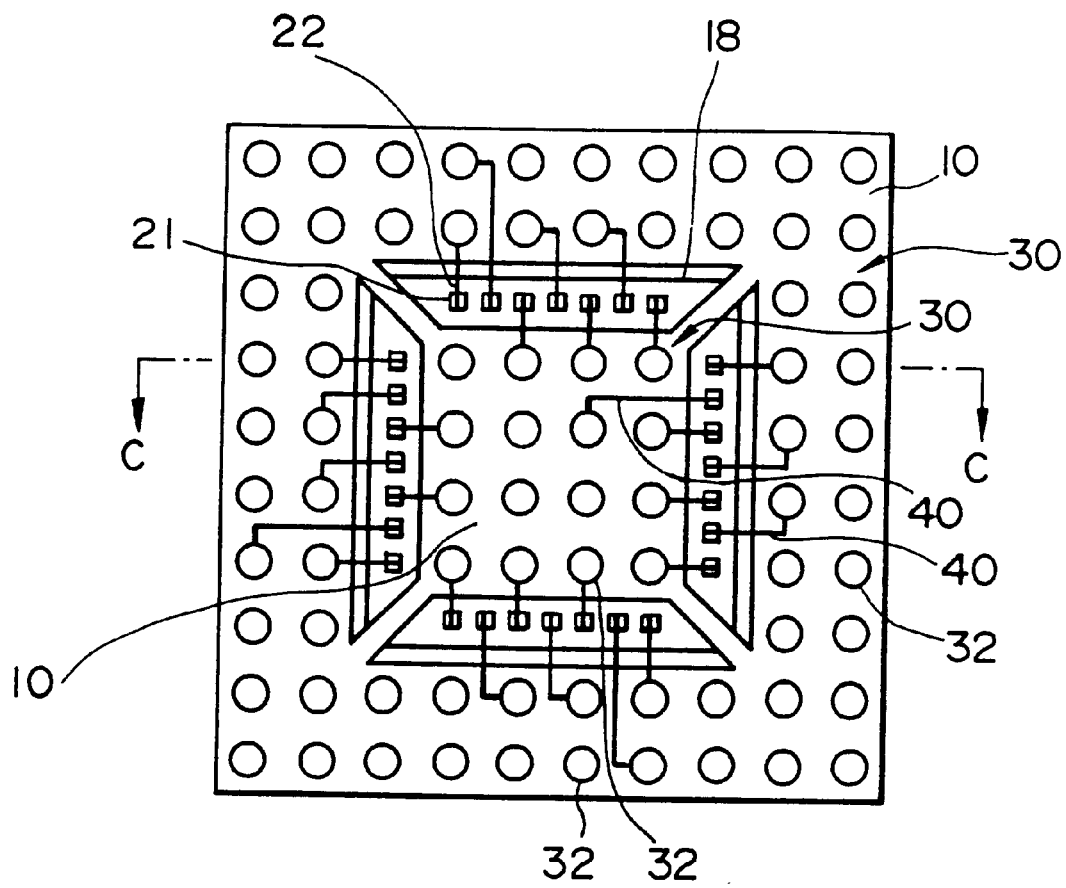
FIG. 50A is a plane view schematically showing a mixed type semiconductor device and FIG. 50B is a sectional view thereof along the C—C line of FIG. 50A.
Figure 50B:
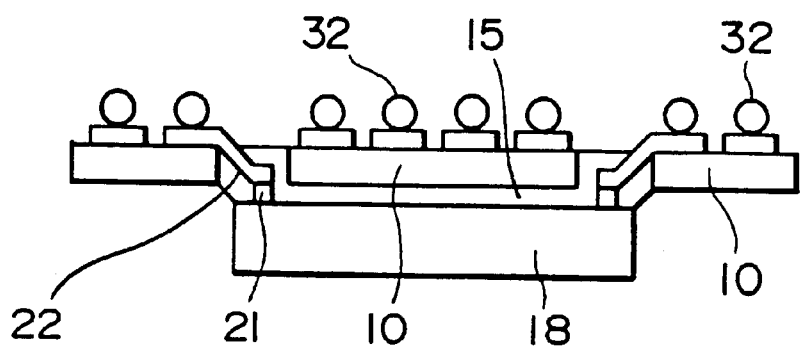

(1) Outline of Semiconductor Devices to Which the Present Invention is Applied FIGS. 48 to 50 show specific example of semiconductor devices to which the present invention is applied.

FIG. 48 illustrates a fan-out type semiconductor device in which lands 32 are arranged only outside the IC 18, FIG. 49 illustrates a fan-in type semiconductor device in which lands 32 are arranged only below the IC 18, and FIG. 50 illustrates a mixed fan-in and fan-out type semiconductor device.

A feature of the present embodiment resides in that in manufacturing any semiconductor devices mentioned above, it is possible to automatically determine interconnect routes between the land group 30 arranged in a matrix on the film 10 as a circuit board and the lead group 20 connected with respective electrodes 21 of the IC 18 (virtual interconnect target group), when the semiconductor devices are designed.

Figure 51:
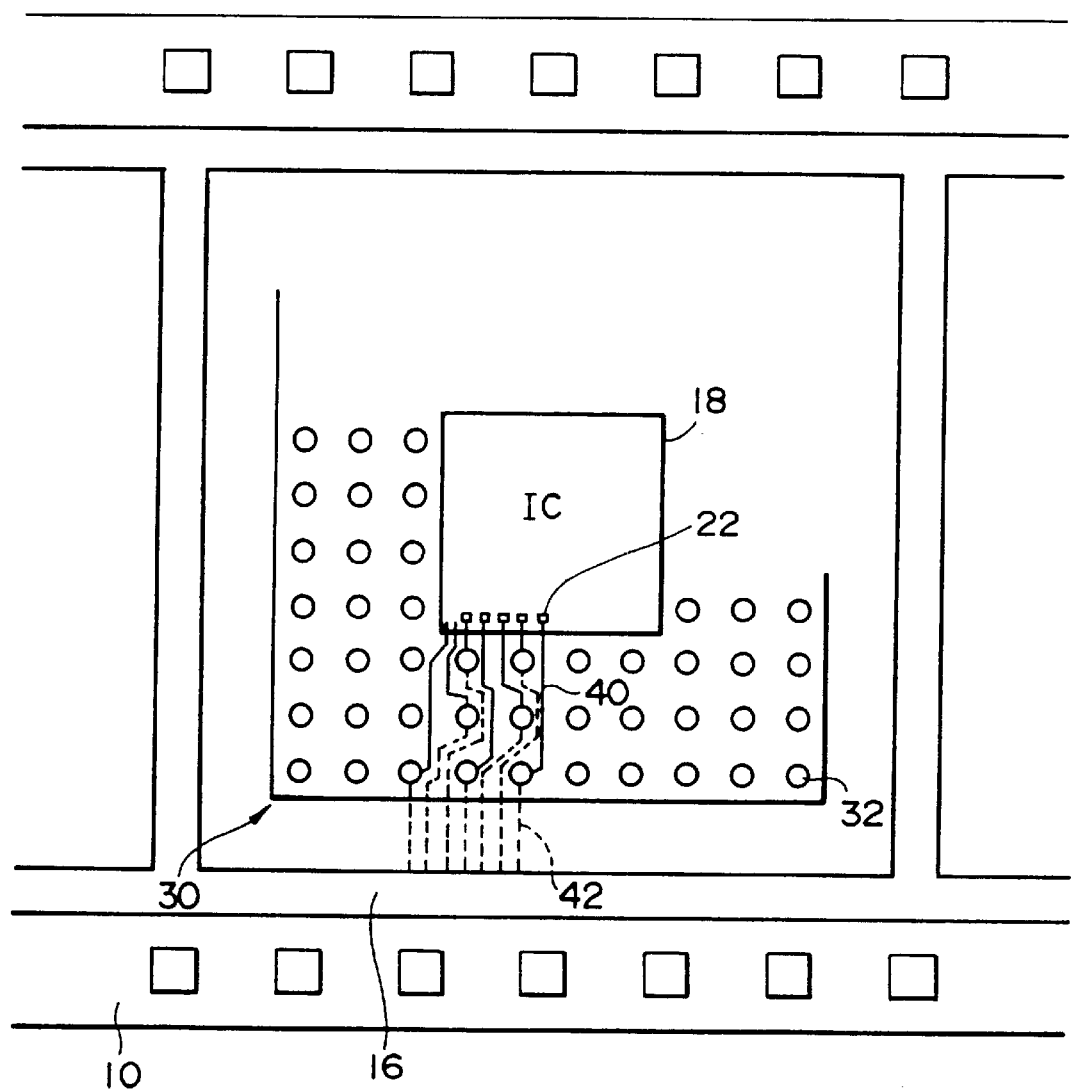
FIG. 51 is an illustration showing an example of a tape circuit board used for manufacturing a fan-out type semiconductor device.
Figure 52:
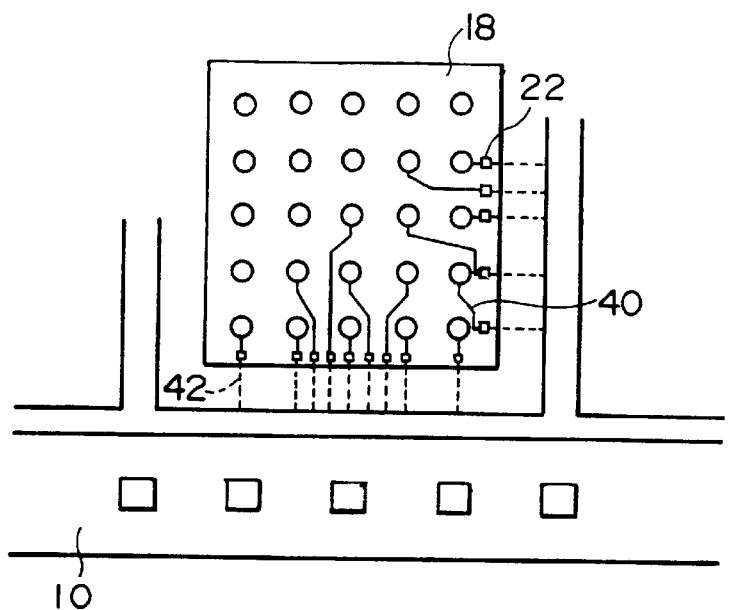
FIG. 52 is an illustration showing an example of a tape circuit board used for manufacturing a fan-in type semiconductor device.
Figure 53:
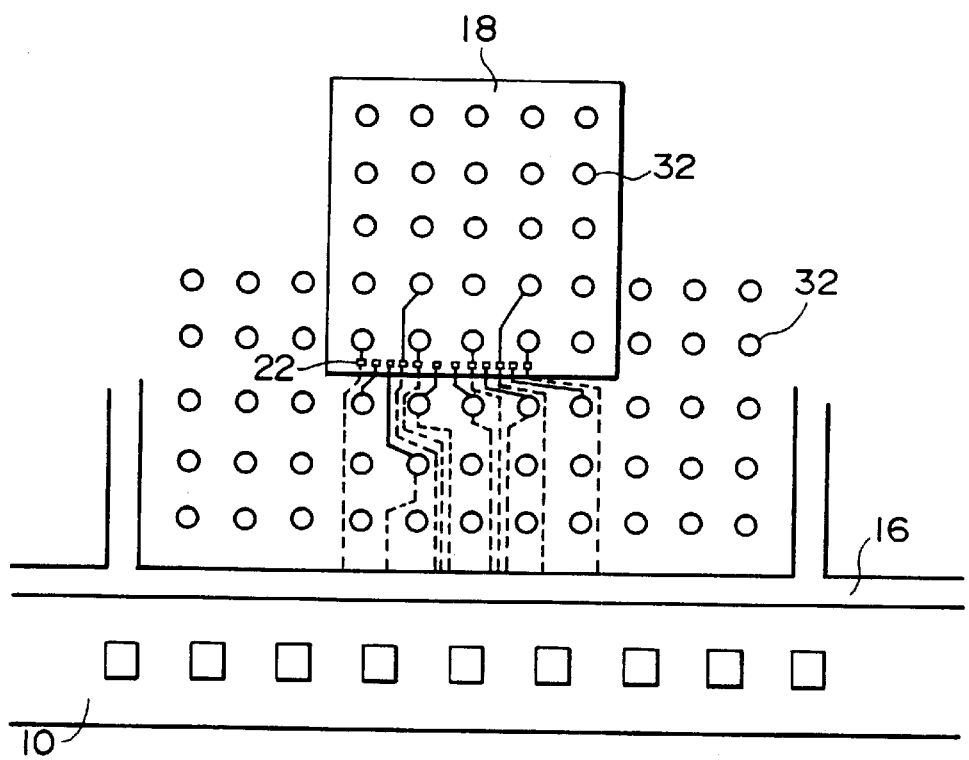
FIG. 53 is an illustration showing an example of a tape circuit board used for manufacturing a mixed type semiconductor device.

FIG. 51 schematically shows a film carrier tape used for manufacturing a fan-out type semiconductor device shown in FIG. 48, FIG. 52 schematically shows a film carrier tape used for manufacturing a fan-in type semiconductor device shown in FIG. 49, and FIG. 53 schematically shows a film carrier tape used for manufacturing a mixed type semiconductor device shown in FIG. 50.

In designing any of the semiconductor devices, it is important to automatically design the interconnect routes between a plurality of leads 22 which are virtual interconnect targets and the lands 32 which are arranged in a matrix on either inside or outside, or both sides of the lead row, in such a manner that the interconnects do not intersect each other and satisfy the specified interconnect conditions.

The carrier tapes which are used for manufacturing the above-mentioned semiconductor devices are outlined first.

(1-1) Fan-out Type Semiconductor Device

Figure 1:
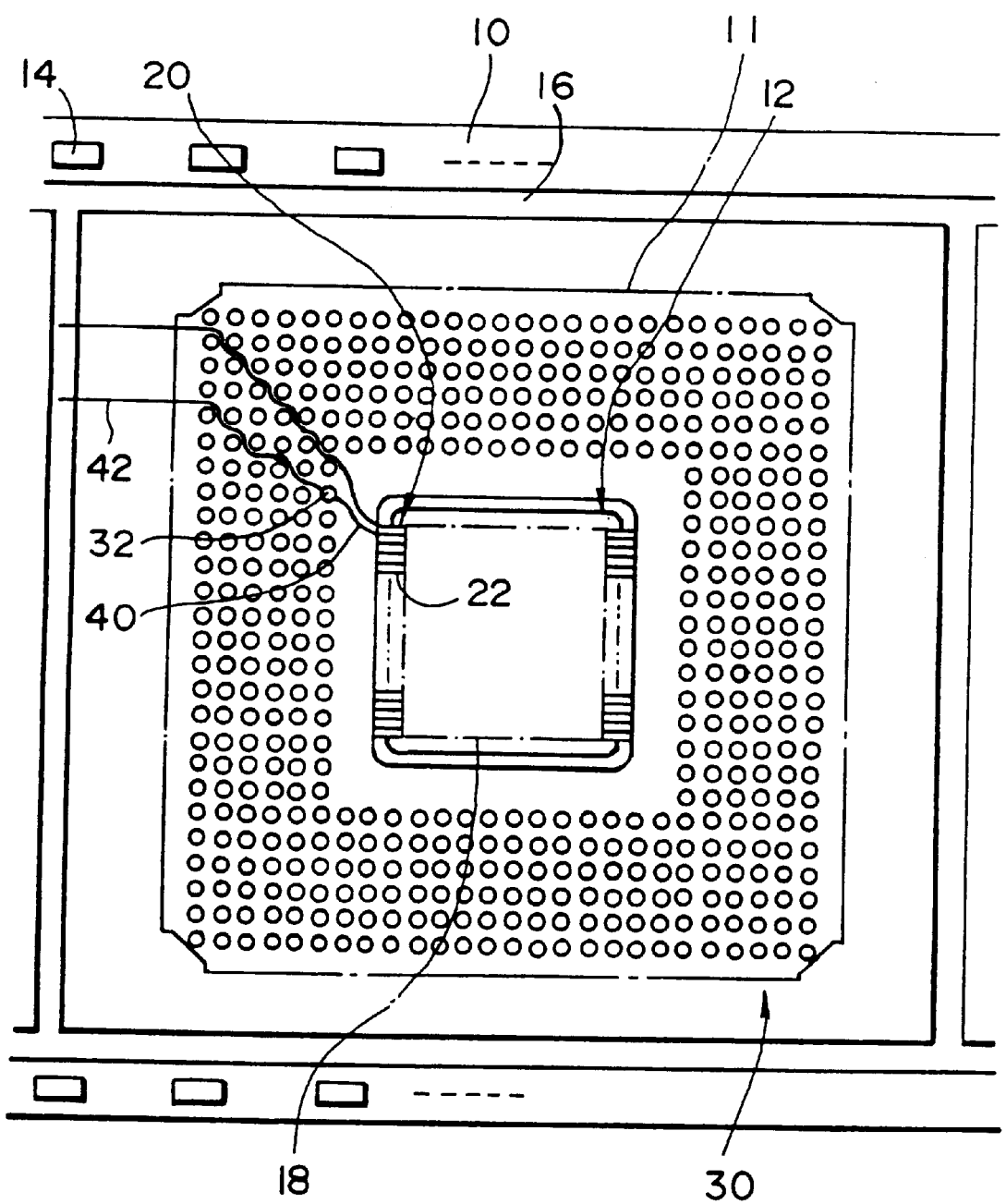
FIG. 1 is an illustration showing an example of a tape circuit board to which the present invention is applied.

FIG. 1 is a schematic diagram showing a film carrier tape of a fan-out type semiconductor device to which the present invention is applied.

In this figure, a device hole 12 and sprocket holes 14 are formed on a tape-shaped film 10 which is made of a resin.

Formed on the film 10 are an inner lead group (a target group) 20 which is formed in a square around the device hole 12, a land group 30 in which lands are arranged in a matrix rectangularly surrounding the inner lead group, and plating leads 16 encompassing around the land group 30. In addition, a first interconnect lead 40 is formed in one-to-one relation between each inner lead 22 constituting the inner lead group 20 and each land 32 constituting the land group 30, and a second interconnect lead 42 is formed between each land 32 and the plating lead 16. The inner lead group 22, land group 30, first and second interconnect leads 40, 42, and plating lead 16 are formed by etching a copper foil on the tape substrate.

Each land 32 is an area where ball terminals (not shown) are provided. One end of the inner lead 22 projects from the device hole 12 and the other end thereof is connected to the first lead 40.

The end of the inner lead 22 is bonded to an electrode 21 (see FIG. 51) of a semiconductor chip 18 inside the device hole 12.

Each land 32 is connected to the plating lead 16 through the second lead 42. Thus, all lands 32 and leads 22, 40, and 42 are conducted through the plating lead 16, to provide them with electric plating.

Then, after the semiconductor chip 18 is mounted on this film 10, the film 10 is perforated as a tape circuit substrate 11 as shown by a chain line in the figure.

When designing such a tape circuit substrate 11, it is important to determine interconnect routes for the first interconnect lead 40 without intersecting each other in the area between the rectangular shaped inner lead group 20 and the land group 30 with lands arranged in a rectangle around the inner lead group 20. Furthermore, it is also important to determine interconnect routes for the second interconnect lead 42 without intersecting each other in the area between the land group 30 and the plating lead 16 around the land group 30.

In particular, the relation between each inner lead 22 forming the inner lead group 20 and each land 32 forming the land group 30 arranged in a matrix is basically a one-to-one relation. If the relation is not one-to-one, for example, when either the number of inner leads or the number of ball lands is smaller than the other, the larger ones are left alone. Thus, it is important in the development and design of the circuit board 11 to determine the interconnect routes, i.e., the interconnect patterns, between the inner lead group 20 and the land group 30 in a limited space.

Above all, there is a limit to the number of leads 40 and 42 which can be connected in the area between adjoining lands in the land group 30. It is very important that the interconnect patterns for connecting all inner leads 22 and lands 32 are designed and determined prior to fabrication of the circuit board 11 without the adjoining leads intersecting each other in this limitation.

In the prior art, a designer manually decides such an interconnect route by trial and error. Because of this, it takes too much time and labor to determine the interconnect routes, presenting a serious problem in the development of circuit boards.

The object of the present embodiment is to ensure automatic and efficient determination of the interconnect routes of the first and second interconnect leads 40, 42 described above at the circuit design stage.

(1-2) Fan-in Type Semiconductor Device

FIG. 52 schematically shows a film carrier tape of a fan-in type semiconductor device to which the present invention is applied. The same reference numerals as in FIG. 1 and FIG. 51 are given to the corresponding members in this figure, and explanations thereof are omitted.

The configuration of this type of device is principally the same as that of the fan-out type device.

The film 10 of this type of device provided with a rectangularly arranged inner lead group (target group) 20, the land group 30 arranged in a rectangular matrix inside the lead group 20, and a plating lead 16 disposed around of the rectangularly arranged lead group 20. The first interconnect lead 40 is formed in one-to-one relation between each lead 22 constituting the each lead group 20 and each land 32 forming the land group 30. In addition, an interconnect lead 42, which is a line, is formed between each lead 22 and the plating lead 16.

Illustration for each member is omitted here, because the basic constitution is the same as that of previously described fan-out type device.

How to determine the interconnect routes between the lead group 20 and the land group 30 inside thereof is an important subject in the development and design of the circuit substrate 11 also in this fan-in type device.

An object of the this embodiment is to ensure automatic and efficient determination of the interconnect route of the first interconnect leads 40 at the circuit design stage of the fan-in type semiconductor device.

There is no difficulty in deciding the interconnect routes for the second interconnect leads 42, because the interconnect between the lead group 20 and the plating lead 16 arranged outside thereof in this type of devices can be performed merely by directly connecting the lead and plating lead.

(1-3) Mixed Type Semiconductor Device

FIG. 53A shows a specific example of a film carrier tape which is used for a mixed type semiconductor device of the fan-out type and fan-in type.

The inner lead group 22 which becomes the interconnect target column, the land group 30 arranged in a matrix outside the inner lead group 22, and the land group 30 arranged in a rectangular matrix inside thereof can be interconnected in the same manner as in the fan-out type and fan-in type devices. Therefore, illustration is omitted here.

(2) Circuit Board Designing Device

Figure 2:
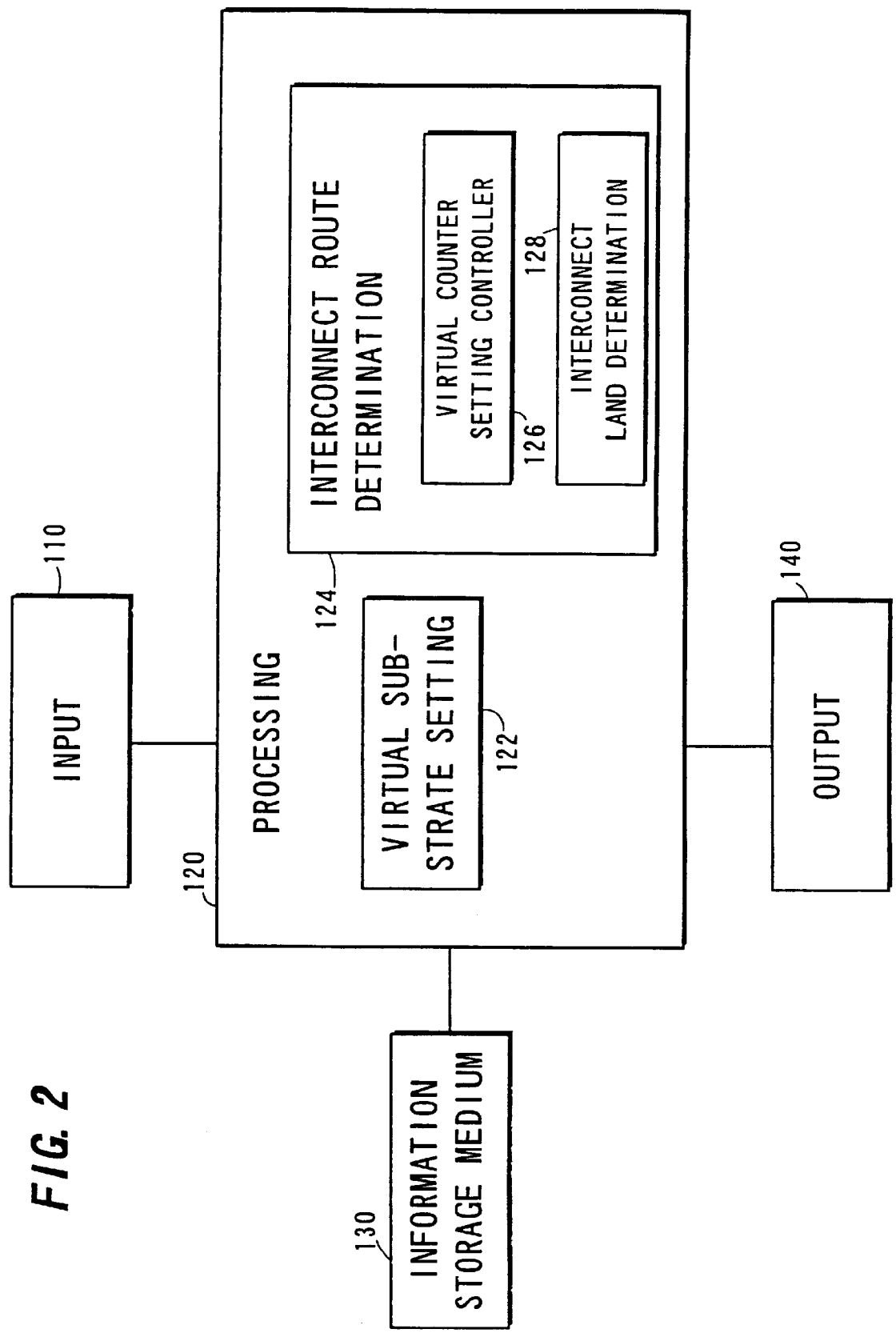
FIG. 2 is a functional block diagram showing an example of an interconnect route determination device to which the present invention is applied.

FIG. 2 shows an example of a designing device for designing a circuit board by deciding the interconnect routes of the above-described tape circuit board 11, more particularly, the film 10.

The designing device of the present embodiment comprises an input section 110 which an operator operates, a data processing section 120 comprising a variety of CPUs, memory, and the like, an information storage medium 130 in which various types of information are stored, and an output section 140.

Information such as algorithms for designing circuits and various data are stored in the information storage medium 130. This information includes programs and data which have algorithms for deciding the interconnect routes described below, algorithms for designing circuit patterns, and other necessary algorithms, and causes the processing section 120 to function as a virtual substrate setting section 122 and an interconnect route determination section 124.

Figure 3:
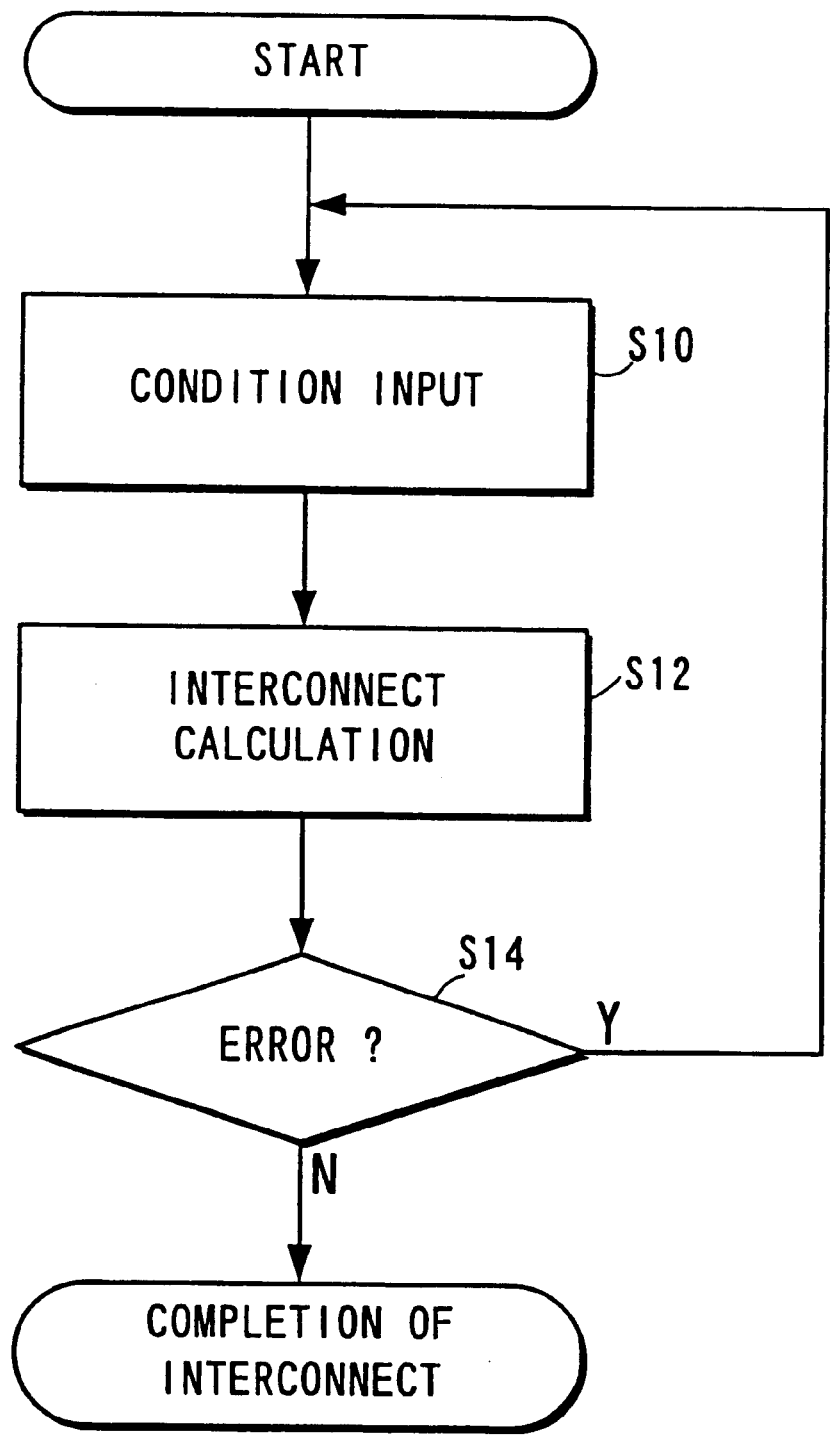
FIG. 3 is a flow chart showing the operation of the device shown in FIG. 2.

FIG. 3 shows a flow chart of interconnect route determination calculations.

Figure 4:
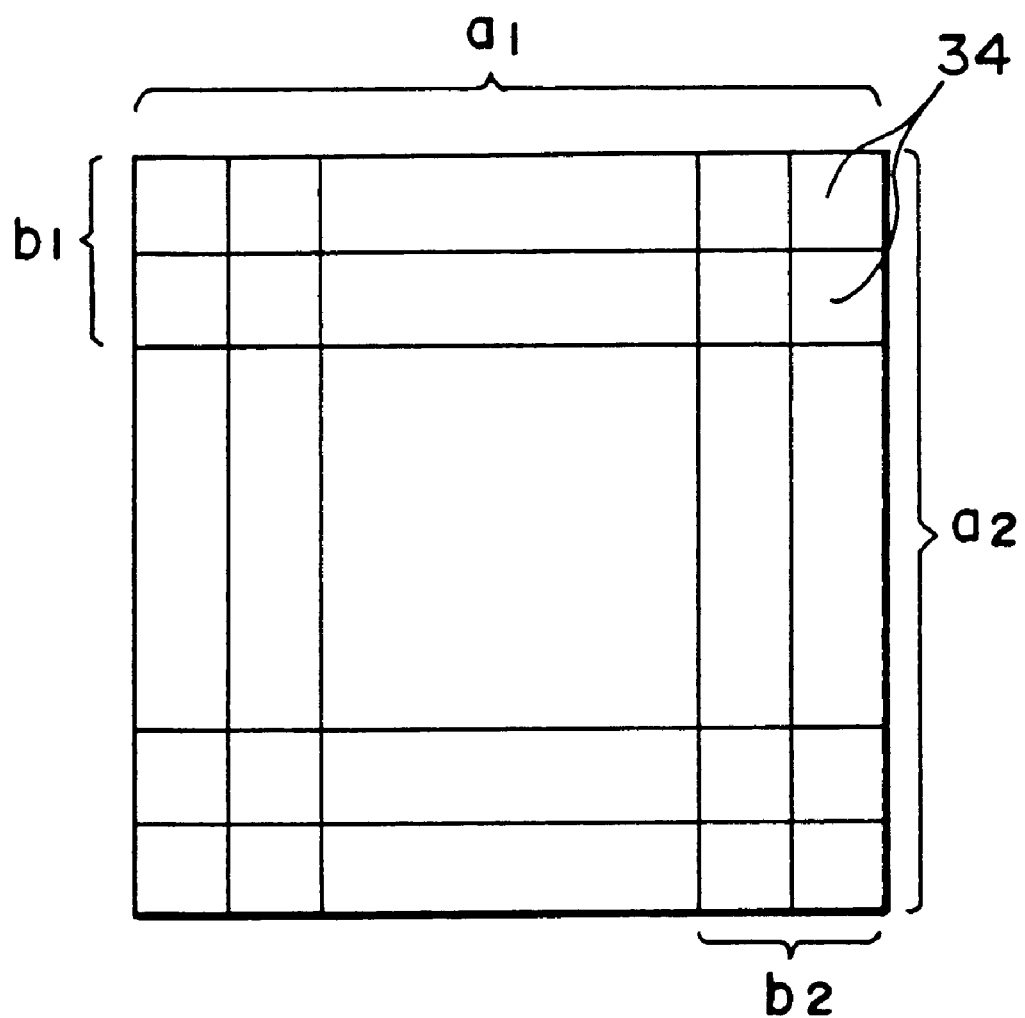
FIG. 4 is an illustration of various input items input in the condition input step shown in FIG. 3.

In step S10, the designer inputs various data for the circuit board (for example, the data specifying the type of the designing object, e.g. a fan-out type circuit, fan-in type circuit, or mixed type circuit, and detailed data for the circuit board of each of the above types) and various parameters for interconnect route determination. Examples of these are shown in FIGS. 4 and 5.

When a tape circuit board is designed, for example, the arrangement, size, and the like of the land group 30 which is arranged in a rectangular matrix are input. In this embodiment, each land is respectively considered as a cell and the size of the land group 30 is input as a size of a frame in which a plurality of cells are arranged in a matrix. Specifically, a1 and a2 which are vertical and horizontal lengths of the outer periphery of a frame, respectively, and b1 and b2 which are thickness of the frame in the vertical and horizontal directions are input as the frame size. The number of cells constituting the frame, i.e., the number of lands 32, is also input.

Furthermore, as shown in FIG. 5, the size of each cell constituting a matrix, the land size of the land 32 existing in each cell, and the land gap are input. In addition, as shown in FIG. 5C, the width between lead lines and gap of leads for each lead 40 and 42, which are interconnected to pass through the areas between the lands 32, are input.

When such an input operation is completed, the processing section 120 performs a process for designing the circuit board 11 in the next step S12.

First, the virtual substrate setting section 122 virtually designs, for example, the circuit shown in FIG. 1 based on the input data.

At this time, the cell size of a matrix, impassable area and passable area between the each land 32, and the lead line pitch are determined based on the following formulas:

Cell size=Frame size/Number of cells

Impassable area=Land size+(Land gap×2)

Passable area=Cell size−Impassable area

Lead line pitch=Width of lead line+Gap between leads

Using data for the impassable area and passable area determined in this manner, the number of leads 40 and 42 which can pass through the adjoining lands 32 in the vertical and horizontal directions and the number of leads which can pass through a space between the lands 32 adjoining in the diagonal directions, which can pass through a space between the lands 32 adjoining in the diagonal directions, are determined according to the following formulas. In the calculation, the remainder of the passable number and the remainder of the passable number is to be discarded.

Passable number=(Passable area+Gap between leads)/Lead line pitch

Passable number=(Passable area+Gap between leads)×√12/Lead line pitch

The interconnect route determination section 128 determines the interconnect route of the first interconnect lead 40 connecting the inner lead group 20 and the land group 30 and the interconnect route of the second interconnect lead 42 connecting the land group 30 and the plating lead 16 so that the amount of interconnect passing between each land falls below the passable number without the leads intersecting.

Then, the data processing section 120 outputs the data through the output section 140 when all the interconnect routes have been determined.

When each lead 40 and 42 described above cannot be interconnected by using the input parameters, the data processing section 120 outputs an error message through the output section 140 at step S14. At this time, the designer may reenter new parameters, such as the land size, land gap, width of lead line, and gap between leads from input section 110. This causes the data processing section 120 to perform the operational process for deciding the interconnect routes shown in step S12 based on these new parameters and to output the operational result from the output section 140 at step S14.

In this manner, according to the device of the present embodiment, a designer can automatically determine the interconnect routes for the first interconnect lead 40 connecting the inner lead group 20 and the land group 30 and the interconnect routes for the second interconnect lead 42 connecting the land group 30 and the plating lead 16 by inputting the interconnect parameters.

The details will be described below.

The process for the determination of interconnect routes of fan-out type will be first described in the following section (3), following which the process for the determination of the interconnect routes of a fan-in type semiconductor device will be described in detail in the section (4). The description on the process for the determination of interconnect routes of a mixed type is omitted, because such processing is a combination of the above-described process of interconnect route determination for the fan-out type and fan-in type semiconductor devices.

(3) Process of Interconnect Route Determination for Fan-out Type Semiconductor Devices Details of the process of interconnect route determination for fan-out type semiconductor devices will be described first.

(3-1) Sub-division of the Interconnect Area

Figure 6:
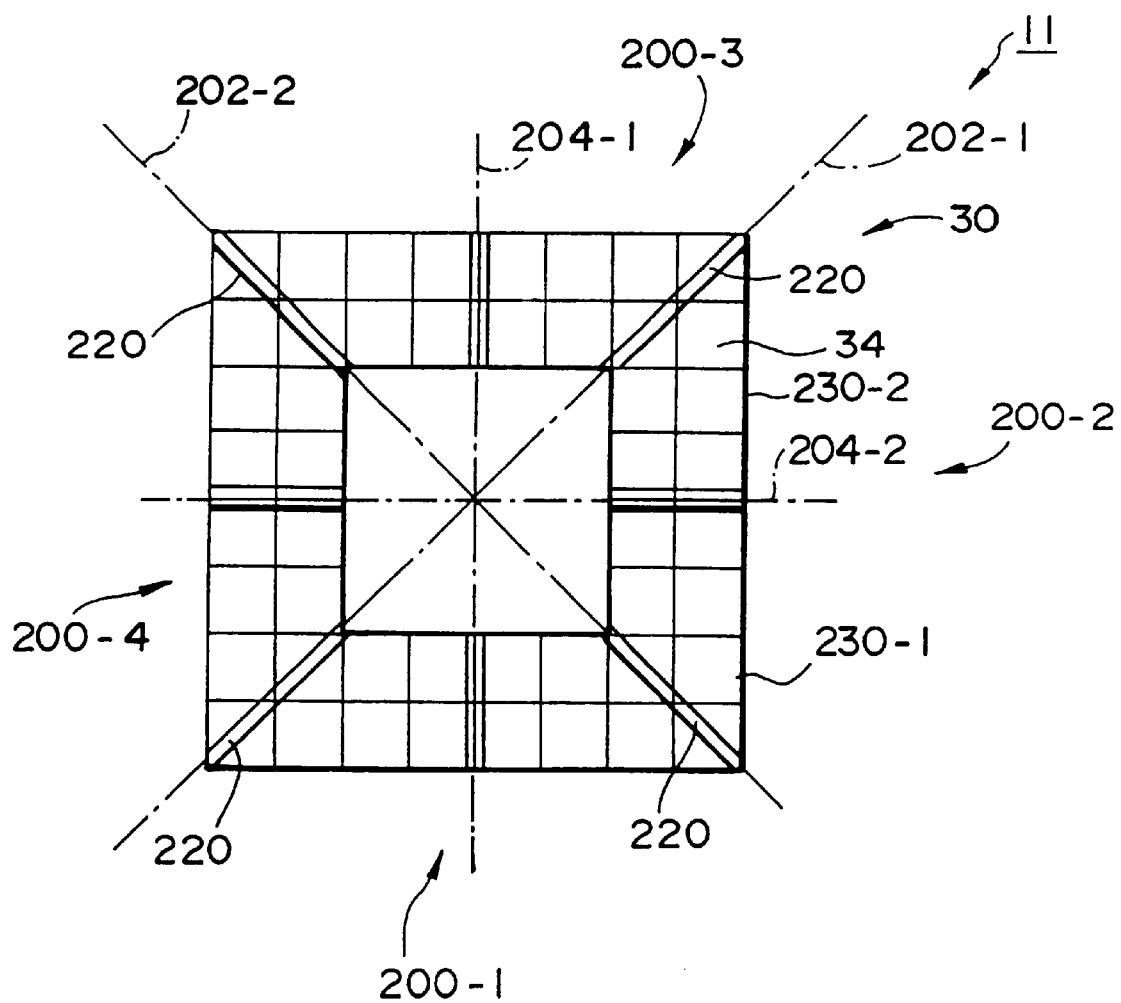
FIG. 6 is an illustration of divided areas.

FIG. 6 schematically shows the land group 30 arranged in a matrix so as to rectangularly surround the inner lead group 20 that is arranged in a rectangular frame. In this figure, each cell 34 in the land group 30 virtually denotes the area where the land 32 exists. For simplification of the explanation, the number of cells shown in this figure is much less than the actual number of cells.

(3-1-1) Division into Four Divided Areas

In the present embodiment, the rectangular land group 30 is virtually divided into four trapezoidal areas corresponding to each side of the rectangle to determine the interconnect routes for the interconnect leads 40 and 42. In this figure,: the rectangular land group 30 is virtually divided along a pair of diagonals 202-1 and 202-2 into four trapezoidal divided areas 200-1, 200-2, 200-3, and 200-4.

Further, a pair of centerlines 204-1, 204-2 perpendicular in the horizontal and vertical directions to the rectangular land group 30 are assumed.

In each divided area 200, land columns for one column corresponding to both sides of the trapezoid are made common areas with adjoining divided areas, i.e., surface common portions 220-1 and 220-2.

FIG. 7 shows an example of each divided area 200. In this figure, the divided area 200 is sub-divided into a center common portion 210 consisting of two rows of lands arranged on both sides of the centerline 204, surface common portions 220-1 and 220-2 arranged in areas corresponding to both sides of the trapezoid, and process surfaces 230-1 and 230-2 arranged between the center common portion 210 and the surface common portions 220. Then, as will be described hereinafter, the interconnect routes are determined from the left side of the centerline 204 in the sequence of the center common portion 210, process surface 230-1, and surface common portion 220-1, and then to the right side of the centerline 204 in the sequence of the center common portion 210, process surface 230-2, and surface common portion 220-2. Other methods, such as the method of starting from the center common portion 210 in the sequence of the process surfaces 230-1 and 230-2 disposed on both sides of the center common portion 210, and surface common portions 220-1 and 220-2, may be adopted.

This enables the interconnect of the interconnect leads 40 and 42 in the divided area 200 to be substantially symmetrical in respect of the centerline 204.

When such interconnect is performed, as will be described below, although the interconnect in the process surfaces 230-1 and 230-2 is performed in accordance with a usual algorithm, part of the interconnect work in the center common portion 210 is carried out by a special interconnect technique because of expansion of the interconnect routes on the surfaces 230-1 and 230-2 on either side of the center common portion 210. Further, the interconnect in the surface common portions 220-1, 220-2 partially adopts a special interconnect technique due to the adjoining divided areas. This special interconnect technique will be described later.

In this manner, according to the present embodiment, the interconnect routes for the substantially trapezoidal divided area 200 are determined. At this time, when the land matrices of the four divided areas 200-1, 200-2, 200-3, and 200-4 are the same, if interconnect routes for one divided area are determined, the interconnect routes of this divided area 200 can be adopted directly as interconnect routes for the other divided areas. Specifically, if interconnect routes of the divided area 200-1 are determined as shown in FIG. 8A, then these interconnect routes can be adopted as the interconnect routes of the divided area 200-2 as shown in FIG. 8B, the interconnect routes of the other divided area 200-3 as shown in FIG. 8C, and the interconnect routes of the divided area 200-4 as shown in FIG. 8D. In this manner, by deciding the interconnect patterns of the interconnect leads 40, 42 in the divided area 200-1, these interconnect patterns can be adopted as the interconnect patterns of the remaining three areas 200-2, 200-3, and 200-4, so that the operational load necessary for determining the interconnect routes can be significantly reduced.

Furthermore, when only the opposing divided areas of the land group 30 are formed as the divided areas of the same land matrix arrangement, the interconnect routes of the divided areas 200-1 and 200-2 are determined first, as shown in FIG. 9A, and then the interconnect routes of the divided area 200-1 are adopted as the interconnect routes for the divided area 200-3 and also the interconnect routes for the divided area 200-2 are adopted as the interconnect routes of the divided area 200-4, as shown in FIG. 9B.

This allows the load for determining the interconnect routes to be significantly reduced.

(3-2) Determination of Interconnect Routes in the Divided Areas

Next, details for determining the interconnect routes for the first and second leads 40 and 42 in each divided area 200 will be described.

Figure 10:
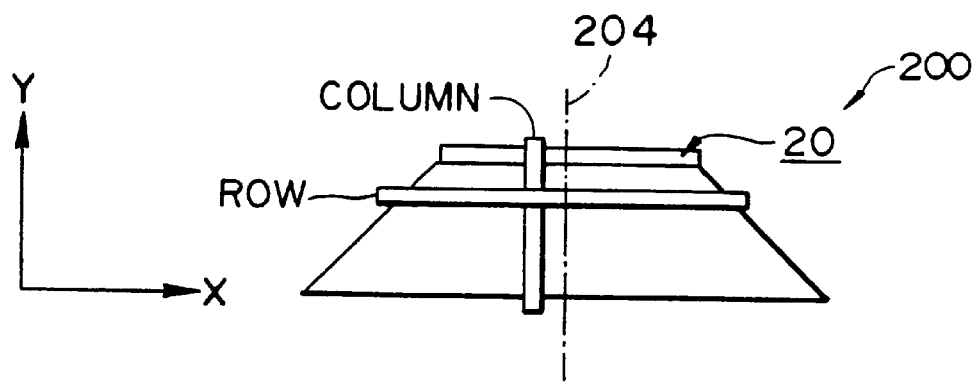
FIG. 10 is an illustration of a row and column in a divided area.

FIG. 10 schematically shows the divided area 200. In this figure, the direction of the centerline 204 is defined as the row direction and right angles to this is defined as the column direction.

(3-2-1) Lead Number

Figure 11:
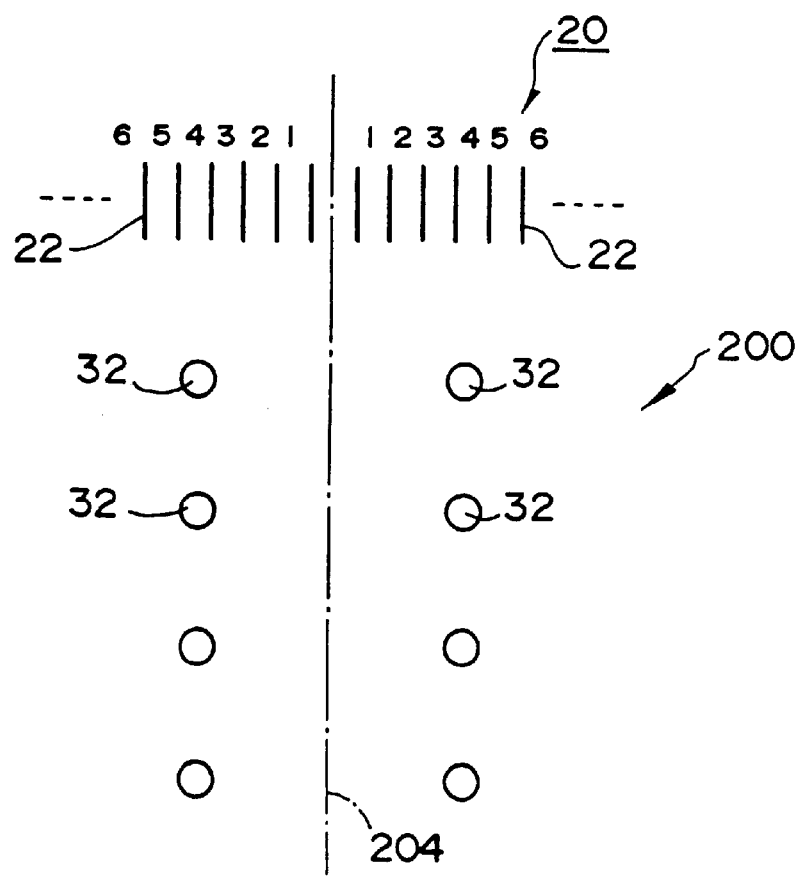
FIG. 11 is an illustration of numbers assigned to an inner lead group.

FIG. 11 shows an illustration of the inner lead group 20 disposed inside the divided area 200. In this inner lead group 20, lead numbers 1, 2, 3, . . . are assigned in turn to each inner lead 22 from the inner leads positioned on both sides of the centerline 204 in both directions.

In addition, the inner lead 22 is selected as an interconnect target lead in sequence from the lowest assigned number.

(3-2-2) Order of Priority of a Land

FIG. 12 shows an example of the order of priority assigned previously to each land arranged in a matrix. In the divided area 200 shown in FIG. 7, the order of priority assigned to the land group in the left area of the centerline 204 is shown.

First, the land 32 residing in a row adjoining to the left side of the centerline 204, i.e., the land 32 residing on the left side of the centerline 204 in the center common portion 210 is set so that the land 32 positioned on the side of the plating lead 16 becomes higher in order of priority. When there is no other restriction, this causes the lands in the center common portion 210 to be selected as the interconnect lands in the sequence shown by the arrow.

Further, in the process surface 230 and the surface common portion 220, the order of priority of each land arranged in a matrix is determined as follows.

In determining the order of priority of each land included in each trapezoidal area divided into eight by the centerline 204 and diagonal 202, a plurality of diagonal lines which connect lands adjoining in the diagonal direction along the diagonal 202 is assumed. The order of priority of lands included in a priority setting line more distant from the diagonal 202 is set higher, and, among the lands positioned on the same priority setting line, those positioned closer to the outer periphery are given higher order of priority. When there is no other restriction, this causes the lands in the process surface 230 and the surface common portion 220 to be selected as the interconnect lands in the sequence shown by the arrows.

In a divided area 200, the order of priority in the area to the right of the centerline 204 is assigned so as to be line symmetrical with respect to that shown in FIG. 12.

By assigning the order of priority in this manner, each inner lead 22 is selected as an interconnect target lead in sequence from the leads of the centerline 204 side, as shown in FIG. 11. Further, each land is selected as an interconnect land in accordance with the order of priority previously assigned, as shown in FIG. 12. Therefore, when there is no other restriction, the interconnect routes of each lead 40 are determined so that the inner leads 22 corresponding to the lead numbers shown in FIG. 11 and the lands in accordance with the order of priority shown in FIG. 12 are connected in sequence.

(3-2-3) Process of Interconnect Route Determination Using Virtual Counters

As described above, the passable number of the leads 40 and 42 which can pass between each land 32 is limited to a predetermined number. In the present embodiment, this number is limited to four.

Under such a limitation, the interconnect lands can not be simply selected in accordance with the order of priority shown in FIG. 12 to determine their interconnect routes.

Accordingly, the interconnect circuit determination section 124 of the present embodiment functions as a virtual counter setting controller 126 and a interconnect land determination section 128.

As will be described in more detail later, the virtual counter setting controller 126 virtually sets counters 300 between each of the lands 32. The counters 300 count the number of leads 40 and 42 passing through the areas between the adjoining lands.

The interconnect land determination section 128 determines a land 32 which becomes an interconnect target in accordance with the order of priority for each land 32 described above and data for the virtual counters 300.

Moreover, the interconnect circuit determination section 124 determines the interconnect routes of the interconnect leads 40, 42 connecting the determined interconnect target land 32 and leads 22, 16 according to the data of the counters 300.

The details will be described below.

As shown in FIG. 13, a total of four virtual counters are virtually disposed in the row and column directions around each of the lands 32 arranged in a matrix. In this figure, first to fourth counters 300-1, 300-2, 300-3, and 300-4 are virtually disposed between adjoining lands.

The algorithm for interconnect route determination according to the present embodiment is constituted so that setting of interconnect routes of new leads 40 and 42 to areas between each land 32 is permitted only when the counters 300 disposed between the lands are controlled to be in the open condition.

Thus, by controlling opening and closing conditions of the counters 300 virtually disposed, the interconnect routes of the interconnect leads 40 and 42 can be determined automatically.

When each counter 300 is in the open counter state, the counter 300 counts the number of leads 40 and 42 determined to pass through the area between the lands 32 and 32 in which the open counter 300 resides. Each counter 300 does not perform such count operation when it is in a closed counter state.

FIG. 14 schematically shows a rule for opening and closing control of the virtual counters 300. As shown in FIG. 14A, adjoining lands 32 share the counters 300.

Figure 15:
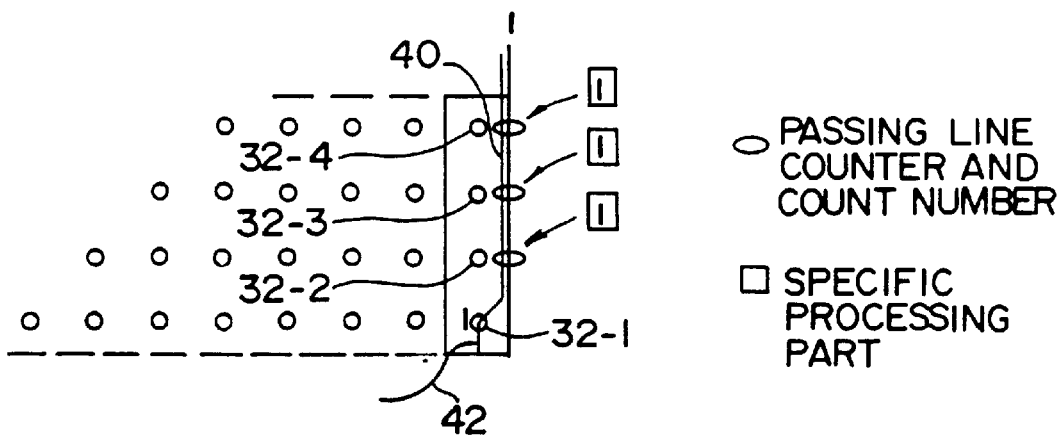
FIG. 15 is an illustration of a process of interconnect route determination for the lands in the center common portion.

FIG. 15 schematically shows a procedure for deciding the interconnect routes in the center common portion 210.

First, an inner lead which is initially made a target is the inner lead 22 of lead number 1 shown in FIG. 11. The interconnect target land 32T of this inner lead is a land of the highest order of priority in the center common portion 210, i.e., the land 32-1 positioned on the side of the plating lead 16.

A: Initial Setup of the Counters

Figure 14A:
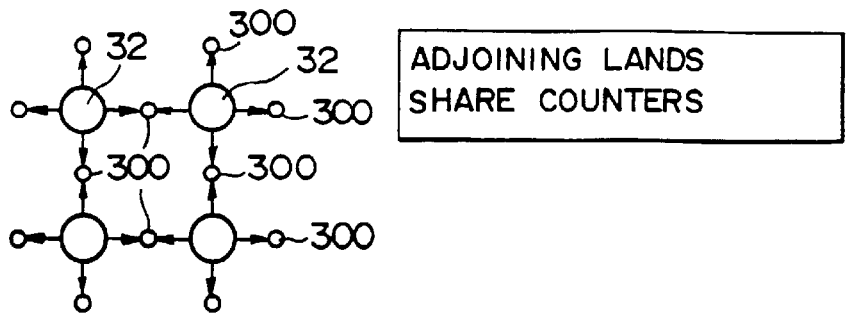
FIGS. 14A to 14D are drawings illustrating an example of a control for counters virtually disposed to each land.
Figure 14B:
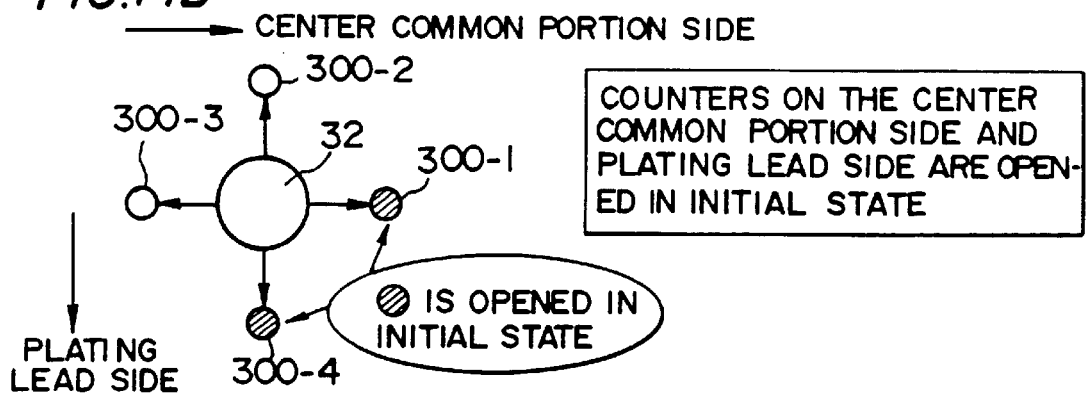

The virtual counter setting controller 124 according to the present embodiment initializes the virtual counters 300 positioned around the first interconnect target land 32-1 (32T) in order to determine the first interconnect leads 40 and 42, as shown in FIG. 14B.

Specifically, the first virtual counter 300-1 positioned on the centerline 204 side and the fourth virtual counter 300-4 positioned on the plating lead 16 side are opened, and the second and third virtual counters 300-2, 300-3 opposed to those first and fourth counters 300-1, 300-4 with respect to the land 32-1 are closed.

Furthermore, virtual counters (first virtual counters) 300 on the centerline 204 side of lands 32-2, 32-3, and 32-4 belonging to the same row as this interconnect target land 32-1 are also opened.

Counters other than those counters are all in the closed condition. In this manner, the virtual counters are initialized prior to the determination process for the interconnect routes.

B: Counting Operation

In the present embodiment, the interconnect routes between the interconnect target inner lead 22 and the interconnect target land 32-1 are determined so that the lead 40 passes through the areas in which the open counters 300 reside. In addition, the routes of the interconnect lead 42 between the interconnect target land 32-1 and the plating lead 16 are determined so that the lead 42 passes through the areas in which the open counters reside.

This causes the interconnect routes of the initial first interconnect lead 40 and the second interconnect lead 42 to be determined, as shown in FIG. 15.

At this time, each open counter 300 positioned on the interconnect routes of the interconnect leads 40 and 42 is controlled so as to increment the count value.

C: Controlling Counters Around the Interconnect Lands

Figure 14C:
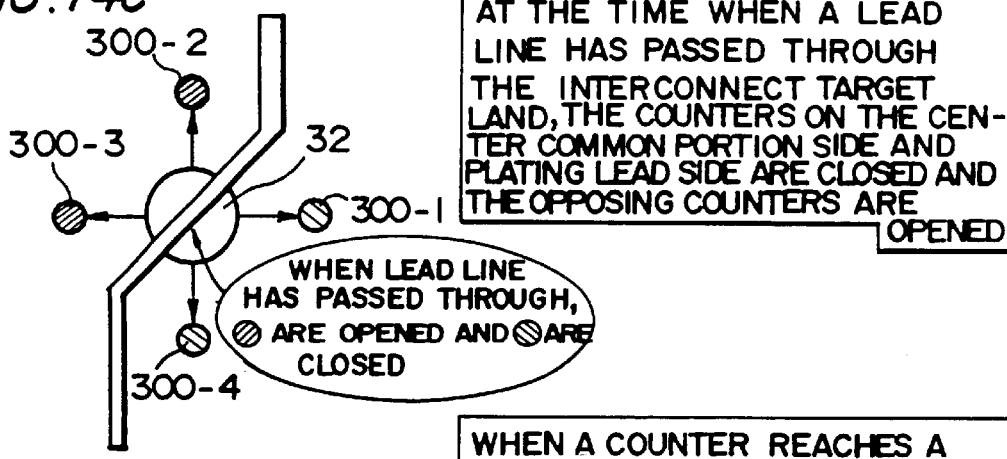

Once the interconnect routes of the interconnect leads 40 and 42 to the interconnect target land 32-1 have been determined, then virtual counters 300-1 to 300-4 whose opening and closing are controlled around the interconnect target land 32-1, as shown in FIG. 14B, are controlled as shown in FIG. 14C. Specifically, the first and fourth counters 300-1 and 300-4 are closed, and the second and third counters 300-2 and 300-3 are opened.

This causes prearranged routes for new interconnect of the interconnect leads 40 and 42 to the next interconnect land to be set up.

D: Control When Second and Following Interconnect Routes are Determined

Figure 16:
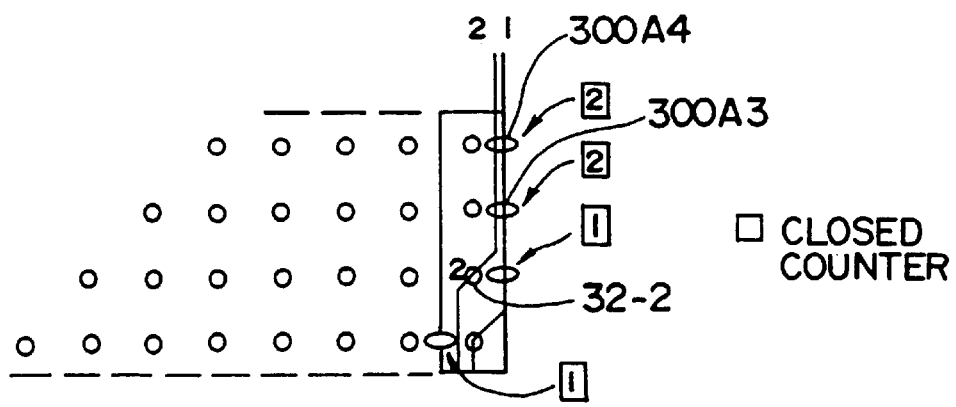
FIG. 16 is an illustration of a process of interconnect route determination for the lands in the center common portion.

The route of a first interconnect lead 40-2 connecting a second inner lead 22 and a second interconnect target land 32-2 is determined based on the areas in which open counters 300 reside, as shown in FIG. 16. Similarly, the interconnect route of a second interconnect lead 42-2 connecting the interconnect target land 32-2 and the plating lead 16 is also determined based on areas in which open counters resides In addition, count values of the virtual counters 300 positioned on the interconnect routes of these interconnect leads 40-2 and 42-2 are incremented.

After the interconnect route has been determined, the opening and closing of the virtual counters 300 positioned around the interconnect target land 32-2 are controlled according to a rule shown in FIG. 14C. Specifically, the first and fourth counters 300-1 and 300-4 are closed and the second and third virtual counters 300-2 and 300-3 are opened.

E: Interconnect Rule Specific to the Center Common Portion

Similarly, the interconnect route between a third inner lead 22-3 and a third interconnect target land 32 is determined. In the center common portion 210, the interconnect route of the interconnect lead 40 is preferably determined so that the areas on the right and left sides with respect to the centerline 204 are substantially symmetrical. For this reason, the interconnect between the inner lead 22 and the land 40 is allowable only when the values of the virtual counters 300 positioned on the centerline 204 side are not more than 2.

Figure 17:
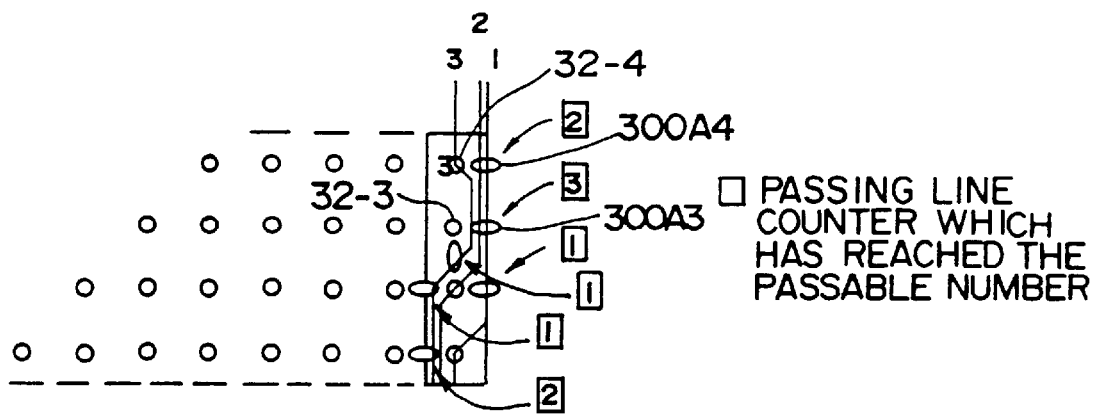
FIG. 17 is an illustration of a process of interconnect route determination for the lands in the center common portion.

Therefore, as shown in FIG. 16, even if counters 300A3 and 300A4 are opened, the interconnect route determination section 128 does not allow the interconnect route of the first interconnect lead 40 to be set in areas in which the counters 300A3 and 300A4 reside. For this reason, according to the order of priority shown in FIG. 12, the subsequent interconnect land must be 32-3, however, in this case, priority is given to the interconnect limitation rule of the counters described above. In addition, the lands to which interconnect can be performed under this condition are determined as the interconnect lands. In this case, as shown in FIG. 17, a specific processing is performed in which a land 32-4 on the inner lead side is determined as an interconnect target land 32T. In addition, the interconnect route of the first interconnect lead 40 connecting the third inner lead 22 and this interconnect target land 32-4 is determined. In this instance, the determination process for the interconnect route of the second interconnect lead 42 is not subjected to the restriction of the counter interconnect limitation rule described above. Therefore, the interconnect route for the second interconnect lead 42 is determined so as not to intersect a proximate interconnect lead 42-2 according to the positions of open counters.

The count values of counters positioned between lands 32 through which the interconnect leads 40 and 42 have passed are incremented automatically.

Figure 14D:
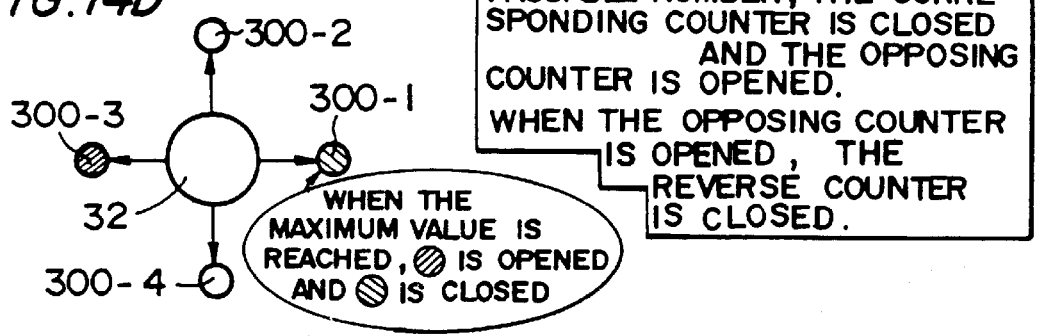

F: Controlling Counters Around the Interconnect Target Lands During Specific Processing The opening and closing of the counters positioned around the land 32-3 whose interconnect route has been determined are controlled as shown in FIG. 14D. Specifically, under such a condition that only a counter 300 of the land 32 on the side of the centerline 204 is opened, when the interconnect route to the land 32 is determined, as shown in FIG. 14D, only the open counter 300-1 is closed, and only a third counter 300-3 positioned opposite to the counter 300-1 is opened.

Figure 18:
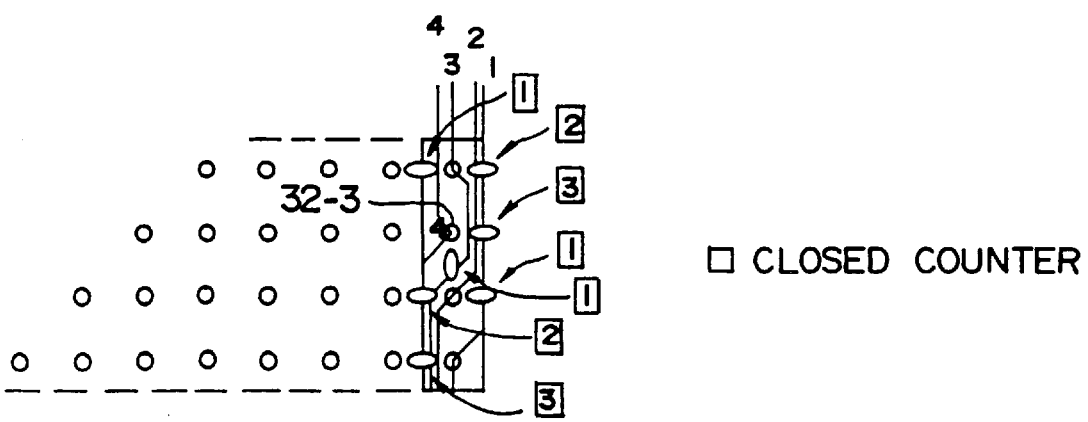
FIG. 18 is an illustration of a process of interconnect route determination for the lands in the center common portion.

When the interconnect route has been determined as shown in FIG. 17, the land 32-3 is determined as the fourth interconnect target land 32T according to the position of the open counter 300 and the order of priority of the land, as shown in FIG. 18. Also, the interconnect routes of the first and second interconnect leads 40 and 42 are determined according to data for the position of the open counters.

In this manner, the interconnect routes between each land 32 belonging to the center common portion 210 and the inner leads 22 are determined automatically.

G: Other Control Rules for Counters

Other than the rules described above for the opening and closing control of the virtual counters 300, there is a rule in which, when the count value of an open counter has reached the maximum, four, for example, the open counter 300 is closed and the counter 300 positioned in the reverse direction with respect to the land 32 is opened, as shown in FIG. 14D.

H: Summary of the Counter Control Rules

The counter control rules according to the present embodiment is summarized as follows.

First of all, the initial setting rule will be summarized.
(The first rule)
To the first interconnect target land 32T, as shown in FIG. 14B, the initial setting is performed so as to open the first and fourth counters 300-1 and 300-4 and to close the second and third counters 300-2 and 300-3.
(The second rule)
The initial setting is performed so that the virtual counter 300, which belongs to the same row as the land 32T which is the first interconnect target and is positioned on the centerline 204 side, is opened and the other counters are closed.

Next, the control rule for counters during operation of the process of interconnect route determination will be summarized.
(The first rule)
When the interconnect route to the interconnect target land 32T under the condition shown in FIG. 14B has been determined, the counters positioned around the land are controlled from the condition shown in FIG. 14B to that shown in FIG. 14C.

(The second rule)
When the interconnect route to the interconnect target land 32T in which only the counter on the centerline 204 side is opened as shown in FIG. 14D, is determined, the open counter 300 is closed and the closed counter positioned in the opposite side to the counter is opened.
(The third rule)
When the count value of the open counter 300 reaches the maximum, as shown in FIG. 14D, the corresponding counter is controlled to be closed, and the closed counter positioned in the reverse side to this counter with respect to the land 32 is controlled to be opened.

By controlling the counters 300 according to the first to third rules described above, the interconnect target lands 32T can be properly determined, based on the areas in which the open counters reside and the order of priority of the lands 32 shown in FIG. 12 to automatically determine the interconnect routes between the lands 32 and the inner lead group 20 and the plating lead 16, i.e., the interconnect routes of the first and second interconnect leads 40, 42.

I: Summary of the Interconnect Route Determination Rules

Next, the interconnect route determination rules will be summarized.
(Basic rule)
The interconnect routes are set in sequence in the areas in which the open counters reside.
(Limitative rule)
There is a limitation in the basic rules. This is a specific rule in the interconnect of the first interconnect lead 40 in the center common portion 210.

In the center common portion 210, it is the rule that, when the count value of the open counter 300 exceeds 2 (exceeds half of the passable number), even if the counter is opened, new interconnect of the first interconnect lead 40 is not allowed in the area between lands in which the open counter resides. This rule is applied only when the interconnect route of the first interconnect lead 40 in the center common portion 210 is determined, and is not applied when the interconnect route of the second interconnect lead 42 is determined and when the interconnect routes are determined in any other areas.

Figure 19:
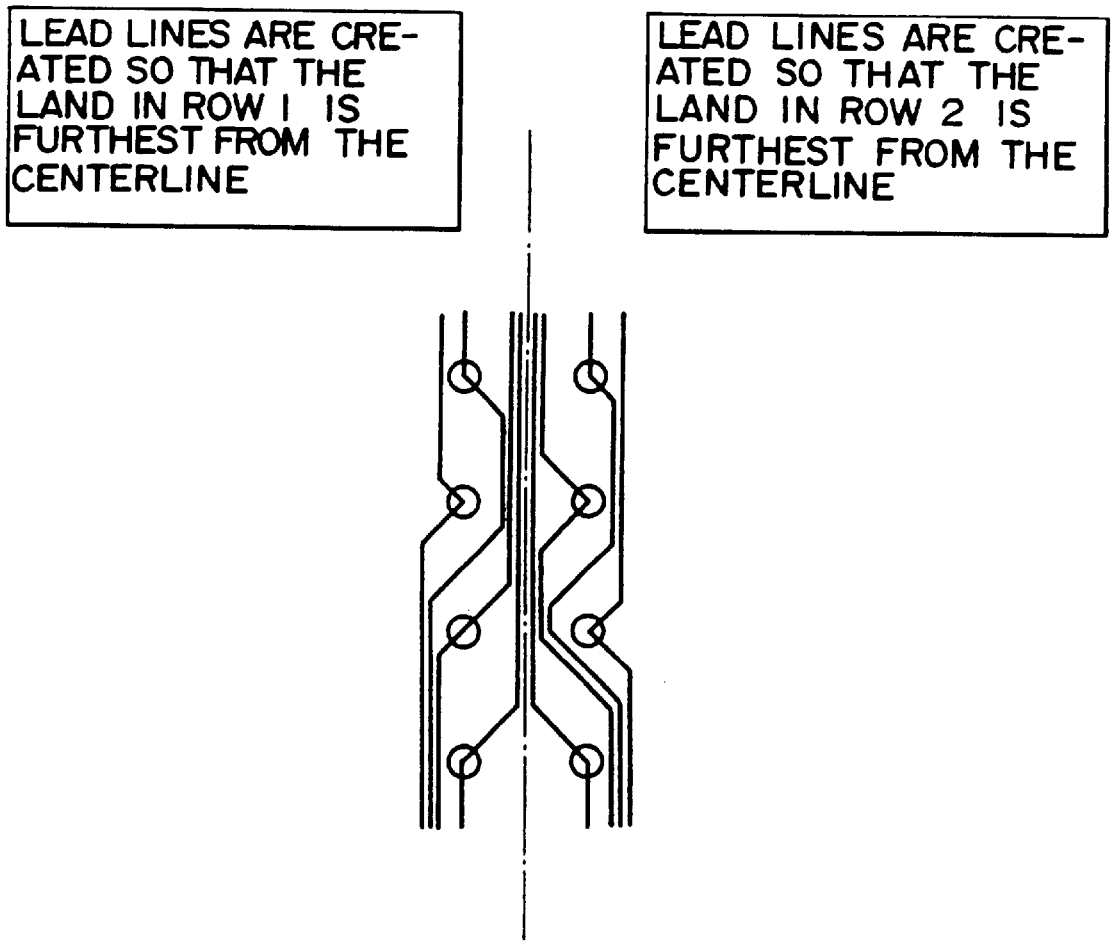
FIG. 19 is an illustration of a process of interconnect route determination for the lands in the center common portion.

In FIG. 19, the interconnect routes of all areas in the center common portion 210 determined according to such rules are shown.

J: Interconnect Route in the Process Surface

After the interconnect patterns in the center common portion 320 have been determined in this manner, the determination process for the interconnect route in the process surfaces 230 is then performed, as shown in FIGS. 20 to 24.

This determination process for the interconnect route is basically performed according to the order of priority assigned to each land as shown in FIG. 12 and the existing positions of the open counters for which the opening and closing operations are controlled based on the rules described above.

Figure 20:
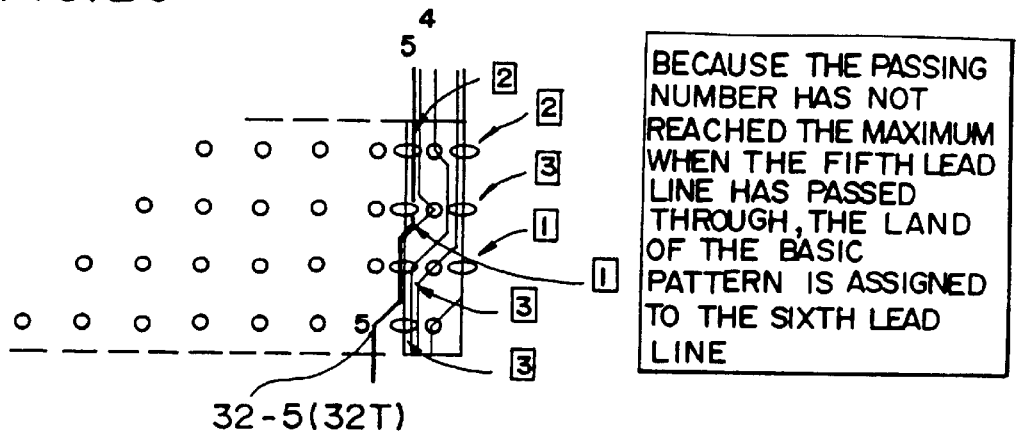
FIG. 20 is an illustration of a process of interconnect route determination for the lands in the process surface.

In the present embodiment, when the interconnect routes in the center common portion 210 have been determined as shown in FIGS. 15 to 18 described above, there are no open counters reached the maximum count value. For this reason, as shown in FIG. 20, a land 32-5 which has the highest order of priority among the residual lands is determined as the interconnect target land 32T. The interconnect routes of the first and second interconnect leads 40 and 42 to this interconnect target land 32-5 (32T) are then determined according to the positions of the open counters 300.

Figure 21:
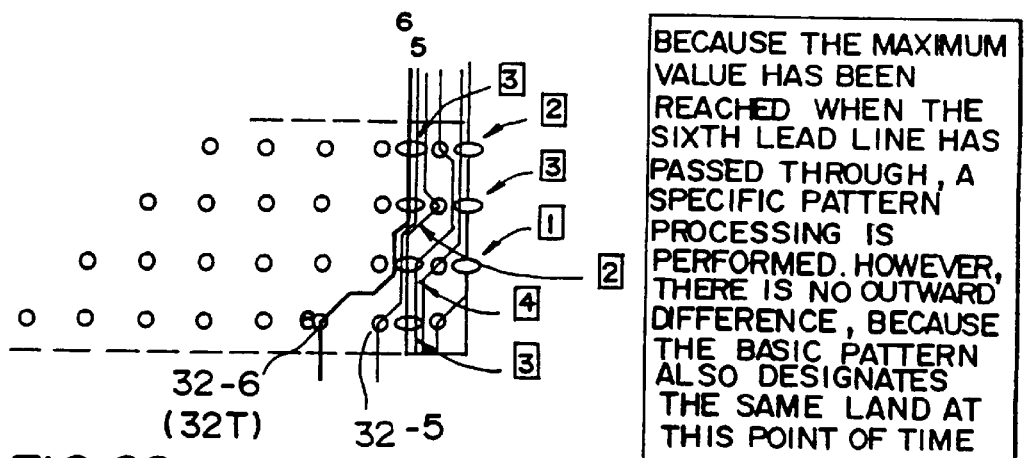
FIG. 21 is an illustration of a process of interconnect route determination for the lands in the process surface.

In this manner, even at the stage when the interconnect routes to the land 32-5 have been determined, there are no open counters reached the maximum count value. For this reason, as shown in FIG. 21, a land 32-6 with the second highest order of priority is determined as the interconnect target land 32T. Then, the interconnect routes of the first and second interconnect leads 40 and 42 are determined according to the positions of the open counters 300. Similarly, as shown in FIG. 22, the next interconnect routes are determined using the land 32-7 as the interconnect target land 32T.

Figure 22:
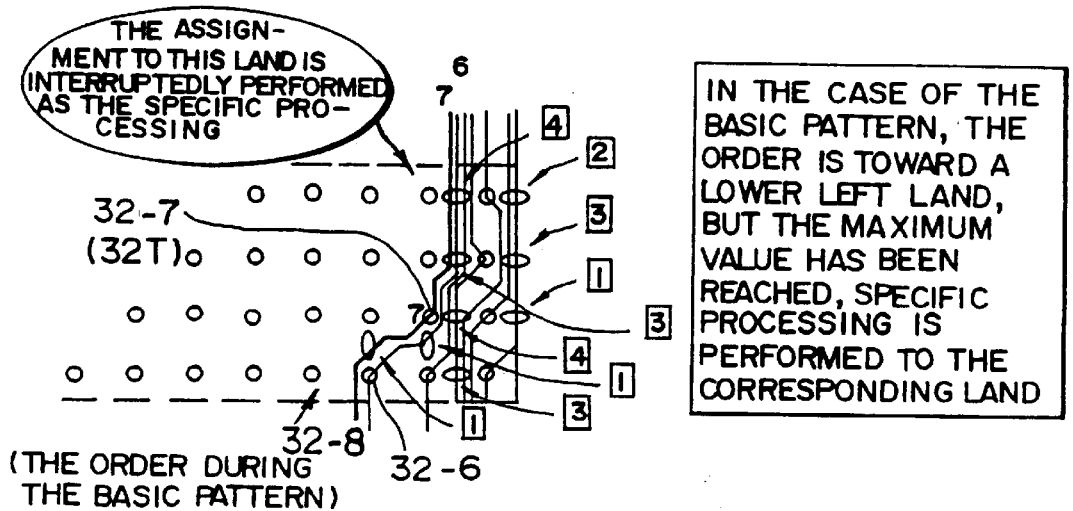
FIG. 22 is an illustration of a process of interconnect route determination for the lands in the process surface.
Figure 23:
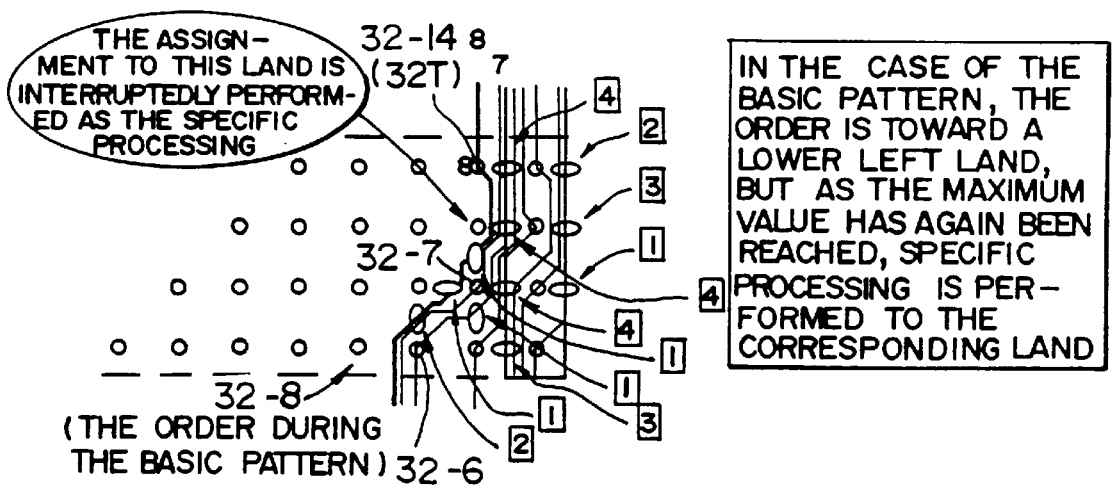
FIG. 23 is an illustration of a process of interconnect route determination for the lands in the process surface.

When the interconnect routes have been determined in the manner shown in FIG. 22, some open counters may have reached the maximum count value. In this case, if the interconnect route is based only on the order of priority, the land 32-8 positioned on the lower left is made the next interconnect land. However, since some counters have reached the maximum value, a specific processing is performed in which a land 32-14 adjoining the counter with the maximum value is used as the next interconnect target land 32T as shown in FIG. 23. Then, the interconnect routes of the first and second interconnect leads 40 and 42 are determined according to the positions of the open counters.

Figure 24:
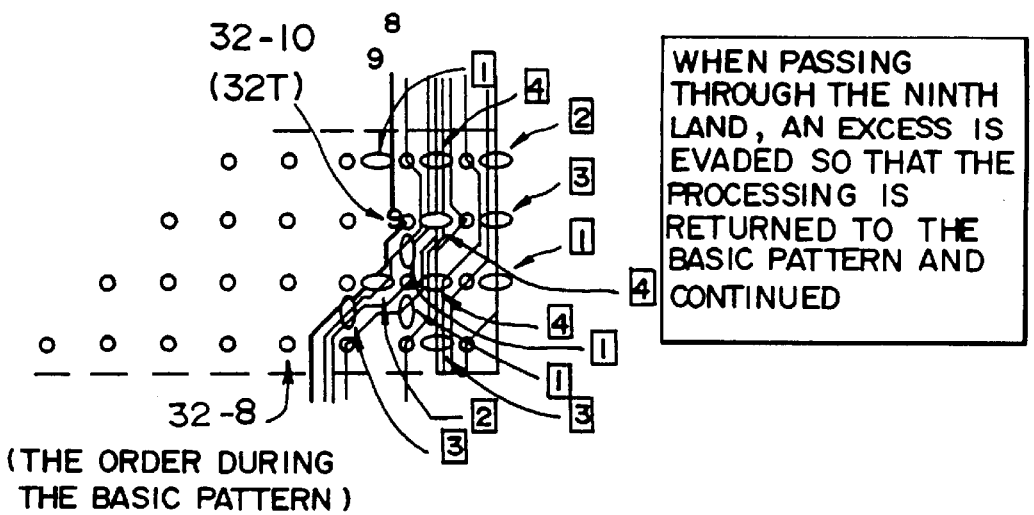
FIG. 24 is an illustration of a process of interconnect route determination for the lands in the process surface.

When the interconnect routes have been determined as shown in FIG. 23, the subsequent interconnect route is determined using a land 32-10 as the interconnect target land 32T as shown in FIG. 24.

The interconnect routes of the first and second interconnect leads 40, 42 in the process surfaces 230 can be determined automatically by repeating this process.

K: Processing for the Surface Common Portion

Figure 25:
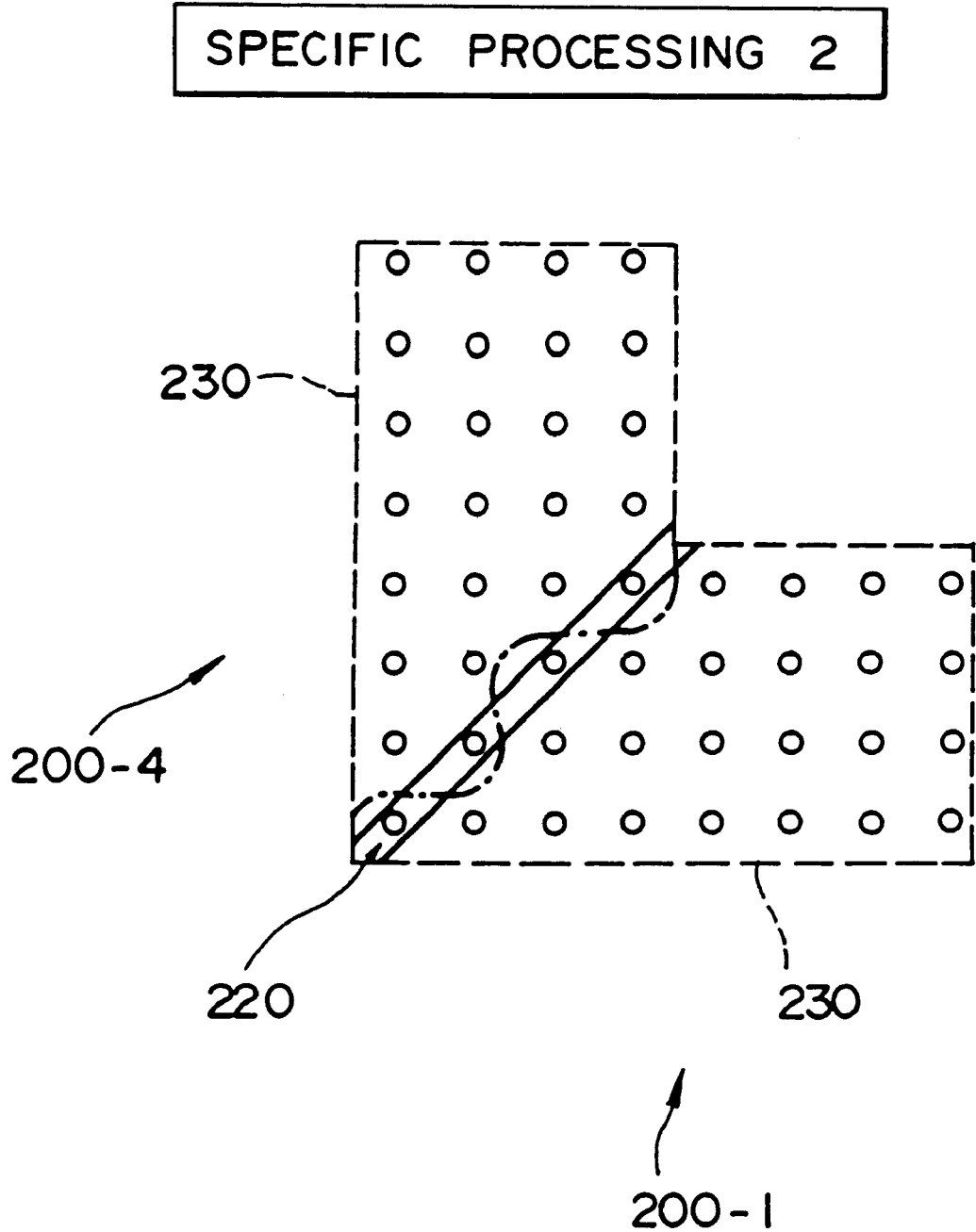
FIG. 25 is an illustration of the processing for lands in the surface common portion.

FIG. 25 shows details of the surface common portion 220.

In this surface common portion 220, as shown by the chain lines in the figure, the adjoining divided areas 200-1 and 200-4 share interconnect lands alternatively.

The interconnect routes to each land 32 are determined using the algorithm similar to the determination of the interconnect routes on the process surfaces 230 described above except that only the lands 32 in the divided area 200 to which each land 32 belongs are made interconnect lands.

According to the present embodiment, such interconnect processing to the divided area 200 is performed, as shown in FIG. 7, in the sequence of one center common portion 210, one process surface 230-1, surface common portion 220-1, the other center common portion 210, the other process surface 230-2, and surface common portion 220-2.

In this process of interconnect route determination calculation, when interconnect is judged to be impossible, the 5output section 140 shown in FIG. 2 described above outputs an error message. Accordingly, in this case, new parameters may be again input from the input section 110 to perform calculations for determining the interconnect routes under different conditions.

In this way, the interconnect routes in the divided area 200 can be determined automatically and efficiently while changing the input parameters.

When the interconnect pattern in one divided area 200 has been determined in this way, the pattern of the interconnect route in this divided area 200-1 can be directly adopted as the interconnect patterns in the other divided areas 200-2, 200-3, and 200-4, as shown in FIGS. 8A to 8D. For this reason, the determination process for the interconnect routes over an entire circuit board can be performed in a very short period of time.

In addition, when only opposing divided areas are symmetrically configured as shown in FIG. 9, the interconnect routes in the divided areas 200-1 and 200-2 are determined using the technique described above, then the interconnect routes already determined in the divided areas 200-1 and 200-2 can be adopted for the remaining divided areas 200-3 and 200-4 as shown in FIG. 9B. Therefore, in this case, the calculation load for the process of interconnect route determination can also be significantly reduced.

(3-3) Detail Algorithm for Interconnect Route Determination

More detailed algorithm for determining the interconnect routes of the first and second interconnect leads 40 and 42 will be explained below.

Figure 26:
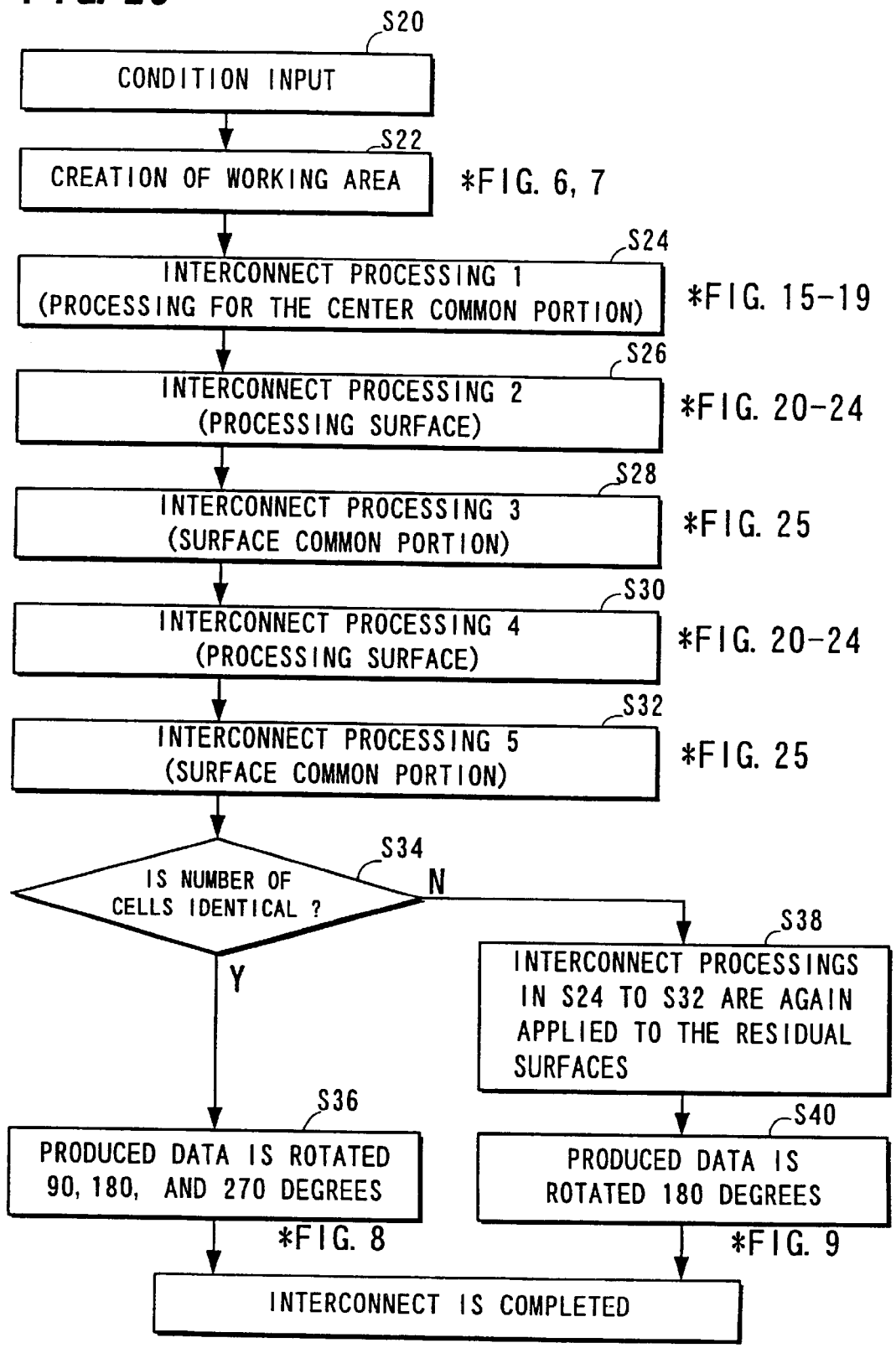
FIG. 26 is a flow chart showing a specific operation for the process of interconnect route determination.

(3-3-1) Algorithm for Interconnect Route Determination of an Entire Circuit Board FIG. 26 shows a flow chart showing this algorithm.

First, at step S20, conditions for determining the interconnect route, for example, various parameters described above are entered.

Next, at step S22, the virtual substrate setting section 122 virtually sets, for example, a circuit board 11 as shown in FIG. 6 to create working areas on this circuit board 11. In this embodiment, the land group 30 is divided into four divided areas 200-1, 200-2, 200-3, and 200-4 as the working areas, and further, as shown in FIG. 7, each divided area is sub-divided into the center common portion 210, process surfaces 230-1 and 230-2, and surface common portions 220-1 and 220-2.

Then, in subsequent steps S24 to S32, the process for determining the interconnect patterns of the first and second interconnect leads 40 and 42 is performed using the divided area 200-1 which is sub-divided as the target.

Next, in step S34, a judgement is made as to whether the number of cells in the divided area 300-1 is identical to that in the other divided areas 300-2 to 300-4. Specifically, a judgement is made as to whether a matrix arrangement of the lands 32 in the divided area 300-1 in which the interconnect patterns have been determined is the same as or differs from that in the other divided areas 300-2 to 300-4.

When the number of cells is judged to be identical in this step, the produced interconnect pattern data is rotated 90 degrees, 180 degrees, and 270 degrees and copied as the interconnect pattern data for each divided area 200-2, 200-3, and 200-4 in step S36, as shown in FIGS. 8A to 8D.

Further, in step S34, when the number of cells is not judged to be identical, the interconnect pattern determination process in the steps S24 to S32 is again performed to the other divided area 200-2 in a subsequent step S38.

In subsequent step S40, the data produced for the interconnect patterns in the divided areas 200-1 and 200-2 is rotated 180 degrees and copied as the data for the interconnect patterns in the divided areas 200-3 and 200-4.

In this way, according to the present embodiment, determination of the interconnect routes of a plurality of first interconnect leads 40 connecting the inner lead group 20 and the land group 30 and of the second interconnect lead 42 connecting the land group 30 and the plating lead 16 can be performed automatically and efficiently.

(3-3-2) Algorithm for Interconnect Route Determination in Divided Areas

Figure 27:
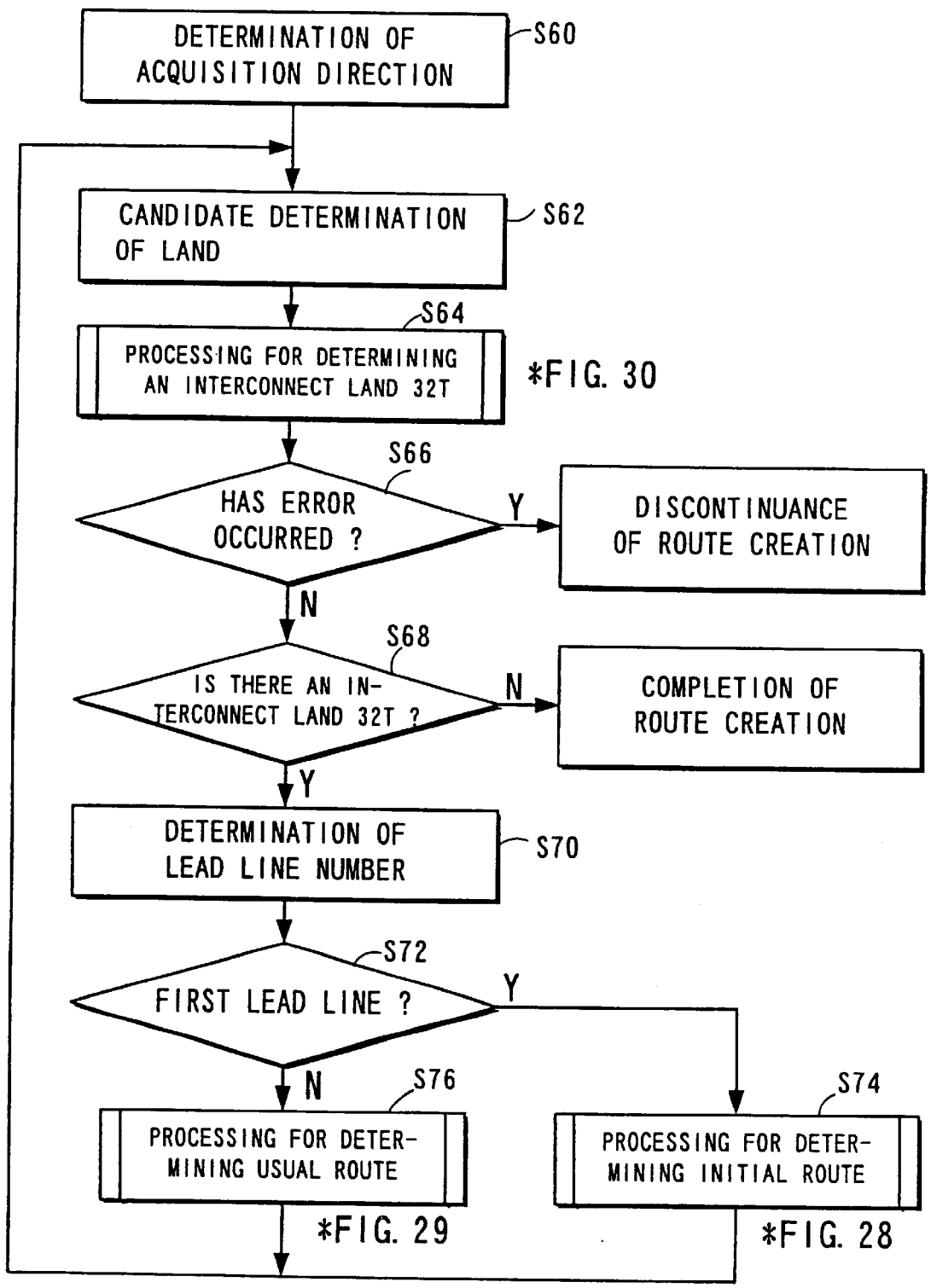
FIG. 27 is a flow chart showing a specific operation for the process of interconnect route determination.

FIG. 27 shows a flow chart for the process of interconnect route determination for the first and second leads 40 and 42 executed in the above-described steps S24 to S32.

First, in step S60, a decision is made as to whether the acquisition direction of the interconnect route in the divided area 200 shown in FIG. 7 is in the left direction from the centerline 204 or in the right direction.

Then, in step S62, candidates for the interconnect target lands 32T existing in the determined acquisition direction are listed.

Next, in step S64, the next interconnect target land 32T is determined from among the land group listed as the candidates. Details of this processing will be explained below in reference to FIG. 30.

Then, in step S66, when it is judged that an error has occurred in the processing for the previous step S64, the process of interconnect route determination is discontinued at this step based on a judgment that determination of the interconnect route after this step is impossible.

When it is judged that an error has not occurred in step S66, in step S68, a judgement is then made as to whether an interconnect target land 32T is present or not. When it is judged that there is no interconnect land present, this indicates that the interconnect routes for all lands in the area have been determined, so that the determination of the interconnect route is completed at this time.

When it is judged in step S68 that an interconnect target land 32T is present, then, in a next step S70, the lead line numbers of the first and second leads 40, 42 routed to the interconnect target land 32T are determined. These numbers are assigned to each lead 40, 42 as a serial number.

Then, in step S72, a judgement is made as to whether the assigned number is the first number or not, i.e., a judgement is made as to whether this is the lead 40 or 42 whose interconnect routes are first determined.

If it is judged that this is the first lead, then, in step S74, the determination process for the initial route is performed. The determination process for the initial route will be described below with reference to FIG. 28.

Further, if it is judged this is not the first lead in step S72, then a usual route determination process is performed in step S76. This route determination process will be described below with reference to FIG. 29.

In the present embodiment, a series of processing steps S60 to S76 is repeated to identify the interconnect target lands 32T each time the processing is performed, so that the process for determining the interconnect route of the first and second interconnect leads 40 and 42 to the land 32T, i.e., the route determination process is performed repeatedly.

(3-3-3) Algorithm for Determining an Initial Route

Figure 28:
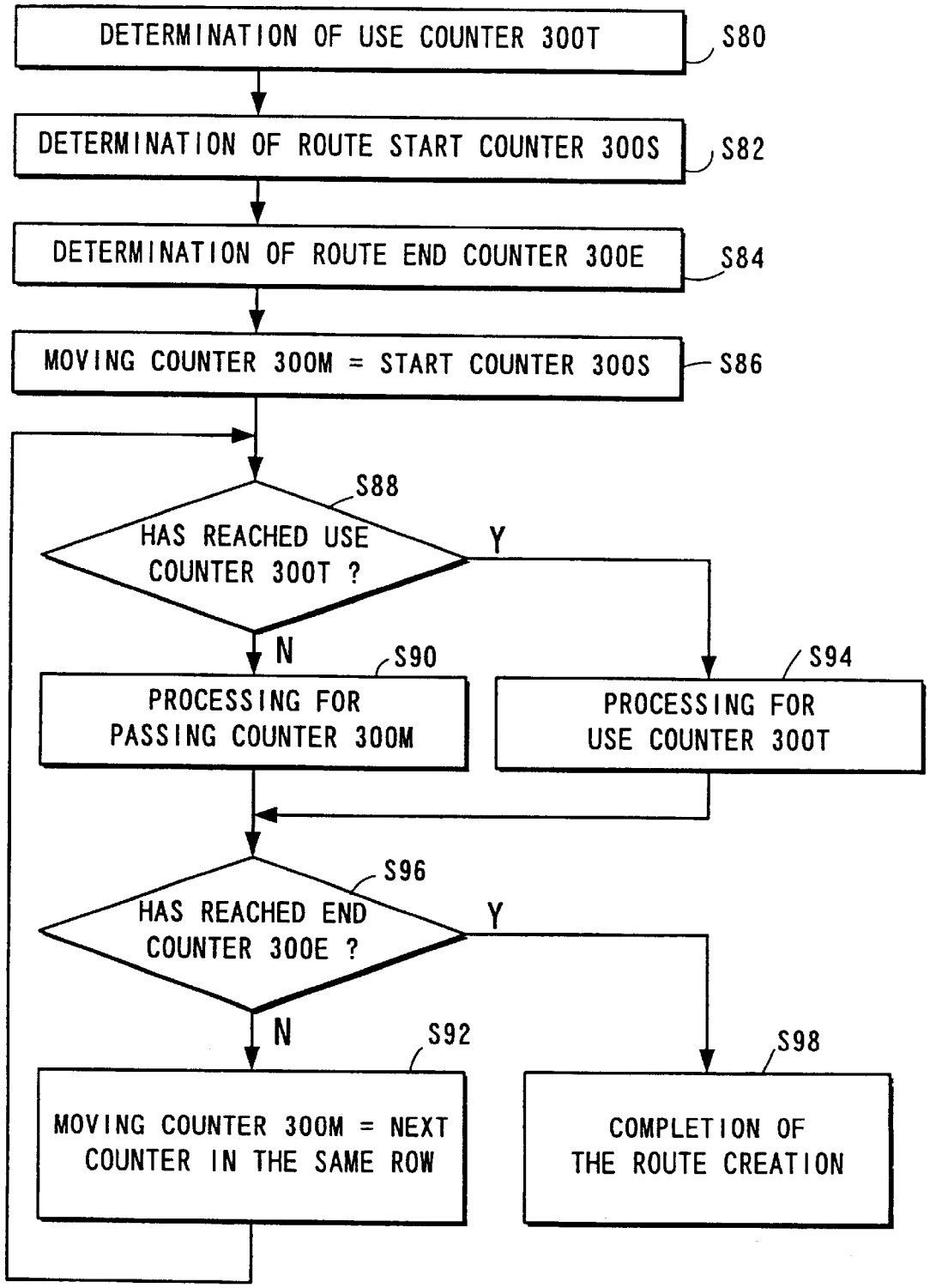
FIG. 28 is a flow chart showing detailed processings in step S74 of FIG. 27.

FIG. 28 shows a detailed algorithm for an initial route determination process of step S74, and FIGS. 33 to 38 show an exemplary embodiment for controlling the counters 300 in this route determination.

First, prior to the initial route determination process in step S74, the interconnect target land 32T is determined in step S64.

As shown in FIG. 33, when an initial route is created, i.e., when the initial route in the center common portion 210 is created, the land positioned on the plating lead 16 side (opposite to the inner lead 22) is set as the interconnect target land 32T of the first lead line.

In step S80 in FIG. 28, four counters 300-1 to 300-4 residing around the interconnect target land 32T are determined as the use counters 300T, and these four use counters 300T are opened and closed as shown in FIG. 14B.

Then, the use counter 300T positioned opposite to the acquisition direction of the lead with respect to the interconnect target land 32T, i.e., the first counter 300-1 positioned on the centerline 204 side, is determined as a counter 300ref for the route start and end counter determination. (see FIG. 33)

Figure 34:
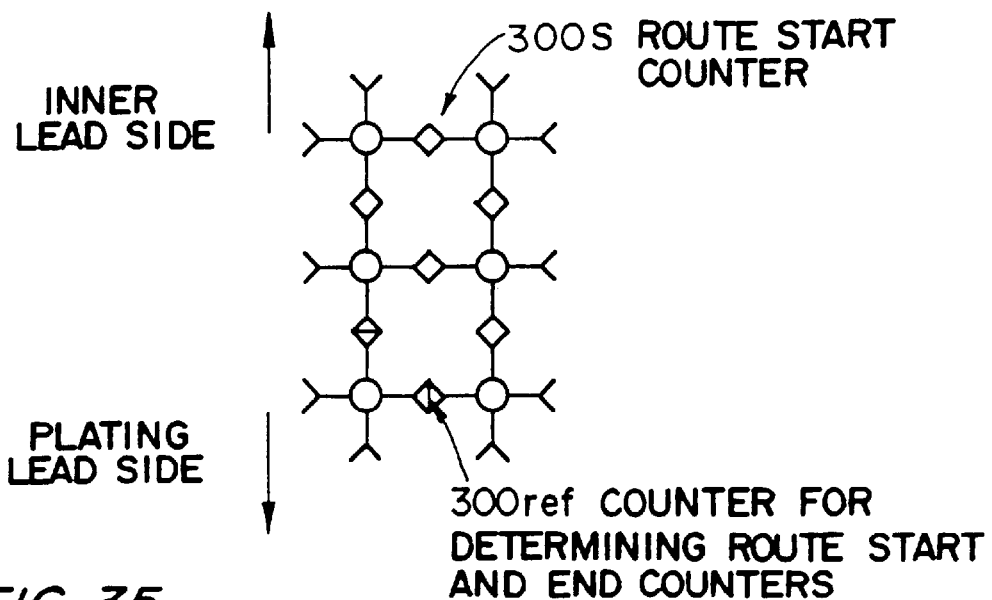
FIG. 34 is an illustration of a setting process for a route start counter at the initial route setting time.

Then, in step S82, a route start counter 300S is determined based on the use counter 300ref as shown in FIG. 34. Specifically, a counter which is closest to the inner lead 22 in a row in which the determination counter 300ref exists is determined as the route start counter 300S.

Figure 35:
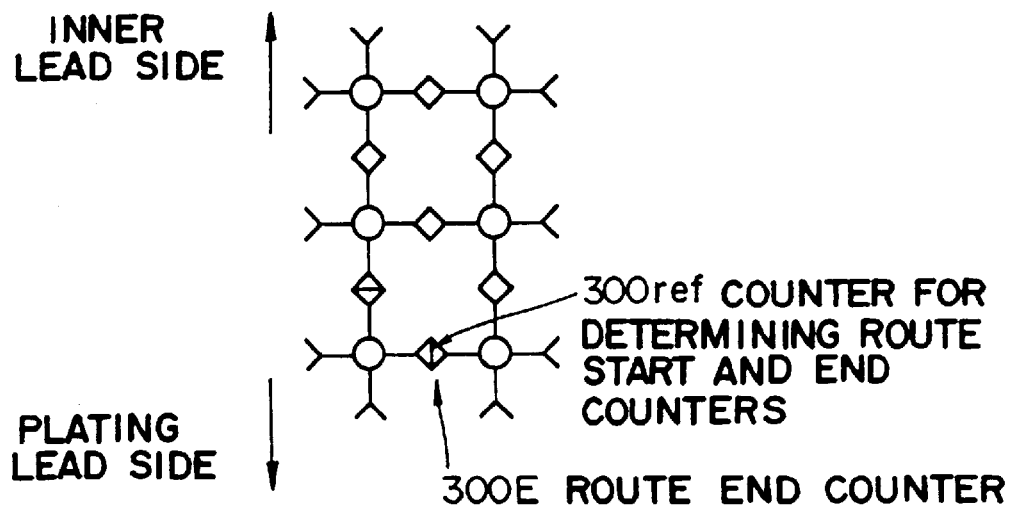
FIG. 35 is an illustration of a setting process for a route end counter at the initial route setting time.

Then, in step S84, a route end counter 300E is determined based on the determination counter 300ref as shown in FIG. 35. In this figure, the counter closest to the plating lead 16 in a row in which the determination counter 300ref exists is made the route end counter 300E. In this embodiment, the same counter 300 is set to be the determination counter 300ref and route end counter 300E.

Then, in step S86, a moving counter 300M for determining the interconnect route is set at the position of the start counter 300S.

Then, in step S88, a decision is made as to whether the moving counter 300M has moved to the use counter 300T or not. In this step, the moving counter 300M has not yet reached the use counter 300T, so that the processing for a passing counter is performed in step S90.

Figure 36:
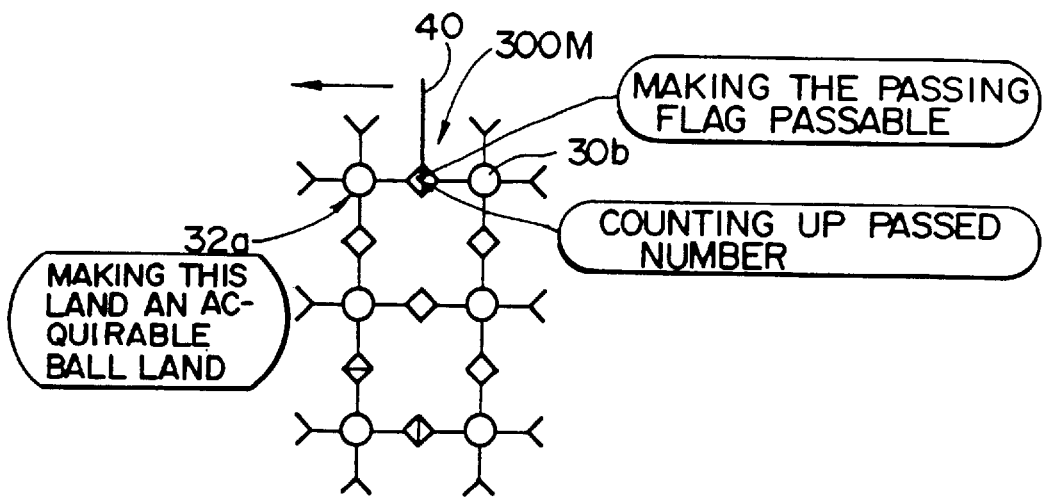
FIG. 36 is an illustration of an operation of a moving counter at the initial route setting time.
Figure 37:
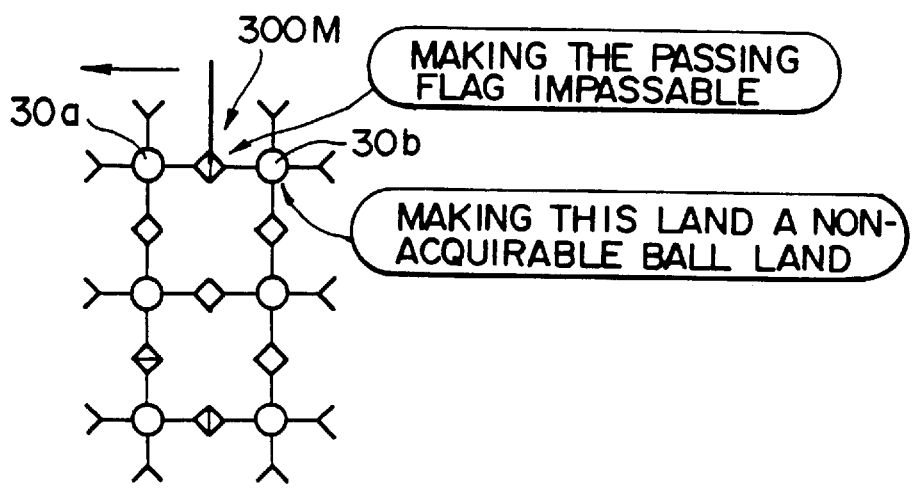
FIG. 37 is an illustration of an operation of a moving counter at the initial route setting time.

FIGS. 36 and 37 show an embodiment of this processing for a passing counter.

Specifically, in the present embodiment, a pair of passing flags fa, fb are virtually set toward an adjoining pair of lands 32 in each counter 300. Further, as shown in FIG. 36, when a predetermined open counter 300 is set as a moving counter 300M in order to set an interconnect route, a flag on the side of the adjoining land 32a positioned in the acquisition direction of a new interconnect route (in the reverse direction with respect to the centerline 204) is set in a passable state, and this land 32a is set as a new interconnect acquirable land. Then, a count value of the moving counter 300M is incremented.

At the same time, as shown in FIG. 37, a counter 32b positioned on the side of the centerline 204 of the moving counter 300M is caused to be a non-acquirable ball land. Specifically, a passing flag corresponding to this land 32b is set in the impassable state.

When the moving counter 300M has passed in this way, the land 32a positioned on the side of the surface common portion 220 in a pair of lands 32A and 32B positioned on both sides of the interconnect route newly set from the passage of this moving counter 300M is newly set as the passable ball land 32a, and the land 32b positioned on the side of the centerline 204 is set as the non-acquirable ball land.

This prevents the interconnect route of the next lead from intersecting the proximate interconnect route.

Then, in step S96, a judgement is made as to whether the moving counter 300M reaches the end counter 300E or not.

In this step, as it is judged that the moving counter 300M has not yet reached the end counter 300E, then in step S92, the moving counter 300M moves to a counter in the next column of the same row.

A series of such processings in steps S88 to S92 are repeated until the moving counter 300M reaches the use counter 300T, i.e., in this embodiment, reaches the determination counter 300ref.

In step S88, when it is judged that the moving counter 300M reaches the determination counter 300ref, the processing as the use counter is performed in step S94.

The processing as the use counter in step S94 controls the four counters 300-1, 300-2, 300-3, and 300-4 existing as the use counters 300T in the state shown in FIG. 14B around the interconnect target land 32T to be changed to the state shown in FIG. 14C, and also causes the interconnect leads 40 and 42 to pass through the interconnect target land 32T.

The present embodiment executes the interconnect processing so that the second interconnect lead 42 is pulled out directly from the side of the counter 300-4 of the interconnect target land 32 to connect to the plating lead 16, and the lead length of the second interconnect lead 42 is made as short as possible. For this purpose, in the present invention, the opening and closing of the use counters 300-1, 300-2, 300-3, and 300-4 is performed in the manner shown in FIGS. 38 to 41.

Figure 38:
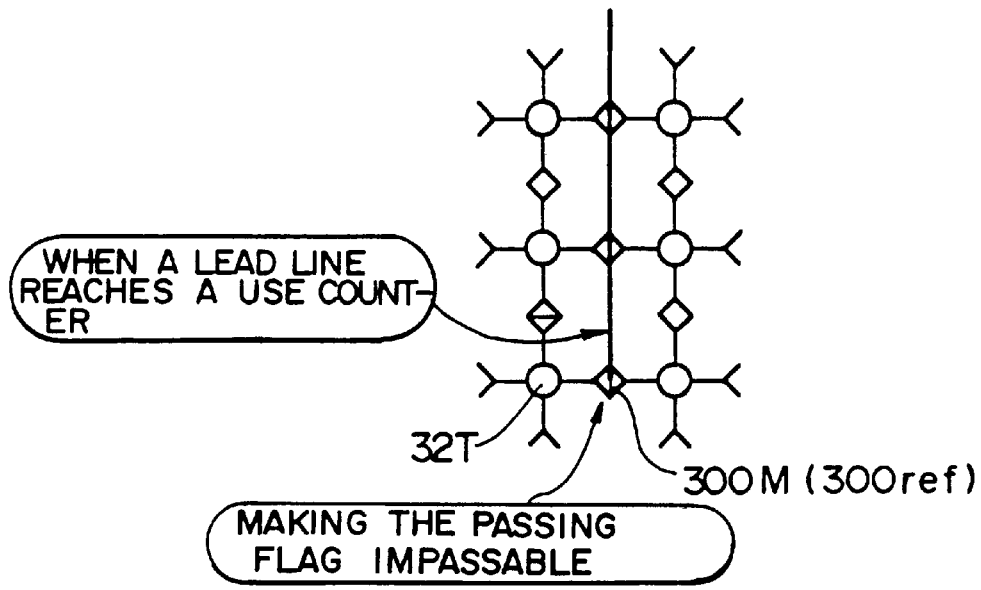
FIG. 38 is an illustration of a process at a time when the moving counter moves to the use counter at the initial route setting time.
Figure 39:
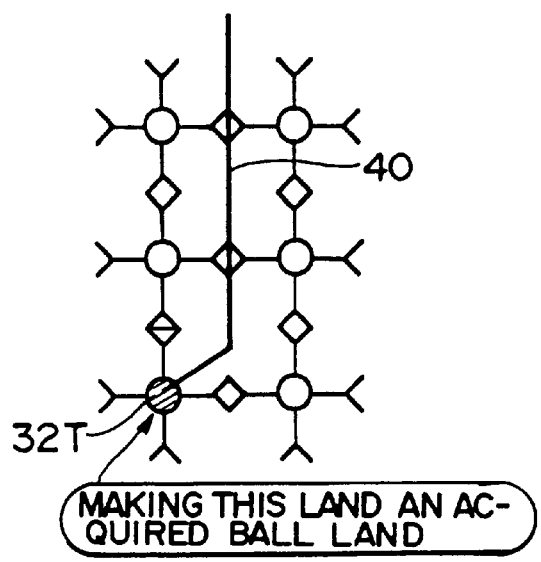
FIG. 39 is an illustration of a process at a time when the moving counter moves to the passing counter.

Specifically, as shown in FIG. 38, when the moving counter 300M reaches the determination counter 300ref, the flag, which is set to correspond to this moving counter 300M, of the interconnect target land 32T side is set to a state in which the interconnect is not allowed to pass through, and as shown in FIG. 39, the interconnect lead 40 is caused to pass through this land 32T. This land 32T is then set to the acquired ball land.

Figure 40:
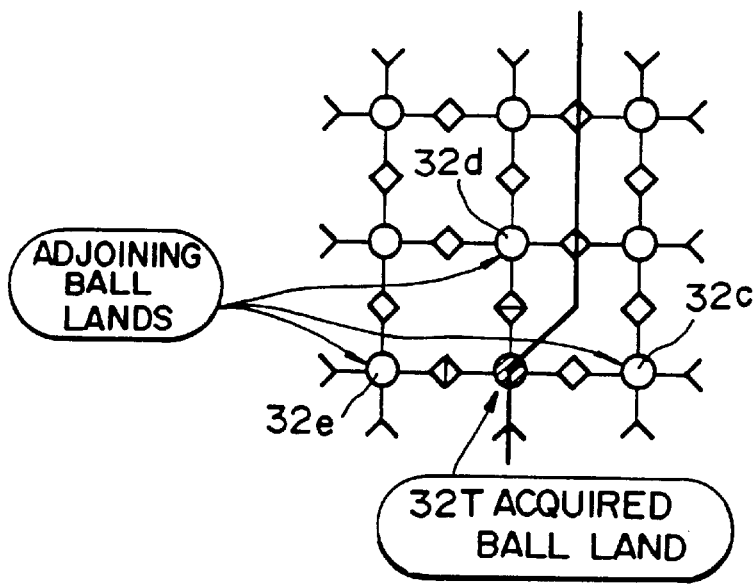
FIG. 40 is an illustration of a control operation for counters at the initial route setting time.
Figure 41:
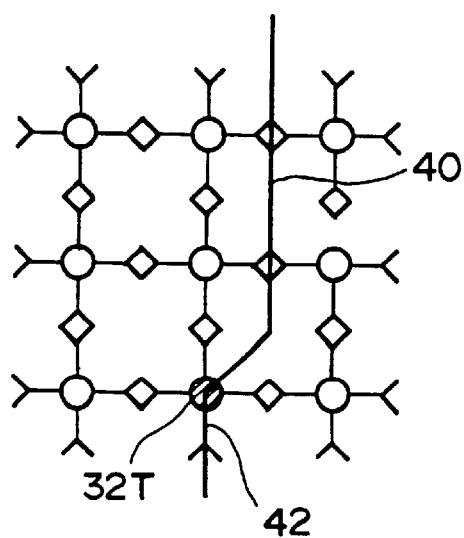
FIG. 41 is an illustration of a control operation for counters at the initial route setting time.

Then, as shown in FIG. 40, the processings are performed on the lands 32c, 32d, and 32e adjacent to and positioned around this interconnect target land 32T.

If these adjoining lands 32c, 32d, and 32e are the acquired ball lands whose interconnect routes have been already determined, common counters between these adjoining lands and the interconnect target land 32T are closed.

If these adjoining lands 32c, 32d, and 32e are lands which can be interconnected, i.e., acquirable lands, the passing flags assigned to the common counters between these lands and the interconnect target land are set in the passable state.

Further, if the common counters between the adjoining lands 32c, 32d, and 32e and the interconnect target land are opened and these adjoining lands are also non-acquirable ball lands, the flags are changed so that these adjoining lands are made acquirable lands, and the common counters are opened.

The passing flag in the land 32T side is opened to a counter positioned in the direction in which a ball land does not exist (in the present embodiment, the fourth counter 300-4). These processings enable determination of the interconnect route in which the second interconnect lead 42 is pulled out directly from the interconnect target land 32T in the direction of the fourth counter 300-4 to connect to the plating lead 16.

When a series of such processings for use counters is completed, then, in step S96, the processings of steps S88 to S92 are repeated until the moving counter 300M is judged to have reached the end counter 300E.

When the moving counter 300M does not reach the end counter 300E, the processing moves to step S92, and at the time when it is judged to have reached the end counter 300E, the setting process for the initial route is completed (step S98).

(3-3-4) Algorithm for Determining an Initial Route

FIG. 29 shows a detailed flow chart for performing a usual route determination process explained in step S76 in FIG. 27.

In step S64, the subsequent interconnect target land 32T has been determined prior to performing the step S76.

In the route determination process shown in FIG. 29, counters 300-1, 300-2, 300-3, and 300-4 existing around the interconnect target land 32T are first determined to be the use counters 300T in step S100.

Figure 42:
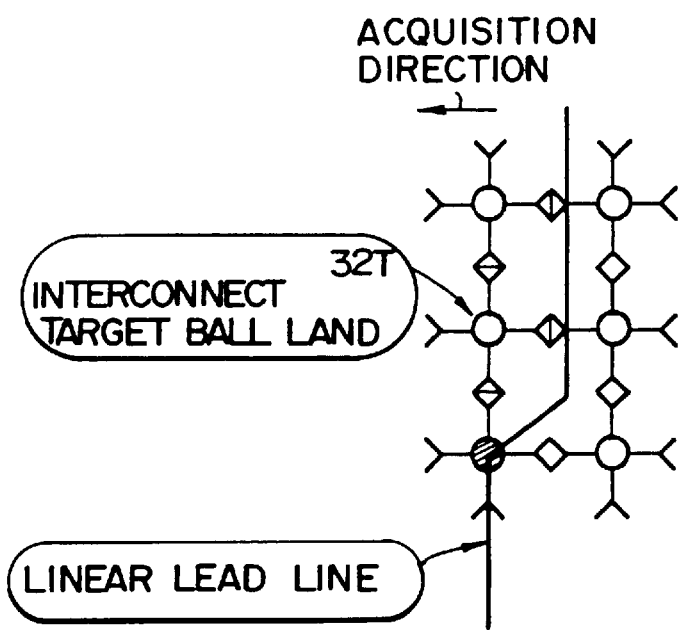
FIG. 42 is an illustration of a counter control operation for an interconnect target ball land at the usual route setting time.

In this step, as the interconnect target land 32T is set as shown in FIG. 42, four counters positioned around this land 32T are set as the use counters 300T.

Then, a route start counter 300S is determined in step S102, and a route end counter 300E is determined in next step S104.

Figure 43:
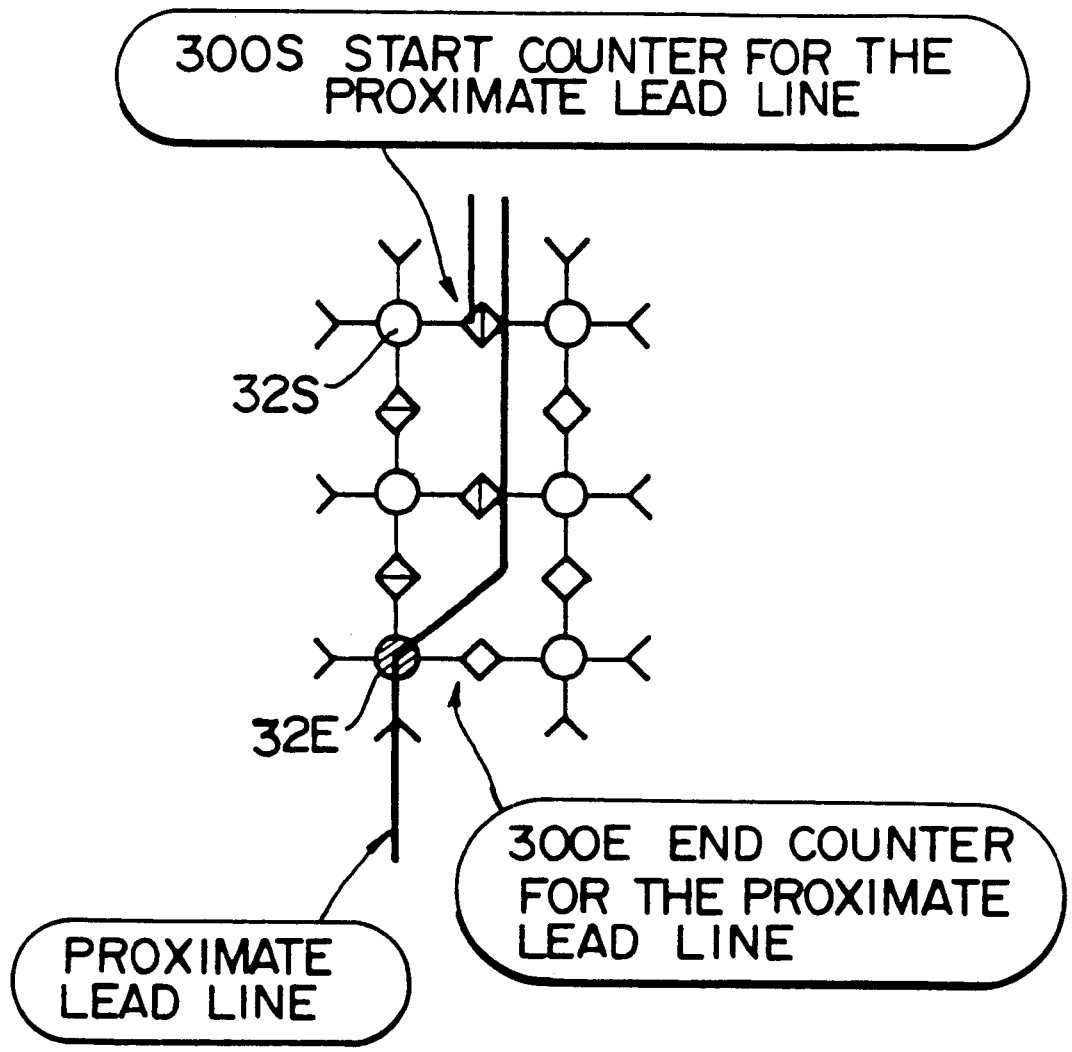
FIG. 43 is an illustration of a process for setting the start and end counters at the usual route setting time.
Figure 44:
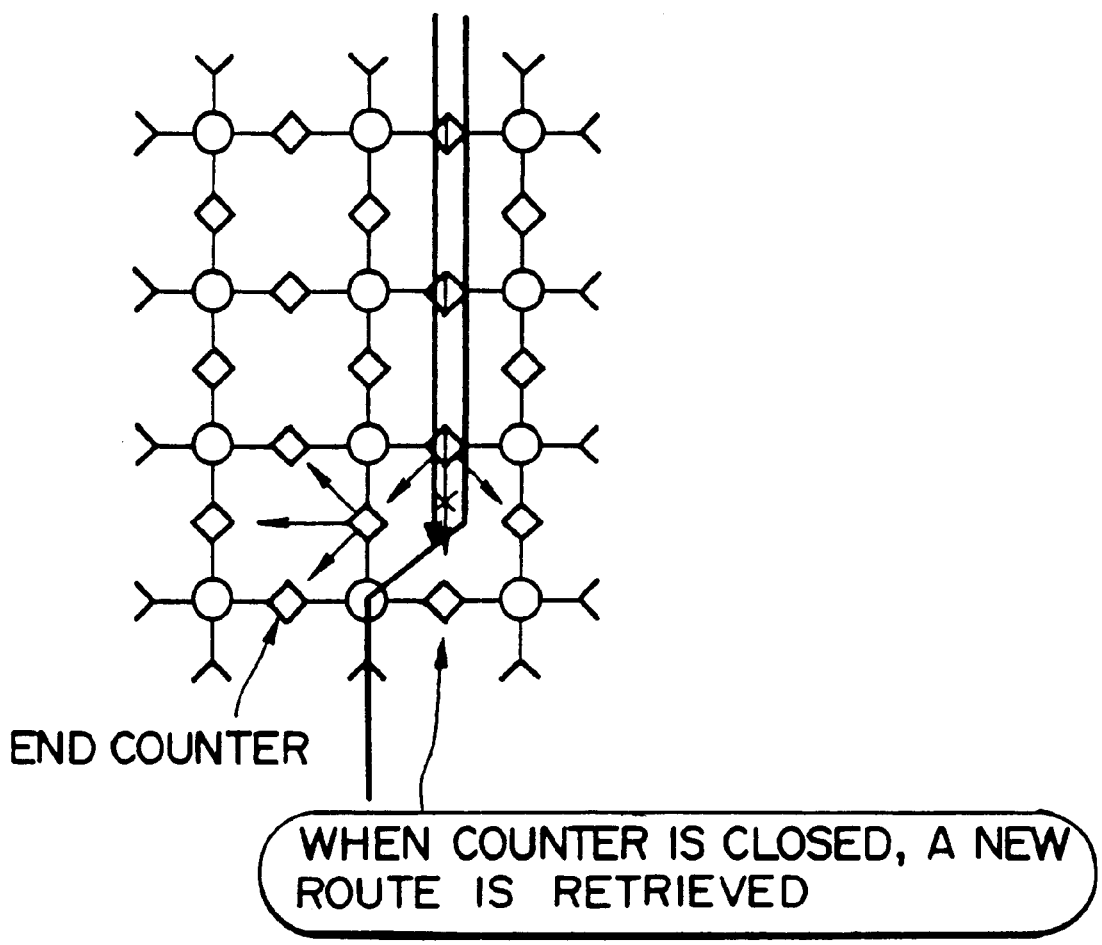
FIG. 44 is an illustration of a process for moving the moving counter at the usual route setting time.

FIG. 43 shows an embodiment of the process for setting the route start counter 300S and the route end counter 300E.

The determination of the route start counter 300S in step S102 is performed according to the following rule.

The basic rule is such that a start counter 300S in the same route as the proximate interconnect route is used as a route start counter in the current interconnect.

When the proximate route start counter is closed, a first exception rule is applied to this proximate route start counter, wherein a counter positioned on the surface common portion 220 side with respect to the ball land 32S is opened to set this counter as a new route start counter.

Further, when the new route start counter set according to this first exception rule is already set as the use counter, a second exception rule, in which a counter positioned on the inner lead side with respect to a land 32S is set as the route start counter 300S, is applied. This is the processing when the land 32S positioned to face the inner lead side is set as the interconnect target land 32T.

In addition, the determination of the route end counter 300E in step S104 is performed according to the following rule.

The basic rule is such that a route end counter 300E used in determination of the route of the proximate interconnect lead is used as a new route end counter.

When the route end counter 300E used proximately is closed, a first exception rule is applied to this counter, in which a counter positioned on the surface common portion 220 side with respect to the land 32E is selected as a new route end counter and opened.

When this new counter has already been set as the use counter, a second exception rule is applied, wherein a counter positioned on the plating lead side with respect to the land 32E is acquired and set as a new route end counter 300E. When this counter is also set as the use counter and is closed, the processing is interrupted.

When the route start counter 300S and route end counter 300E are determined in this way, then, in step S106, the moving counter 300M is set to the route start counter 300S and the route determination operations in steps S108 to S134 are started.

First, in step S108, a judgement is made as to whether the moving counter 300M has moved to the position of the use counter 300T or not.

As the moving counter 300M has not yet moved to the use counter 300T immediately after the processing for step S106, the processing for a passing counter of step S110 is performed.

The processing for a passing counter of this step S110 is the same as that described in step S90 in FIG. 28, therefore further explanation is omitted in this figure.

Then, in step S112, a judgement is made as to whether the moving counter 300M has moved to the end counter 300E.

Then, in step S114, a judgement is made as to whether the moving counter 300M is the same as the counter used to determine the interconnect route of the proximate lead line or not.

If the counter is judged to be same, a judgement is made in the step S116 as to whether a counter which exists in the same row as the moving counter 300M and is adjacent to the plating lead side is opened or not.

When this counter is judged to be opened, the processing to move the moving counter 300M to the next counter adjacent to the plating lead side is performed in step S118.

The processings in steps S114 to S118 are repeated until a closed counter occurs in the same interconnect route as the proximate lead line.

When the counter which was used to set the proximate route and has been closed appears, an open counter which is used as a moving target of the moving counter 300M is retrieved in step S120, and the moving counter 300M moves toward the retrieved counter in steps S122 and S126.

Specifically, in step S114, when the moving counter is judged to be different from the counter used to determine the interconnect route of the proximate lead line, or, in step S116, the counter adjacent to the plating lead side with respect to the moving counter 300M is judged not to be opened, then, in step S120, an open counter is retrieved.

When the retrieval of step S120 is judged to have failed in step S122, the route creation is interrupted at that time (step S124).

When the retrieval is judged to have been successful in step S122, the moving counter 300M moves to the retrieved new counter in step S126.

The moving counter 300M moves in this manner to determine the new interconnect routes of the interconnect leads 40 and 42 in sequence.

When the moving counter 300M is judged to have been moved to the use counter 300T in step S108, then, in step S130, the use counter is processed. As the processing for a use counter is similar to that fully described in step S94 in FIG. 28, further explanation is omitted here.

Then, the processing for modifying the use counter is performed in step S132. This processing is also similar to that in step S94 described above, so that further explanation is omitted here.

When the processings in steps S130, S132 are completed in this manner, the processings in steps S108 to S126 are repeated until the moving counter 300M moves to the end counter 300E to determine the interconnect route of the second interconnect lead 42 from the interconnect target land 32T to the plating lead 16.

In step S112, when the moving counter 300M is judged to have reached the end counter 300E, the processing for step S134 is performed to complete the route preparation process.

(3-3-5) Determination Process for the Interconnect Target Land 332T

Next, the determination process for the interconnect target land 32T in step S64 in FIG. 27 will be explained.

Figure 30:
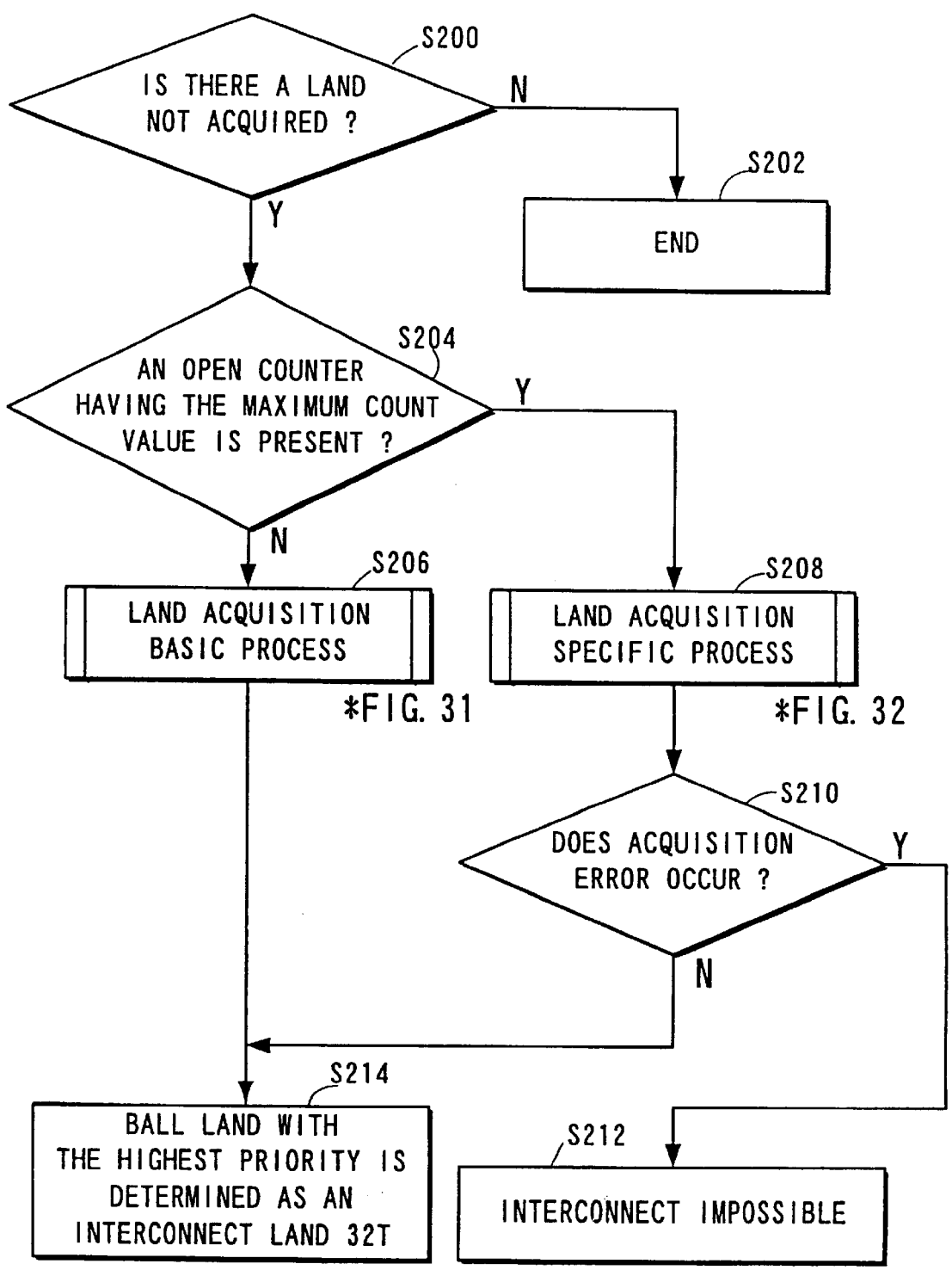
FIG. 30 is a flow chart showing detailed processings in step S64 of FIG. 27.

FIG. 30 shows a flow chart of the determination process for the interconnect target land 32T.

First, in step S200, a judgement is made as to whether there is any land to which an interconnect route has not yet been determined, i.e., which has not been acquired.

Then, in step S204, a judgement is made as to whether or not there is an open counter in which the count value has reached the maximum.

Figure 31:
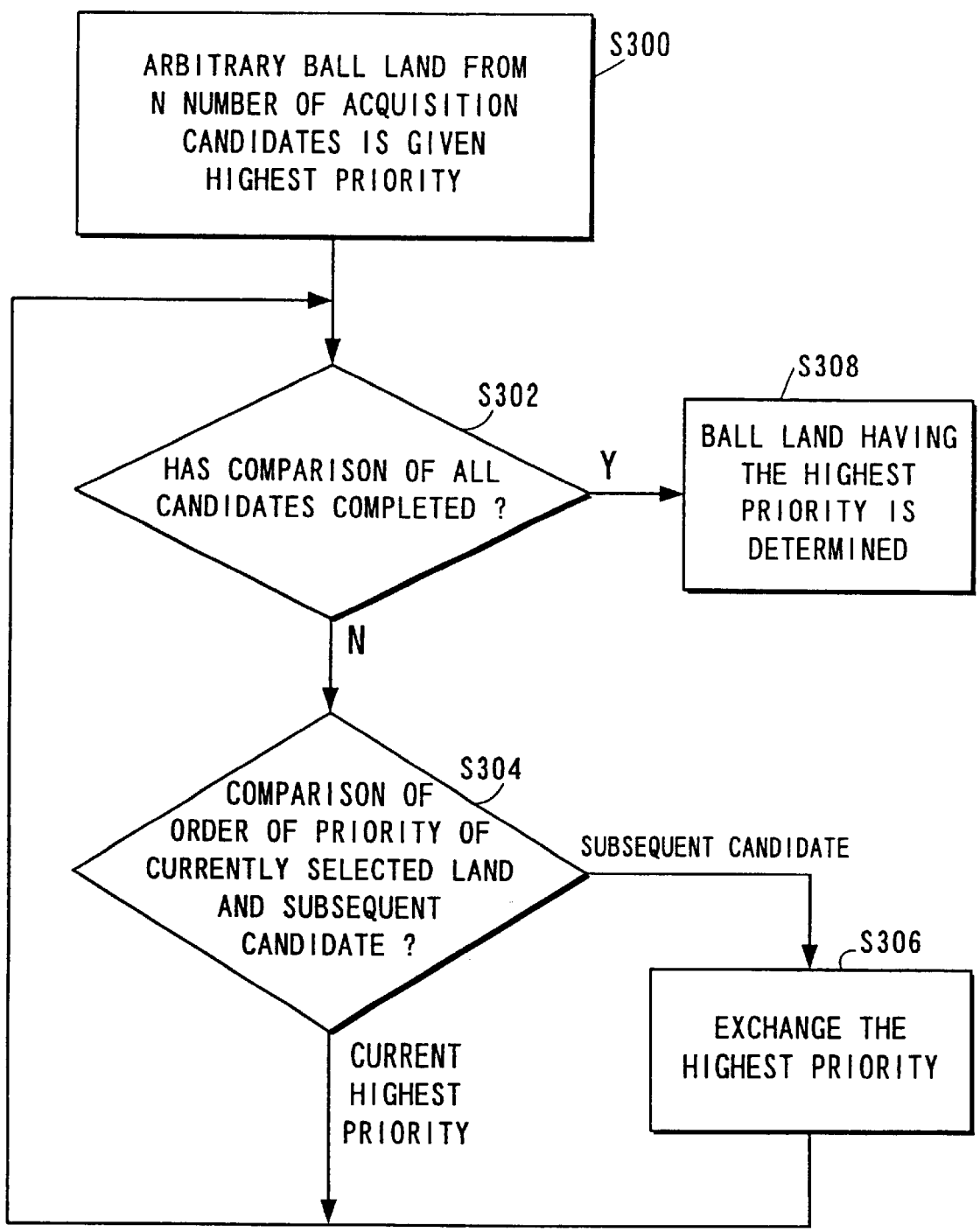
FIG. 31 is a flow chart showing detailed processings in step S206 of FIG. 30.

When it is judged that the count value has not reached the maximum in step S204, then, the land acquisition basic processing for step S206 is performed. The details of this processing is shown in FIG. 31.

Further, when it is judged that a counter has reached the maximum value in step S204, then, the land acquisition specific processing is performed in step S208. The details of this processing is shown in FIG. 32.

Then, in step S210, a judgement is made as to whether an error has occurred in the land acquisition processing in step S208 or not. When it is judged that an error has occurred, then in step S212, the determination process for the interconnect target land 32T is completed.

When it is judged that an error has not occurred in step S210 or when the processing for step S206 is completed, then, in step S214, the processing in which the acquired ball land with the highest priority is determined to be the interconnect target land 32T is performed.

In step S200, when it is judged that an unacquired land does not-exist, the determination process for the interconnect target land 32T is completed. (Step S202)

Next, details of the land acquisition basic processing in step S206 and the land acquisition specific processing in step S208 will be explained.

Figure 45:
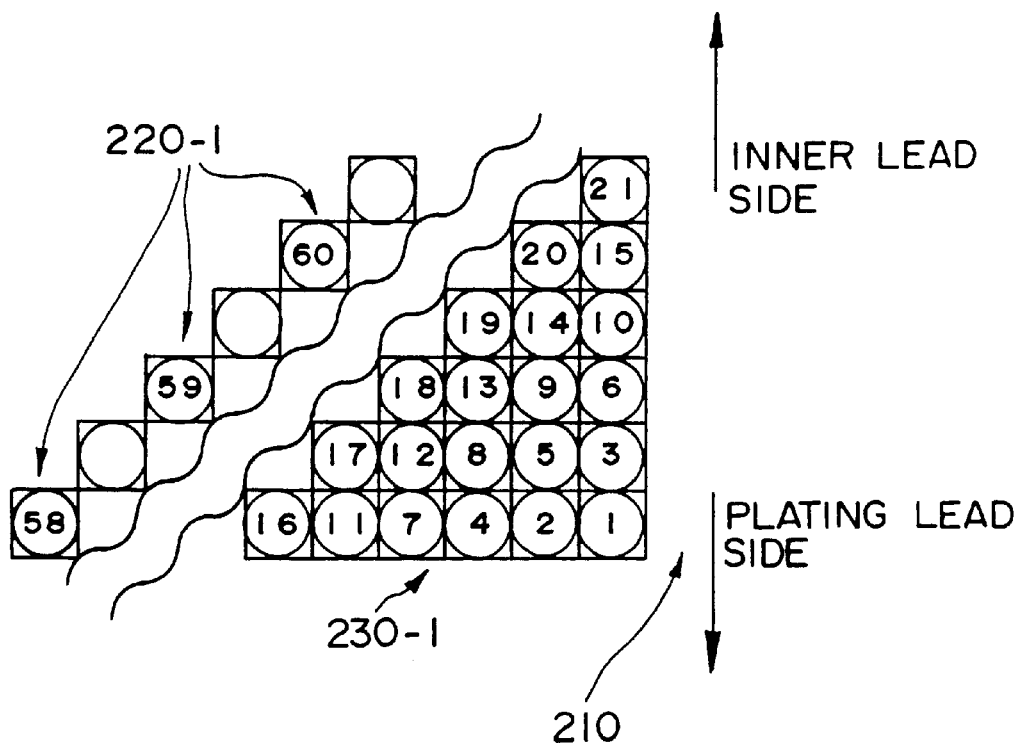
FIG. 45 is an illustration of the order of priority set for one process surface and surface common portion.
Figure 46:
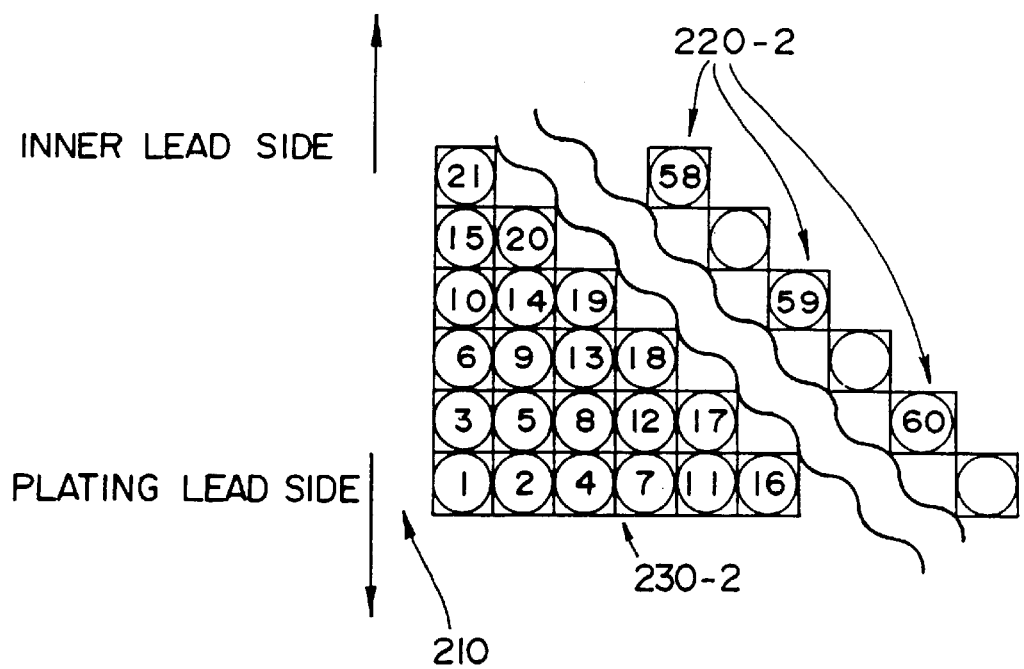
FIG. 46 is an illustration of the order of priority set for the other process surface and surface common portion.

FIGS. 45 and 46 show the details of assignment of the order of priority for each land 32 described in FIG. 12. In FIG. 12, it is assumed that there are four lands 32 between the inner leads and the plating lead. However, in FIGS. 45 and 46, an example in which there are six lands between the inner leads and the plating lead will be explained.

FIG. 45 shows an example of the order of priority assigned to one process surface 230-1 and the surface common portion 220-1. FIG. 46 shows an example of the order of priority assigned to the other process surface 230-2 and the surface common portion 220-2.

FIG. 47 shows an embodiment of the process for determining the interconnect target land 32T according to the order of priority assigned to each land in this way and the existing positions of the open counters.

First, the land acquisition processing in step S206 will be described. FIG. 31 shows a detailed flow chart of this process.

This land acquisition basic processing S206 assumes that an open counter whose count value has reached the maximum is judged not to have been present in step S204. For this case, for example, the condition shown in FIG. 47A is assumed.

Under this condition, instep S300, an arbitrary ball land is selected as a highest priority land from among N acquirable lands.

Then, in steps S304 and S306, the order of priority between the currently selected land and the next candidate land is compared, and when a land with a higher order of priority exists, the selected land is replaced by the land with the higher order of priority. Such processing is performed for all candidates.

When such a comparison processing in steps S304 and S306 is judged to have been completed for all candidates in step S302, the land 32 selected at this time is determined as the ball land with the highest priority (step S308).

For example, in the case of the embodiment shown in FIG. 47A, when the interconnect processing to the land with the second order of priority has been completed in step S300, the lands with the order of priority of 4, 5, 3, 6, 10, 15, and 21 are selected as the acquisition target lands for the next interconnect target land candidates. Among these candidates, an arbitrary number of lands are selected in step S300.

Then, the order of priority of the selected lands and the other lands is compared, and finally, the land with the highest order of priority, in this case the land with the priority of "3", is determined to be the ball land with the highest priority.

Next, the specific land acquisition processing for step S208 will be described. FIG. 32 shows a detailed flow chart of this process. This processing for step S208 is based on a premise that an open counter having the maximum count value is judged to be present in step S204.

FIGS. 47B and 47C show an embodiment of this specific land acquisition process.

In either case, it is supposed that the interconnect routes of the two lands with the priority of 1 and 2 have already been determined.

Therefore, in this case, the land with the second highest priority is the land with the order of priority of 3.

Under this condition, the lands with the possibility of being candidates for the next interconnect target lands 32T are the lands with the priorities 4, 5, 3, 6, 10, 15, and 21.

In the specific land acquisition processing shown in FIG. 32, a judgement is first made in step S400 as to whether a plurality of lands with counters having the maximum count number exist in the acquisition target lands or not.

Here, for example, as shown in FIG. 47B, when it has been judged that there is only one land having a maximum counter (in this case, the land with the order of priority of 15), this land (specifically, the land with the order of priority of 15) is determined to be the ball land with the highest priority (step S402).

When it is judged that a plurality of corresponding lands exist in step S400, then the land number counters for a land having the maximum value are set to zero in step S404, and then in step S406, it is judged whether the extraction of lands has been completed or not.

Then, in step S408, a plurality of lands having counters reached the maximum count value are extracted.

A judgement is then made as to whether the extracted lands belong to the center common portion 210 or not.

When those lands are judged to belong to the center common portion 210, then in step S142, a judgement is made as to whether the maximized counters belonging to the extracted lands reached the maximum passable number or not. When the counts are judged to reach the maximum, those lands are registered as the lands with the highest priority in step S414.

When the counters are judged not to reach the maximum passable number in step S412, then, the values of the maximized land number counters are judged in step S420. When the count values are judged to be zero, then in step S422, a judgement is made as to whether a land with the highest priority has already been registered or not. When judged not to be zero, the extracted land is registered as the land with the highest priority.

When it is judged that a land with the highest priority has already been registered in step S422, then, the extracted land and the land with the highest priority already registered are compared in step S426, and the land closer to the inner leads is registered as the land with the highest priority.

Also, in step S410, when the extracted lands are judged to not belong to the center common portion, then, these lands are registered as the lands with the highest priority in step S414.

When the registration processing for step S414 has been completed, then in step S416, the maximized land number counter counts up, and in step S418 a judgement is made as to whether the value of the maximized land number counter has exceeded two or not. When the value is judged to have exceeded two, the processing is judged to be a land acquisition error (step S430).

When it is judged that the count value does not exceed two in step S418, then the processing returns to step S406.

A series of such processings are repeated, and when the land extraction is judged to be completed in step S406, the registered land with the highest priority is determined to be the ball land with the highest priority in step S402.

For example, as shown in FIG. 47C, when it is judged that three lands have reaches the maximum value with orders of priority of 10, 15, and 21, the land with the priority of 21 closest to the inner leads is determined to be the ball land with the highest priority.

The present invention is not limited to the embodiment described above, and many modifications and variations are possible without departing from the spirit and scope of the present invention.

For example, in the embodiment described above, the present invention has been explained using the example of deciding the interconnect routes of the tape circuit board 11. However, the present invention can be applied to cases for determining the interconnect routes in various circuit boards other than the tape circuit board.

In addition, in the embodiment described above, although an example has been explained in which the process for determining the interconnect routes from the side of the center common portion of the divided area is started, the present invention is not limited to this example, and the determination process for the interconnect routes may be started from any predetermined position.

(4) Process of Interconnect Route Determination for Fan-in Type Semiconductor Devices Next, details of the process of interconnect route determination for fan-in type semiconductor devices will be described. Because the same symbols as those given to the parts and processings in the above fan-out type semiconductor device are given to the corresponding parts and processings fan-in type semiconductor device, explanations for such corresponding members are omitted.

(4-1) Division of the Interconnect Area

Figure 54:
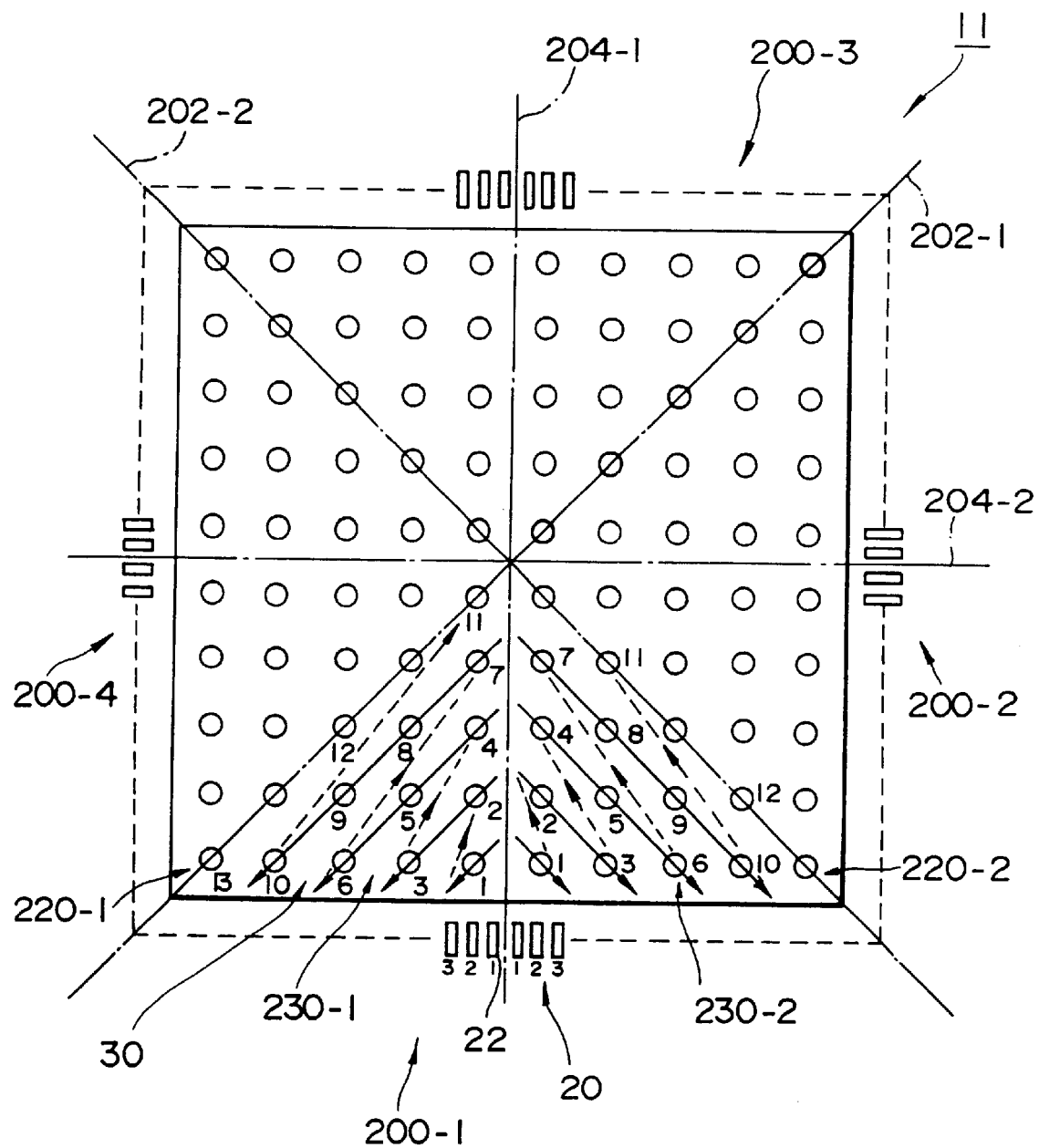
FIG. 54 is an illustration of divided areas of land group in the fan-in type device.

FIG. 54 schematically shows a rectangular inner land group 30 in which a plurality of lands 32 are arranged in a matrix inside an inner lead group 20 which is a rectangularly arranged virtual airing target row.

(4-1-1) Division Into Four Sub-divided Areas

In this embodiment, the rectangular land group 30 is virtually divided into four areas to determine the interconnect routes for interconnect leads 40. Here, the rectangular land group 30 is virtually divided along a pair of diagonals 202-1 and 202-2 into four divided areas 200-1, 200-2, 200-3, and 200-4, each having a shape of an isosceles triangle.

Further, a pair of centerlines 204-1, 204-1 perpendicular in the horizontal and vertical directions to the rectangular land group 30 are assumed.

In each divided area, land columns for one column corresponding to both sides of the triangle are made common areas with adjoining divided areas, i.e., surface common portions 220-1 and 220-2.

(4-1-2) Sub-division of the Divided Areas

In this embodiment, the divided area 200 is sub-divided into processing areas 230-1 and 230-2 which are located on both sides of the centerline 204. As mentioned later, the interconnect route determination for the divided area 200 is first performed for the area on the left side of the centerline 204, then for the area on the right side of the centerline 204. This enables the interconnect of the interconnect lead 40 in the divided area 200 to be substantially symmetrical in respect of the centerline 204.

In this manner, according to the present embodiment, the interconnect routes for the substantially triangle divided area 200 are determined. At this time, when the land matrices of the four divided areas 200-1, 200-2, 200-3, and 200-4 are the same as shown the figure, if interconnect routes for one divided area are determined, the interconnect routes of this divided area 200 can be adopted directly as interconnect routes for the other divided areas.

Specifically, as shown in FIG. 54, if the interconnect routes for the divided area 200-1 are determined, these interconnect routes can be applied to the interconnect routes for the other divided areas 200-2, 200-3, and 200-4. This allows the calculation load for determining the interconnect routes to be significantly reduced.

Furthermore, when only the opposing divided areas of the land group 30 are formed as the divided areas of the same land matrix arrangement, the interconnect routes of the divided areas 200-1 and 200-2 are determined first, and then these interconnect routes are adopted as the interconnect routes for the other opposing divided areas 200-3 and 200-4.

(4-2) Determination of Interconnect Routes in the Divided Areas

Next, details for determining the interconnect routes for the first lead 40 in each divided area 200 will be described.

In each divided area 200, the direction of the centerline 204 is defined as the row direction and right angles to this is defined as the column direction.

(4-2-1) Lead Number

In the inner lead group 20 located outside each of the divided areas 200, lead numbers 1, 2, 3, 4, . . . are assigned in turn to each inner lead 22 from the inner leads positioned on both sides of the centerline 204 in both directions. In addition, the inner lead 22 is selected as an interconnect target lead in sequence from the lowest assigned number.

(4-2-2) Order of Priority of Lands

FIG. 54 shows an example of the order of priority assigned previously to each land arranged in a matrix.

Here, the order of priority assigned to the land group on the left area of the centerline 204 is explained as an example.

In determining the order of priority of each land included in each area, a plurality of diagonal lines which connect lands adjoining in the diagonal direction along the diagonal 202 is assumed as a priority order setting line. The order of priority of lands included in a priority setting line more distant from the diagonal 202 is set higher, and, among the lands positioned on the same priority setting line, those positioned more distant from the lead group 20 are given higher order of priority. 1, 2, 3 . . . 13 in FIG. 54 are the priority orders determined in this manner.

When there is no other restriction, the lands 32 included in the process surface 230 are selected as the interconnect target lands in the sequence shown by the arrows.

Specifically, by assigning the order of priority in this manner, each inner lead 22 is selected as an interconnect target lead in sequence from the leads on the side of centerline 204. Further, each land is selected as an interconnect target land in accordance with the order of priority previously assigned. Therefore, when there is no other restriction, the interconnect routes of each lead 40 are determined so that the inner leads 22 corresponding to the lead numbers and the lands 32 in Accordance with the order of priority are connected in sequence.

(4-2-3) Process of Interconnect Route Determination Using Virtual Counters

In the same manner as in the previous embodiment, the number of leads 40 which can pass through the lands 32 in this embodiment is restricted to a prescribed number. In this embodiment, the prescribed number of interconnects which can pass through the lands adjacent to the centerline 204 is different from the number of interconnects which can pass through the other lands.

The interconnect circuit determination section 124 of the present embodiment functions as a virtual counter setting controller 126 and a interconnect land determination section 128.

As will be described in more detail later, the virtual counter setting controller 126 virtually sets counters 300 between each of the lands 32. The counters 300 count the number of leads 40 passing through the areas between the adjoining lands. The counter 300 is controlled in accordance with the later-described counter control rules CB0–C4.

The interconnect land determination section 128 determines a land 32 which becomes an interconnect target-in accordance with the order of priority for each land 32 described above and data for the virtual counters 300.

Moreover, the interconnect circuit determination section 124 determines the interconnect routes of the interconnect leads 40 connecting the determined interconnect target land 32 and leads 22 according to the data of the counters 300, the later-described lead drawing direction determination rules O1 to O4, and the lead progress direction determination rules L1 to L8.

The details will be described below.

In the same manner as in the previous embodiment, the total of four virtual counters are virtually disposed in the row and column directions around each of the lands 32 arranged in a matrix. As shown in FIG. 13, the first to fourth counters 300-1, 300-2, 300-3, and 300-4 are virtually disposed between adjoining lands on the circumference of the lands 32.

The algorithm for interconnect route determination according to the present embodiment is constituted so that setting of interconnect routes of new leads 40 to areas between each land 32 is permitted only when the counters 300 disposed between the lands are controlled to be in the open condition.

Accordingly, the interconnect routes of the interconnect leads 40 can be determined automatically by controlling opening and closing conditions of the virtually disposed counters 300.

When each counter 300 is in the open counter state, the counter 300 counts the number of leads 40 determined to pass through the area between the lands 32 and 32 in which the open counter 300 resides. Each counter 300 does not perform such count operation when it is in a closed counter state.

Detailed rules of the process of interconnect route determination will now be described.

A: Priority Order

If there is no other restriction, the interconnect target land 32 is sequentially determined according to the above priority order.

B: Rule for the Determination of Lead Drawing Directions

Figure 56:
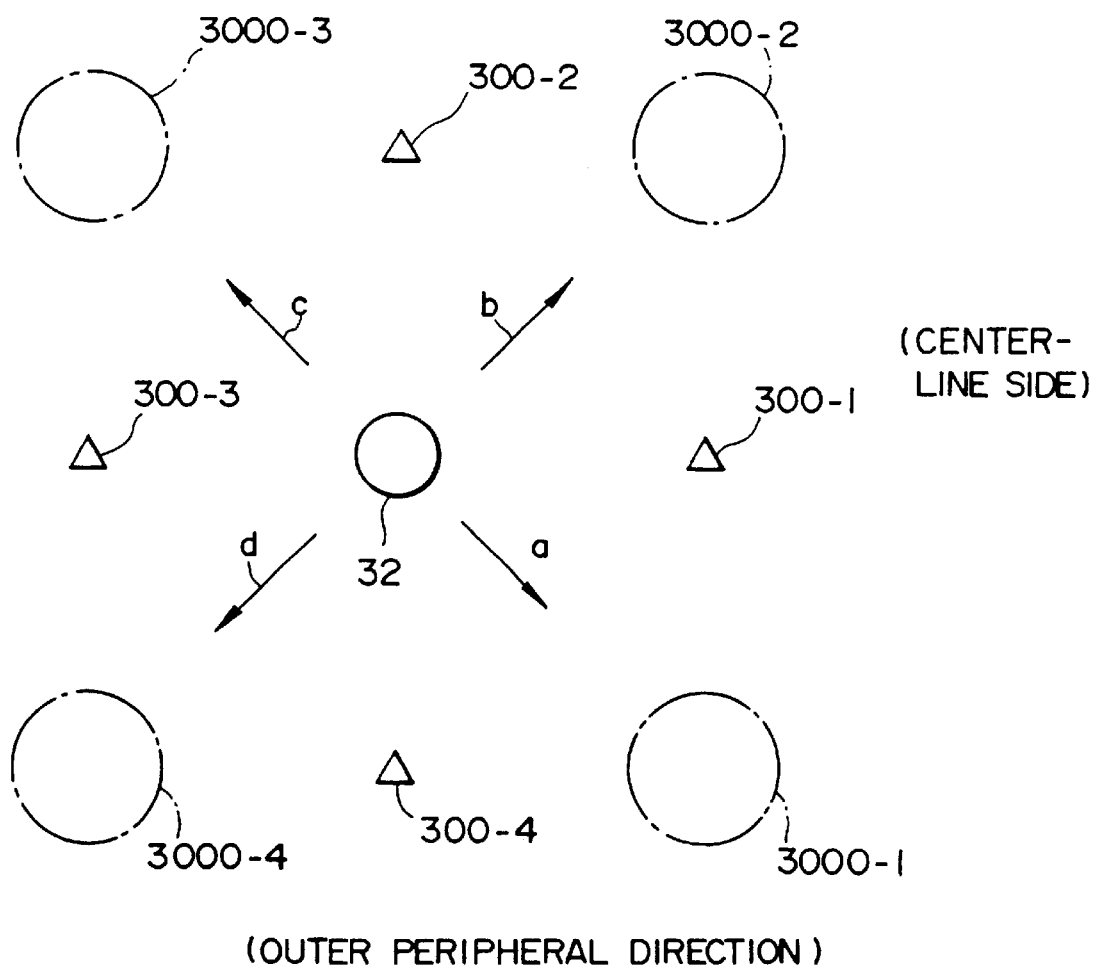
FIG. 56 is an illustration showing the directions to which interconnect leads are drawn from the interconnect land.

When the interconnect target land 32 is determined, the directions to which the leads 40 are drawn from the land 32 is determined as shown in FIG. 56. The following three rules O1, O2, and O3 are applied to the determination of the drawing directions.

As shown in FIG. 56, four lead drawing directions a, b, c, and d from the interconnect target land 32 are virtually set. In addition, virtual areas 300-1, 300-2, 300-3, and 300-4 are virtually set to these directions a, b, c, and d. The above directions a, b, c, and d are set in the directions of row and column, so that these intersect at an angle of 45 degree. In addition, the directions a, b, c, and d are set so that each has a phase difference of 90 degree.

The rules to decide to which direction among the four directions the lead 40 is drawn from the interconnect target land 32 are the three lead drawing direction determination rules O1 to O3.

Figure 57:
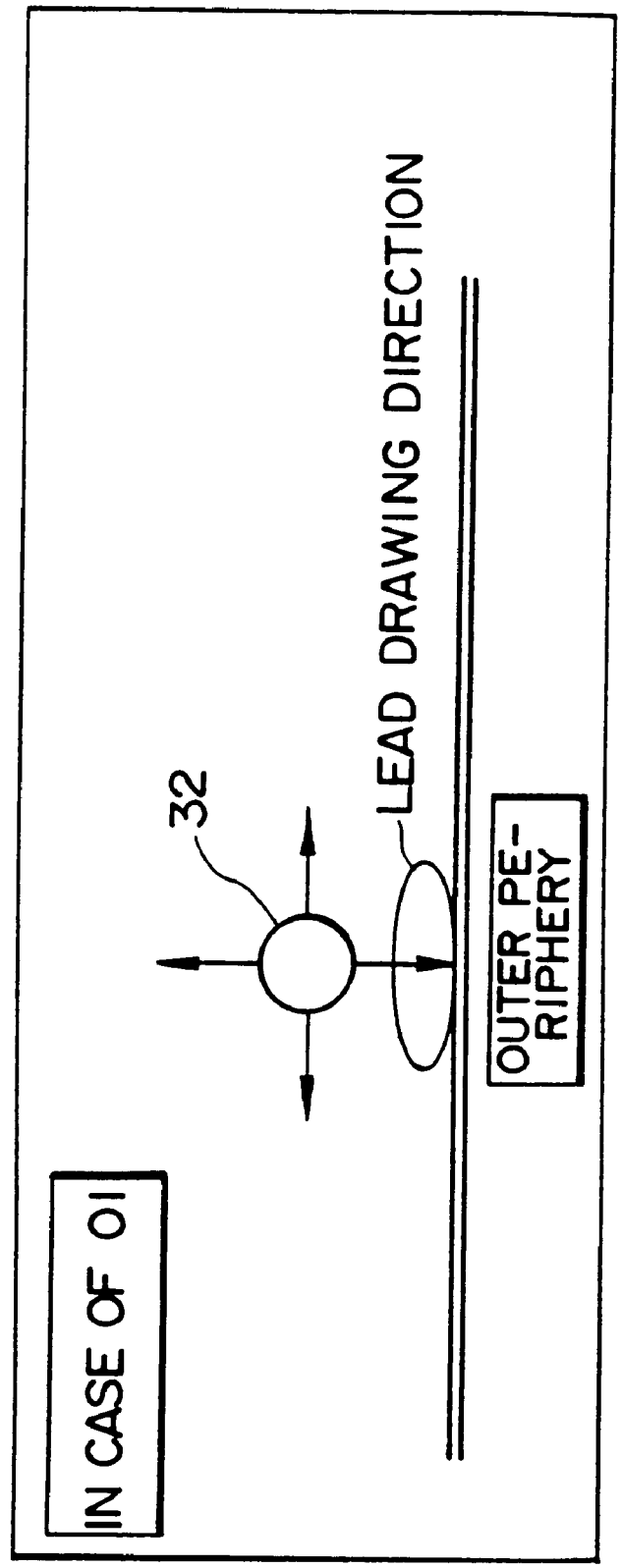
FIG. 57 is a diagram illustrating the case where the rule 01 is applied.
Figure 58:
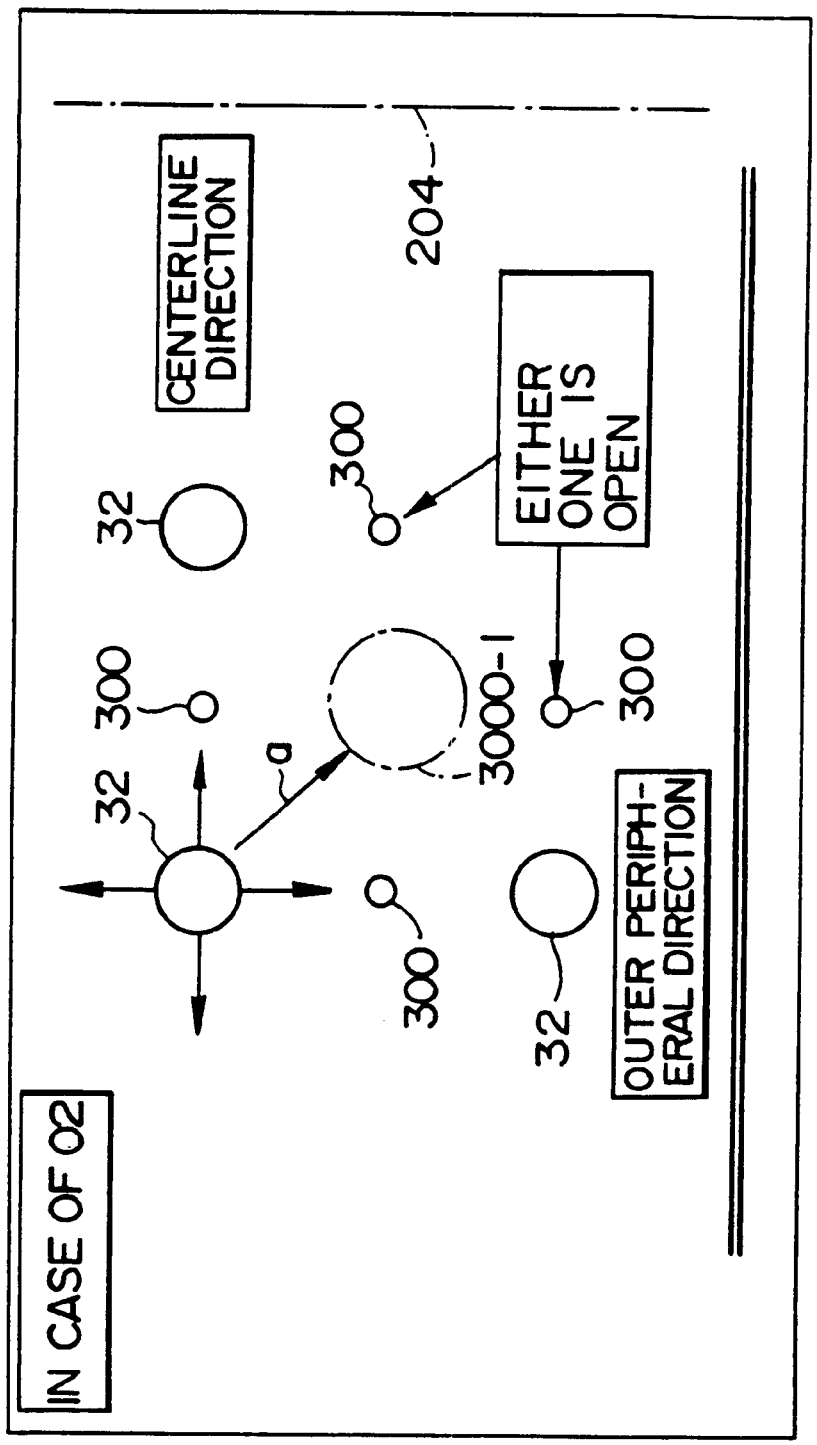
FIG. 58 is a diagram illustrating the case where the rule 02 is applied.
Figure 59:
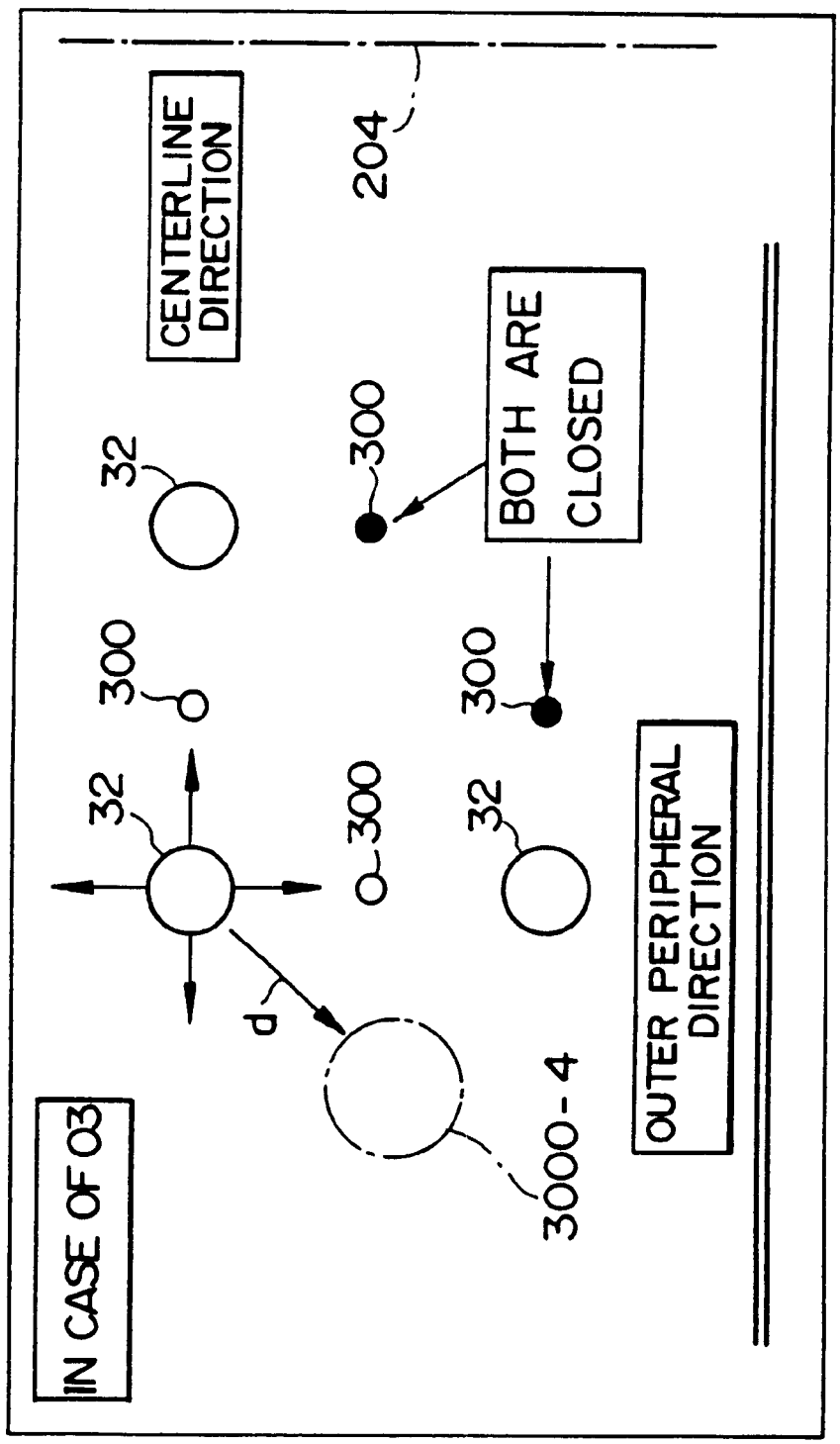
FIG. 59 is a diagram illustrating the case where the rule 03 is applied.

FIGS. 57 to 59 show specific examples of the three rules O1 to O3.

Figure 55:
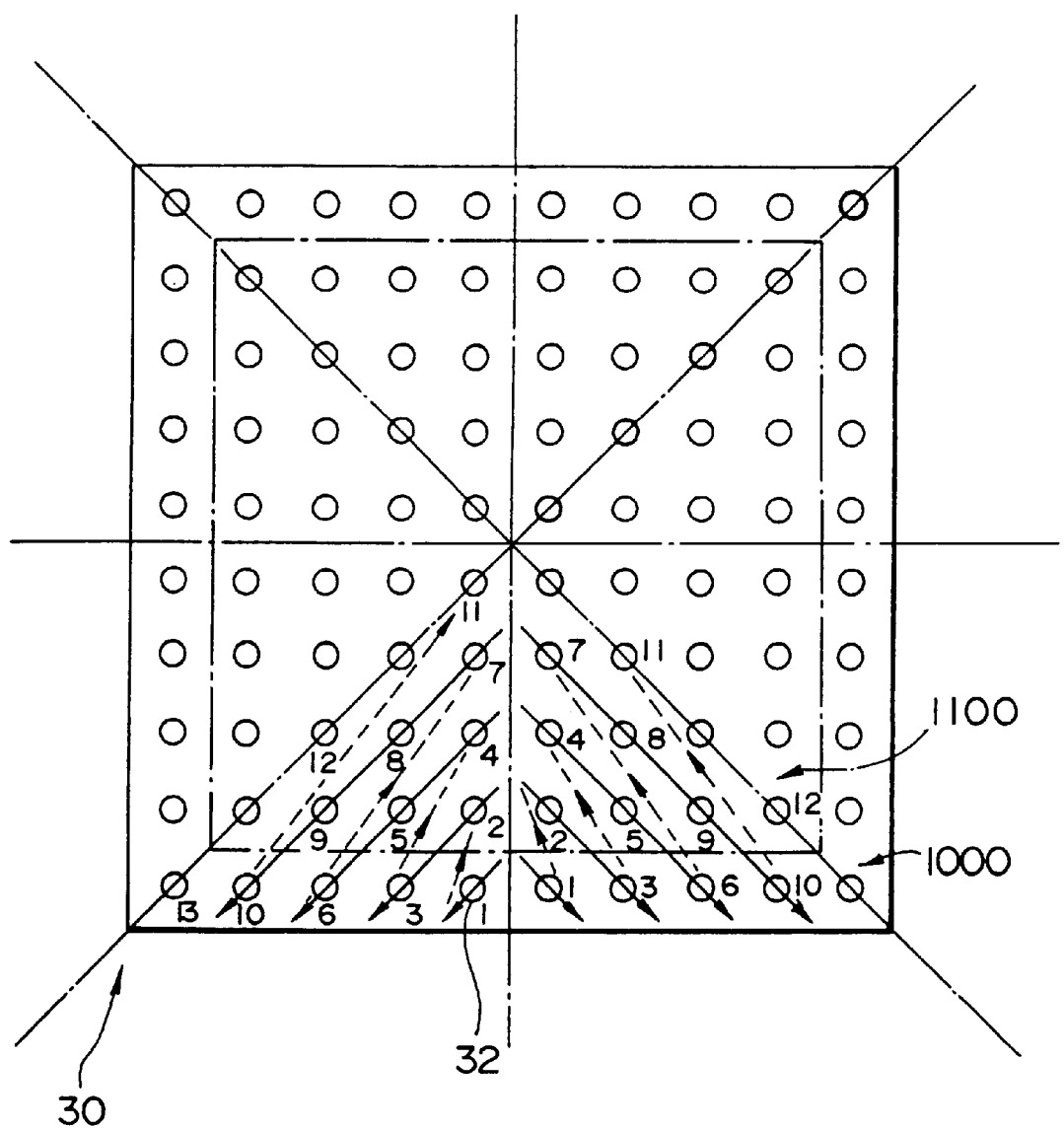
FIG. 55 is an illustration of the outside area and inside area of the land group.

Rule O1:

The lands 32 which belong to the outermost area 1000 of the land group 30, shown in FIG. 55, are directly connected to the interconnect target inner lead 22 located on the circumference side without being connected to the counter 300, as shown in FIG. 57.

The following rules 02 and 03 are applied to the lands which are located in the inner area 1100 of the land group 30 shown in FIG. 55, that is, these rules are applied when the lands excluding those belonging to the outer area 1000 are the interconnect target lands.

Rule O2:

As shown in FIG. 58, the drawing direction of the lead 40 from the interconnect target land 32 is directed to the outer periphery (toward inner lead group) on the side of the centerline 204 as indicated by the direction a.

Rule O3:

As shown in FIG. 59, when the outer periphery side counter of the adjoining land 32 which is located to the centerline 204 side is closed, and the centerline 204 side counter 300 of the adjoining land 32 which is located closer to the outer periphery is also closed, the lead drawing direction is to the other side of the centerline 204 toward the outer periphery as shown by the direction d.

Rule O4:

Interconnect is judged to be impossible when none of the rules O1 to O3 are applicable.

Among the three rules O1 to O3, O2 and O3 are standard rules, with the rule O2 having preference. The rule O1 is a special rule applicable when a land belonging to the outer area 1000 in FIG. 55 is the interconnect target land.

C: Rule for the Determination of Lead Progress Directions

When the drawing direction of lead 40 from the interconnect target land is determined according to the rules O1 to O3 as described above, the direction to which the drawn leads progress are then determined to connect the interconnect to the corresponding inner lead 22. Rules to determine such directions are required.

Figure 60:
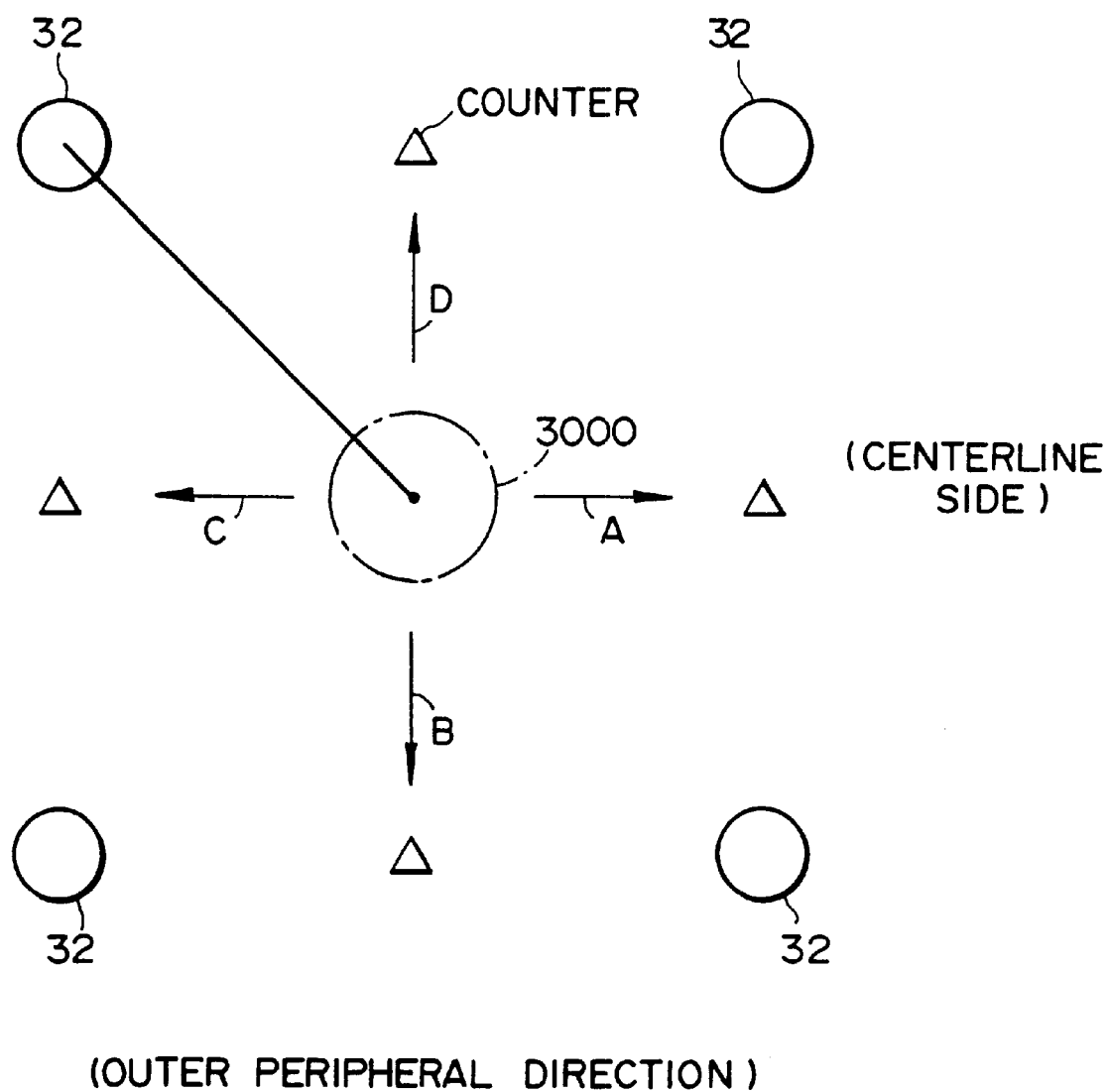
FIG. 60 is a diagram illustrating a proceeding direction of the interconnect lead.

Specifically, it is necessary to determine which of the four directions A, B, C, and D shown in FIG. 60, which are specified by the column and row, should be the direction to which the lead drawn to virtual area 3000 progresses. The lead progress determination rules include the following-described rules L1 to L8. Viewing from the virtual area 3000, the direction closer to the centerline is defined as the direction A, the direction closer to the outer periphery is defined as the direction B, the direction remote from the centerline is defined as the direction C, and the direction remote from the outer periphery is defined as the direction D.

Figure 61:
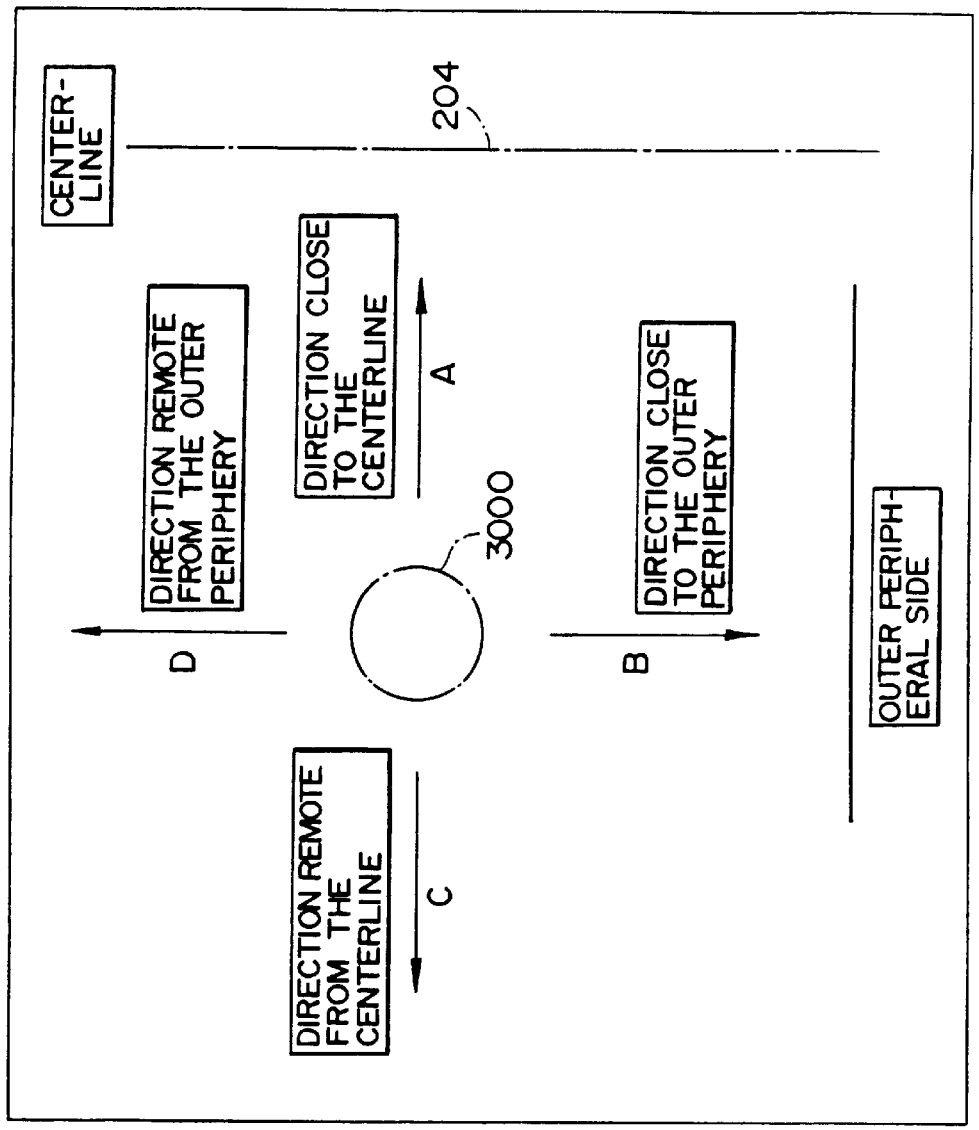
FIG. 61 is a diagram illustrating a proceeding direction of the interconnect lead.
Figure 62:
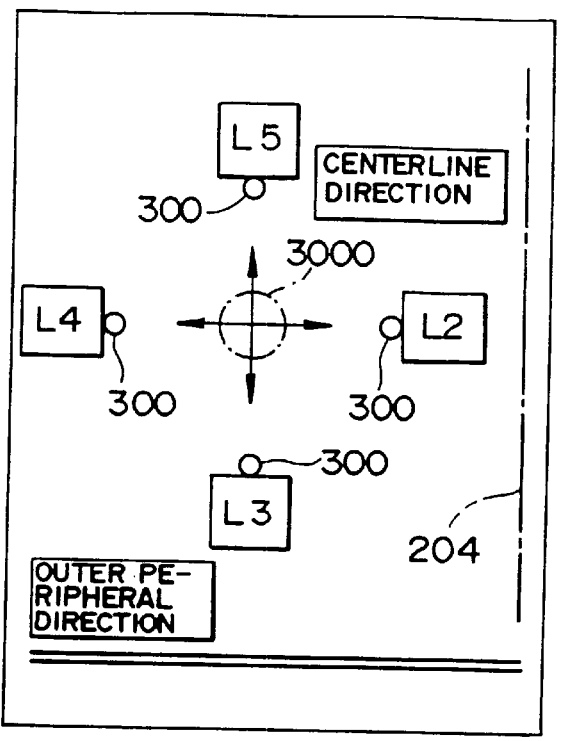
FIG. 62 is a diagram illustrating a proceeding direction of the interconnect lead in the case where the rules L2 to L4 are applied.
Figure 63:
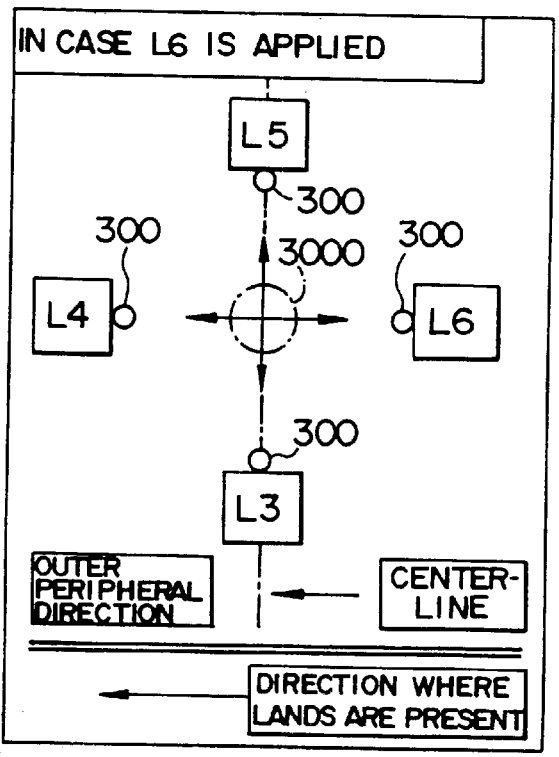
FIG. 63 is a diagram illustrating a proceeding direction of the interconnect lead in the case where the rule L6 is applied.

FIGS. 61 to 63 illustrate these rules.

Rule L1:

When the virtual area 3000 adjoins the outer periphery (inner lead group), lead 40 is caused to progress toward the direction B of the outer periphery.

Rule L2:

The lead is caused to progress toward the counter 300 of the centerline 204 side.

Rule L3:

The lead 40 is caused to progress toward the peripheral side direction B, i.e. to the direction of the counter of the outer periphery side.

Rule L4:

The lead is caused to progress toward the direction C which is more remote from the centerline 204, i.e. to the direction of the counter located on the diagonal 220 side.

Rule L6:

In the processing according to the rules L2 to L4, the counters beyond the centerline 204 are recognized as closed counters.

Rule L7:

None of the leads 40 can pass twice through an identical counter position.

Rule L8:

Interconnect is judged to be impossible when none of the rules L1 to L7 cannot decide the direction.

Among the three rules L1 to L7, L2 and L4 are standard rules. The rules L3 and L4 are indispensable rules, whereas the rule L2 is a rule which is selected as required.

The rule L1 is a rule applicable to the outer area 1000 shown in FIG. 55, whereas the rule L6 is a special rule applicable to the area on the centerline 204 side.

D: Counter Control Rules

Next, Rules C0 to C4 used for controlling the counter 300 will be explained.

Rule C0:

When the rule O2 is applied, the counter on the outer periphery side of the interconnect target land 32 is closed.

Rule C1:

When the rule O3 is applied, both the counter on the centerline 204 side and the counter on the outer periphery side of the interconnect target land 32 are closed.

Rule C2:

When the counter value has reaches the maximum, that counter is closed and, at the same time, a starting land 32 of interconnect 40 which passes through the maximized counter is specified. A counter on the centerline side of the specified starting land and an outer periphery side counter are closed.

Rule C3:

The above rules C1 and C2 are not applicable to an interconnect processing beyond the centerline 204.

Rule C4:

The counter located on centerline 204 reaches the maximum value at a half value of common counters.

Among the above rules C0 to C4, rules C0 to C2 are standard rules, with the rule C2 being an indispensable rule. The rules C3 and C4 are special rules applicable to counters located on the centerline 204.

(4-2-4) Interconnect According to the Above Rules

Next, details of the process for the determination of interconnect routes of leads 40 according to the above rules will be described.

The above-described priority order must be determined to determine the order in which a plurality of lands 32 are interconnected. As the method of determining the priority order has been previously described, further explanation is omitted here.

In the present embodiment, once the priority order is determined, the interconnect route of lead 40 which connects the land 32 and the inner lead 22 is determined principally according to this priority order. The above-mentioned lead drawing direction determination rule, lead progress direction determination rule, and counter control rules are required for the determination of the interconnect route of the lead 40.

The direction to which the first interconnect lead 40 is drawn from the interconnect target land 32 is determined according to the rules O1 to O4. In this instance, the rules O2 and O3 are applied as standard rules.

According to the rule O2, the interconnect direction is determined so that the drawing direction is on the centerline 204 side and toward the direction of outer periphery. Specifically, the direction "a" in FIG. 58 is applied. By applying this rule O2, the lead 40 is interconnected very close to the centerline 204 side. Thus, the length of interconnect is decreased, ensuring highly efficient interconnect.

The rule O3 is applied when interconnect using the rule O2 is impossible. In this instance, the interconnect is drawn to the direction "d" shown in FIG. 59.

If rules O2 and O3 are applied, the drawing direction of interconnect lead 40 is determined so that the interconnect passes very close to the centerline 204 side from the interconnect target land 32, always toward the direction of the outer periphery. This prevents the interconnect lead 40 from being drawn to the direction more remote from the inner lead 22, decreases the length of interconnect, and ensures simple and efficient interconnect route determination.

The rule O1 is a special rule. This rule O1 is applied when the interconnect is drawn from the outermost peripheral land. In this instance, the interconnect lead 40 is drawn directly toward the inner lead 22 so that neighborhood counters 300 are not affected.

This allows the interconnect route to be determined without affecting the other interconnect rules.

When the direction to which the lead 40 is drawn from the interconnect target land 32 has been determined according to the above-described method, next, the direction to which this interconnect lead 40 progresses must be determined. The determination of this progress direction is performed according to the above-described lead progress direction determination rules L1 to L8.

Among these rules, rules L2 to L4 are basic rules. Rules L3 and L4 are indispensable rules, and rule L2 is an optional rule.

As shown in FIG. 62, the rule L2 determines the direction (any direction to be selected from among A to D in FIG. 61) to which the interconnect lead 40 drawn to the virtual area 3000 proceeds.

According to the rule L2, when there is no other restrictions, i.e. when no counter located in the direction A is closed, the lead progress direction is set toward the direction A on the centerline 204 side.

If the conditions applicable to the rule L2 is not satisfied, i.e. when the counter located in the direction A is closed, then, the rule L3 is applied, so that the lead progress direction is set toward the direction B on the outer periphery side.

If none of the above conditions are satisfied, the rule L4 is applied, so that the lead progress direction is set toward the direction C on the side remote from the centerline.

The determination of this progress direction according to these rules enables the interconnect leads 40 to be arranged closely side by side from the centerline 204 side.

The rule L2 may not be used, if unnecessary. If the rule L2 is not used, the conditions wherein the interconnects are closely arranged on the centerline 204 side is not satisfied, there may be the case where interconnect is impossible. However, if rules L3 and L4 are followed, the lead progress direction is always toward the outer peripheral direction, which ensures the shortest interconnect distance.

Accordingly, in designing an interconnect route, the rules L3 and L4 should be first applied. Only in the case where the interconnect is judged to be impossible under the conditions of rule L3 or L4, a new rule L2 may be additionally applied to determine the interconnect route.

The rule L7 is a second basic rule. According to the rule L7, none of the interconnect leads 40 cannot pass twice through an identical counter 300. If there were not for this rule, there may be the case where an interconnect lead 40, whose route has been determined by applying one rule, may come back to the same route, when moving from one virtual area 3000 to the next virtual area 3000. Occurrence of such a situation can be avoided, if the rule L7 is applied.

Judgement by the application of this basic rule L7 should always be done on the basis of combinations with the above-mentioned basic rules L2, L3, and L4.

In addition, when the progress direction of the interconnect route is determined in the neighborhood of lands 32 on the outermost periphery, the special rule L1 is applied. Application of this rule enables the interconnect route in the neighborhood of lands 32 on the outermost periphery to be determined so that the interconnect lead 40 is drawn directly toward the corresponding inner lead 22. This ensures the interconnect lead 40 to be drawn without affecting neighborhood counters 300.

The counter 300 is controlled in the following manner when the interconnect route is determined as mentioned above.

Each counter 300 has an upper limit for the count value, above which the counter is closed. No new interconnect route can be arranged in the areas in which a closed counter is present.

All counters 300 have an initial count value of zero.

The above-described rules C0 to C4 are applied to the control of counters 300.

C1, C2, and C3 are indispensable control rules. The combined use of the two rules C2 and C3 with the rule C4 is preferable.

The rule C0 is an optional rule.

First, the case where the rule C0 is applied will be discussed. This rule C0 is applicable when the drawing direction of lead 40 has been determined under the conditions of O2. When this rule is applied, the counter 300 on the outer peripheral side of interconnect target land 32 is closed. For instance, when the drawing direction to the direction "a" shown in FIG. 58 is set, the counter 300 on the outer peripheral side of land 32 is closed. Specifically, this prevents an increase in the interconnect length.

Otherwise, interconnect may be provided with allowance. Thus, the rule C0 may be optionally applied as appropriate.

Rule C1 is used when the rule O3 is applied as shown by FIG. 59. In this case, the counter 300-1 on the centerline 204 side and the counter 300-4 on the outer peripheral side of the interconnect target land 32 are closed. Closing the counters in this manner prevents next interconnect from invading the centerline 204 side.

The rule C2 is applied to the case where a count value in a counter 300 reaches the upper limit. When the counter 300 is compulsory closed by other rules, the rule C2 is not applied. When a count value reaches the upper limit due to a new interconnect lead 40 passing through the lands, that counter 300 is closed.

Then, the lands 32 to which all interconnect leads 40 passing through areas between lands wherein the counter 300 closed due to a maximized count value exists are connected are specified. In this case, the counter 300-1 on the centerline 204 side and the counter 300-4 on the outer peripheral side of the specified land 32 are closed. Specifically, when a count value of a counter 300 reaches the upper limit, that counter is closed and, at the same time, all interconnect leads 40 which pass through the area between the lands in which this counter exists are detected, each land to which each of the leads 40 is connected is specified, and the counter 300-1 on the centerline 204 side and the counter 300-4 on the outer peripheral side of the specified lands are closed.

Such a counter control prevents the next interconnect lead 40 from invading the centerline 204 side and decreases the occurrences of situations where interconnect is impossible.

The rule C3 is a controlling rule applied to the above-mentioned counters locating on the centerline 204. This rule bans the application of control according to the rules C1 and C2 for counters which are present in another side of the centerline 204.

The rule C4 is a special rule applied to counters locating on the centerline 204. According to this rule, the upper limit of the count value for the counters located on the centerline 204 is reduced to one half of that of usual counters. Because the upper count value for the other counters in this embodiment is 2, the count value for the counters to which this rule is applied is set to 1. Specifically, the counter 300 positioned on the centerline 204 is closed at the time when an interconnect passes through that counter.

(4-2-5) Specific Description on Interconnect Route Determination

The process of interconnect route determination is specifically described referring to FIGS. 65 to 74.

The interconnect target land is specified here according to the order of priority.

Figure 65:
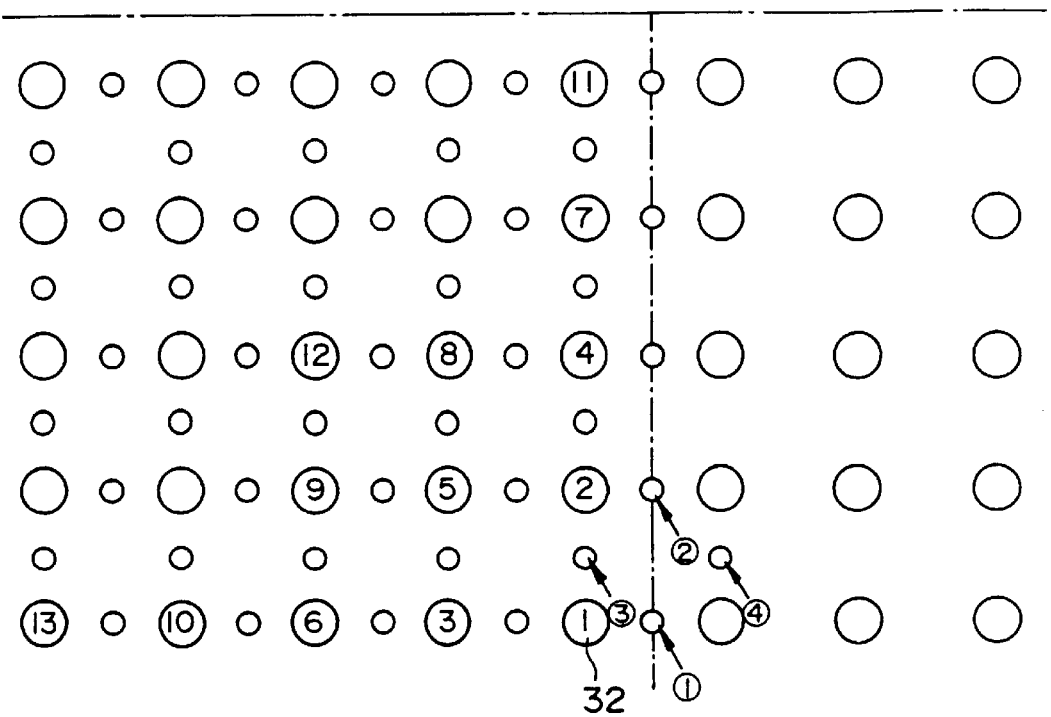
FIG. 65 is a diagram illustrating an interconnect rout determination process when the first to third priority lands are the interconnect lands.

1. The case where the first priority land is the interconnect target land (FIG. 65)

In this case, the rule O1 is applied to determine the interconnect route. No count up of counters occurs in this case.

2. The case where the second priority land is the interconnect target land (FIG. 65)

The rule O2 is applied. The lead line progress to the direction of counter 1, which then reaches a count-up state.

Because the counter 1 has reached the maximum, the rule C2 is applied. Counters 1, 2, and 3 are thus closed. However, the rule C3 is applied to the counter 4.

In addition the rule L1 is applied.

An interconnect route for the interconnect target land is determined in this manner.

3. The case where the third priority land is the interconnect target land (FIG. 65)

The rule O1 is applied to determine the interconnect route. No count up of counters occurs in this case.

Figure 66:
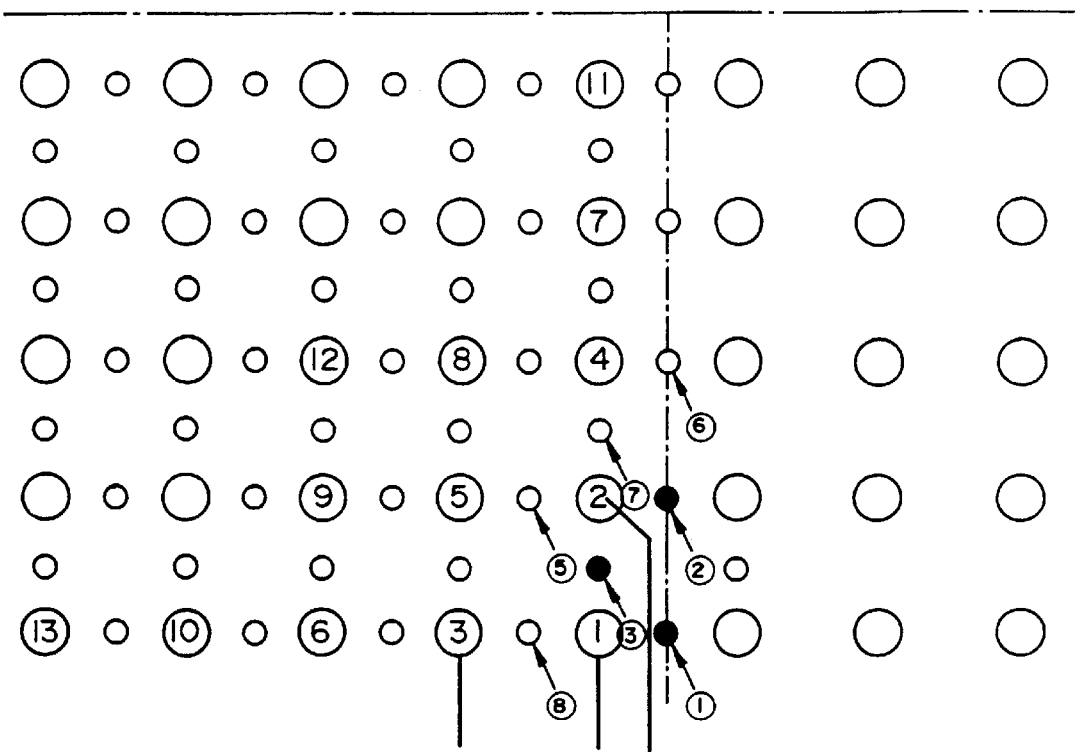
FIG. 66 is a diagram illustrating an interconnect rout determination process when the fourth priority land is the interconnect land.

4. The case where the fourth priority land is the interconnect target land (FIG. 66)

The rule O3 is applied. The interconnect lead 40 is drawn to the direction of the counter 5, which then reaches a count-up state. Counters 6 and 7 are closed.

The rule L3 is applied. The interconnect lead 40 progress to the direction of the counter 8 to bring this counter to a count-up state.

The rule L1 is applied.

The interconnect route is determined in this manner.

Figure 67:
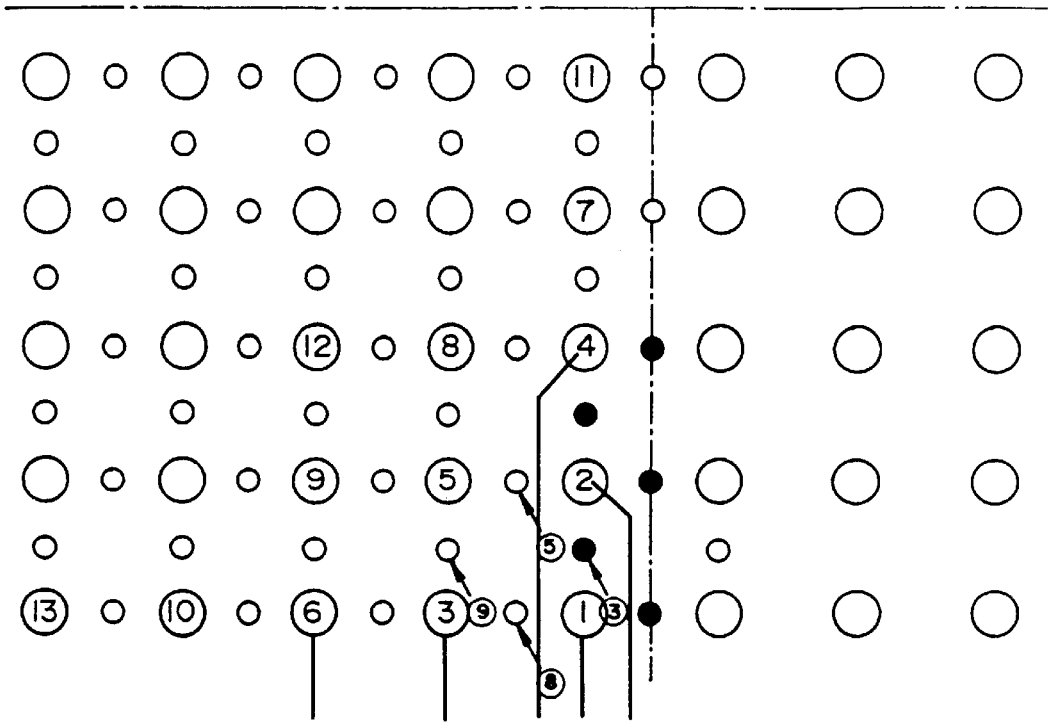
FIG. 67 is a diagram illustrating an interconnect rout determination process when the fifth and sixth priority lands are the interconnect lands.

5. The case where the fifth priority land is the interconnect target land (FIG. 67)

The rule O2 is applied. The interconnect lead 40 is drawn to the direction of the counter 8, which is brought to a count-up state.

Because the counter 8 has reached the maximum, the rule C2 is applied, and the counters 8, 5, and 9 are closed.

The rule L1 is applied.

The interconnect route is determined in this manner.

6. The case where the sixth priority land is the interconnect target land (FIG. 67)

The rule O1 is applied. No count up of counters occurs.

The interconnect route is determined in this manner.

Figure 68:
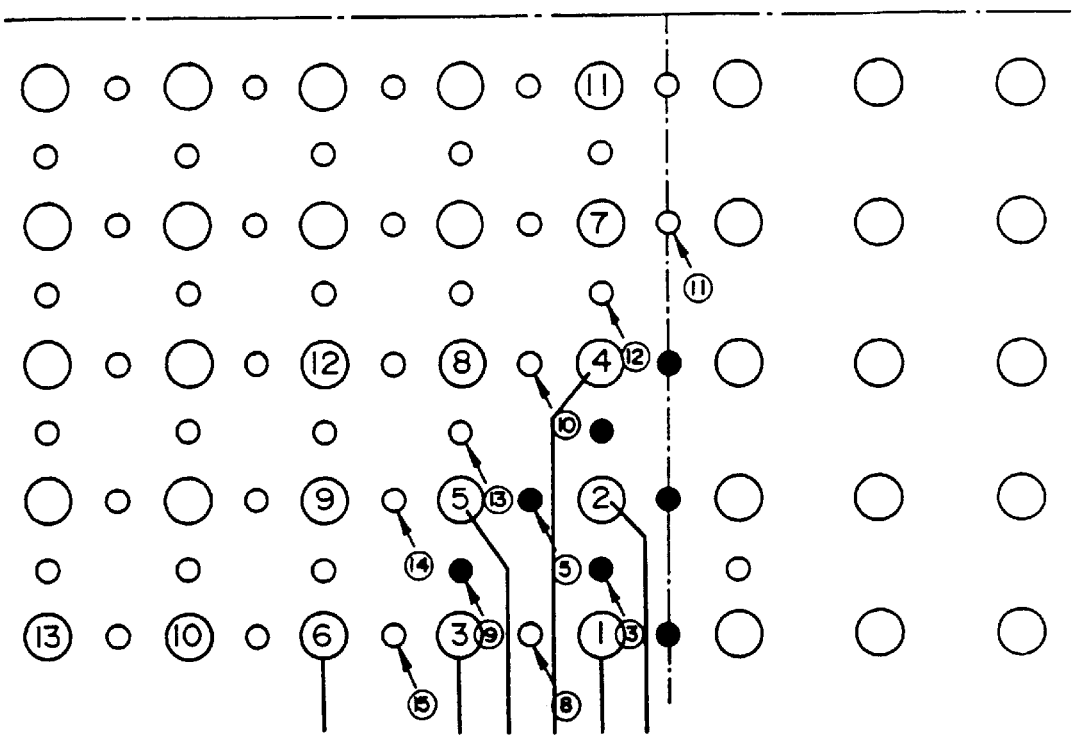
FIG. 68 is a diagram illustrating an interconnect rout determination process when the seventh priority land is the interconnect land.

7. The case where the seventh priority land is the interconnect target land (FIG. 68)

The rule O3 is applied. The interconnect lead 40 progress to the direction of the counter 10 to bring this counter 10 to a count-up state. The counters 11 and 12 are closed.

The rule L4 is applied. The interconnect lead progresses to the direction of the counter 13 to bring this counter 13 to a count-up state.

The rule L3 is applied, whereby the interconnect lead progresses to the direction of the counter 14 to bring this counter 14 to a count-up state.

The rule L3 is applied, whereby the interconnect lead 40 progresses to the direction of the counter 15 to bring this counter 15 to a count-up state.

The rule L1 is applied.

As mentioned above, the interconnect route of the interconnect lead 40 is determined.

Figure 69:
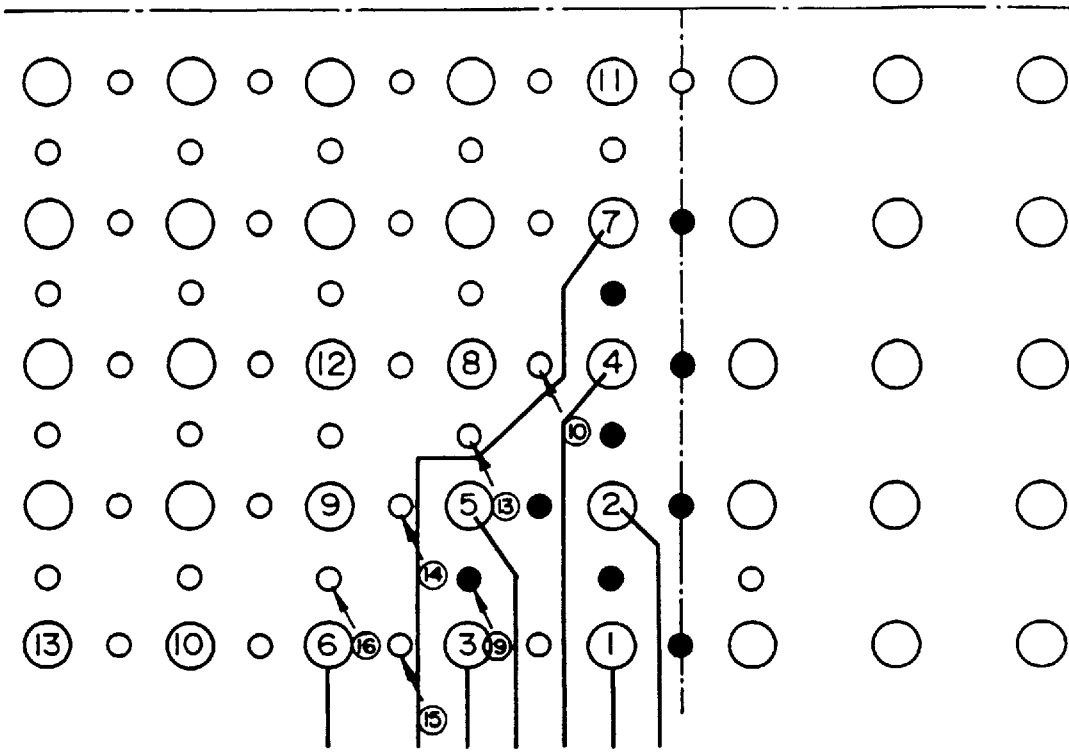
FIG. 69 is a diagram illustrating an interconnect rout determination process when the eighth priority land is the interconnect land.

8. The case where the eighth priority land is the interconnect target land (FIG. 69)

The rule O3 is applied, whereby the interconnect lead is drawn to the direction of the counter 14 to bring this counter 14 to a count-up state. The counters 10 and 13 are closed.

Because the counter 14 has reached the maximum, the rule C2 is applied, and the counters 14, 10, and 13 are closed.

The rule L3 is applied, whereby the interconnect lead 40 progresses to the direction of the counter 15. The counter 15 is brought to a count-up state.

Because the counter 15 has reached the maximum, the rule C2 is applied, and the counters 154, 10, and 13 are closed.

The rule L1 is applied.

The interconnect route of the interconnect lead 40 is determined in this manner.

Figure 70:
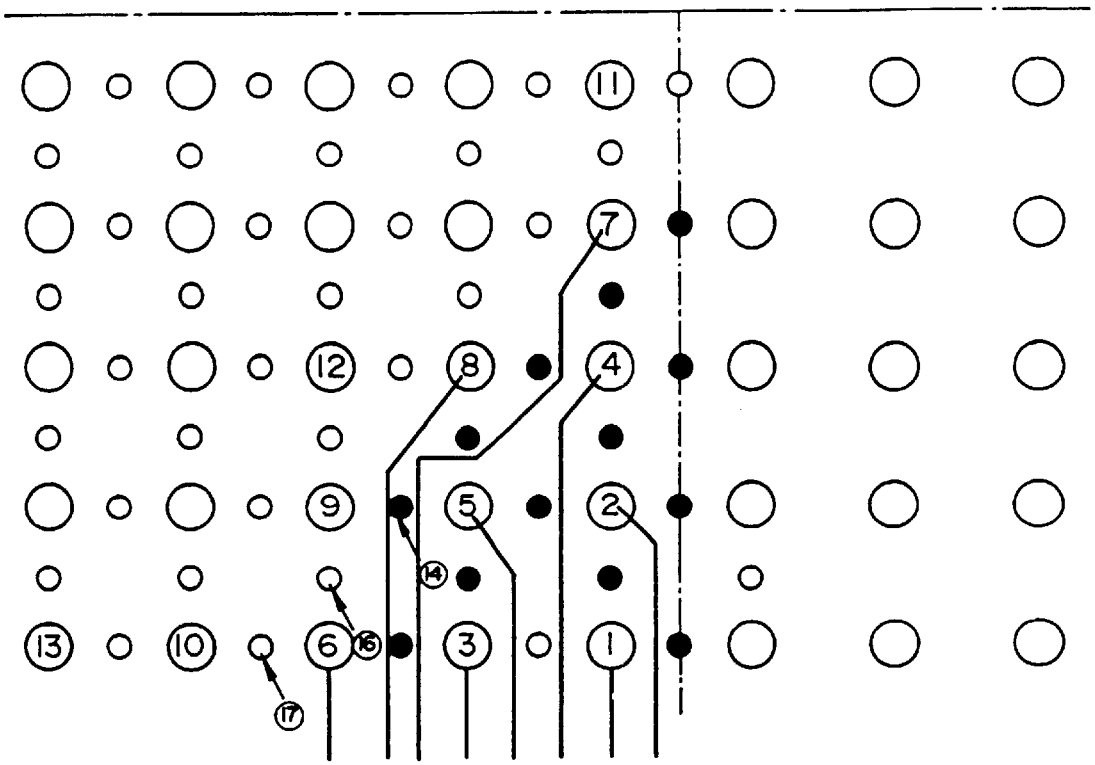
FIG. 70 is a diagram illustrating an interconnect rout determination process when the ninth and tenth priority lands are the interconnect lands.

9. The case where the ninth priority land is the interconnect target land (FIG. 70)

The rule O3 is applied, whereby the interconnect lead is drawn to the direction of the counter 17 to bring this counter 17 to a count-up state. The counters 14 and 16 are closed.

The rule L1 is applied.

The interconnect route of the interconnect lead 40 is determined in this manner.

10. The case where the tenth priority land is the interconnect target land (FIG. 70)

The rule O1 is applied. No count up of counters occurs. The interconnect route is determined in this manner.

11. The case where the eleventh priority land is the interconnect target land (FIG. 71)

The rule O3 is applied, whereby the interconnect lead 40 is drawn to the direction of the counter 18 to bring this counter 18 to a count-up state. The counters 19 and 20 are closed.

The rule L4 is applied, whereby the interconnect lead 40 progresses to the direction of the counter 1.

The rules L7 and L3 are applied, whereby the interconnect lead 40 progresses to the-direction of the counter 22. The rule L4 is applied, whereby the interconnect lead 40 progresses to the direction of the counter 3.

The rules L7 and L3 are applied, whereby the interconnect lead 40 progresses to the direction of the counter 24.

The rule L3 is applied, whereby the interconnect lead 40 progresses to the direction of the counter 17 to bring this counter 17 to a count-up state.

Because the counter 17 has reached the maximum, the rule C2 is applied, and the counters 17, 19, and 20 are closed.

The rule L1 is applied.

The interconnect route of the interconnect lead 40 is determined in this manner.

Figure 72:
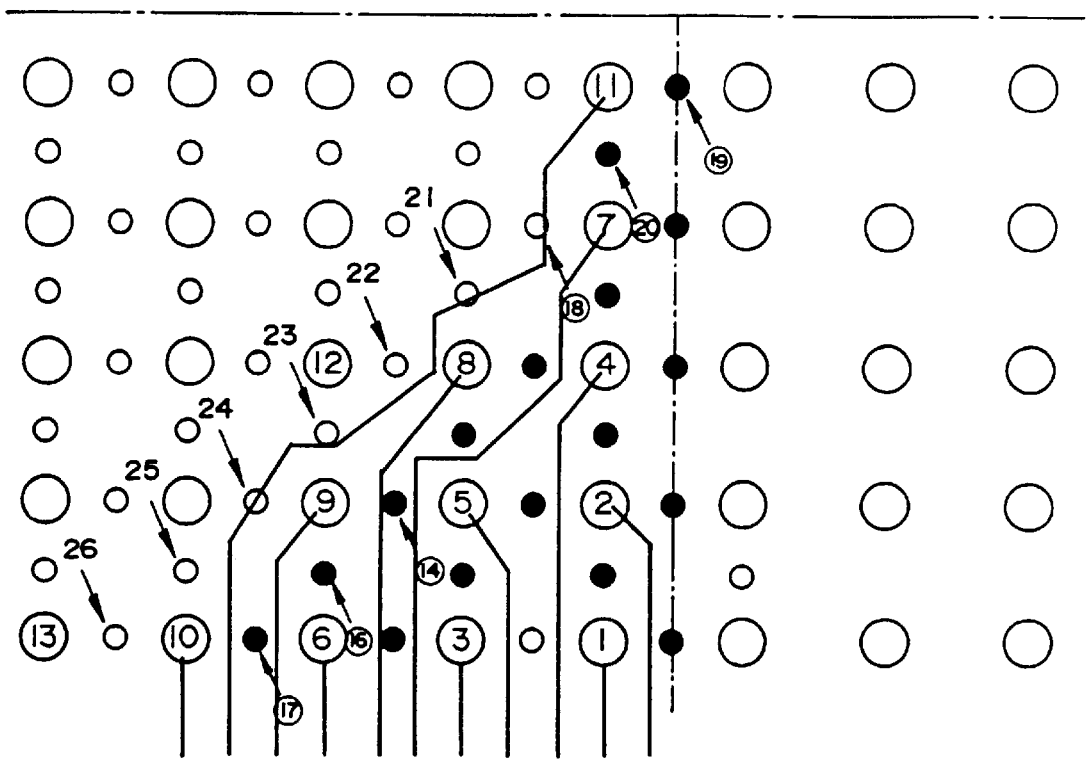
FIG. 72 is a diagram illustrating an interconnect rout determination process when the twelfth priority land is the interconnect land.

12. The case where the twelfth priority land is the interconnect target land (FIG. 72)

The rule O3 is applied, whereby the interconnect lead 40 is drawn to the direction of the counter 24 to bring this counter 24 to a count-up state. The counters 22 and 23 are closed.

Because the counter 24 has reached the maximum, the rule C2 is applied, and the counters 24, 22, and 23 are closed. The rule L4 is applied, whereby the interconnect lead progresses to the direction of the counter 25 to bring this counter 25 to a count-up state.

The rule L3 is applied, whereby the interconnect lead 40 progresses to the direction of the counter 26 to bring this counter 26 to a count-up state.

The rule L1 is applied.

The interconnect route of the interconnect lead 40 is determined in this manner.

Figure 73:
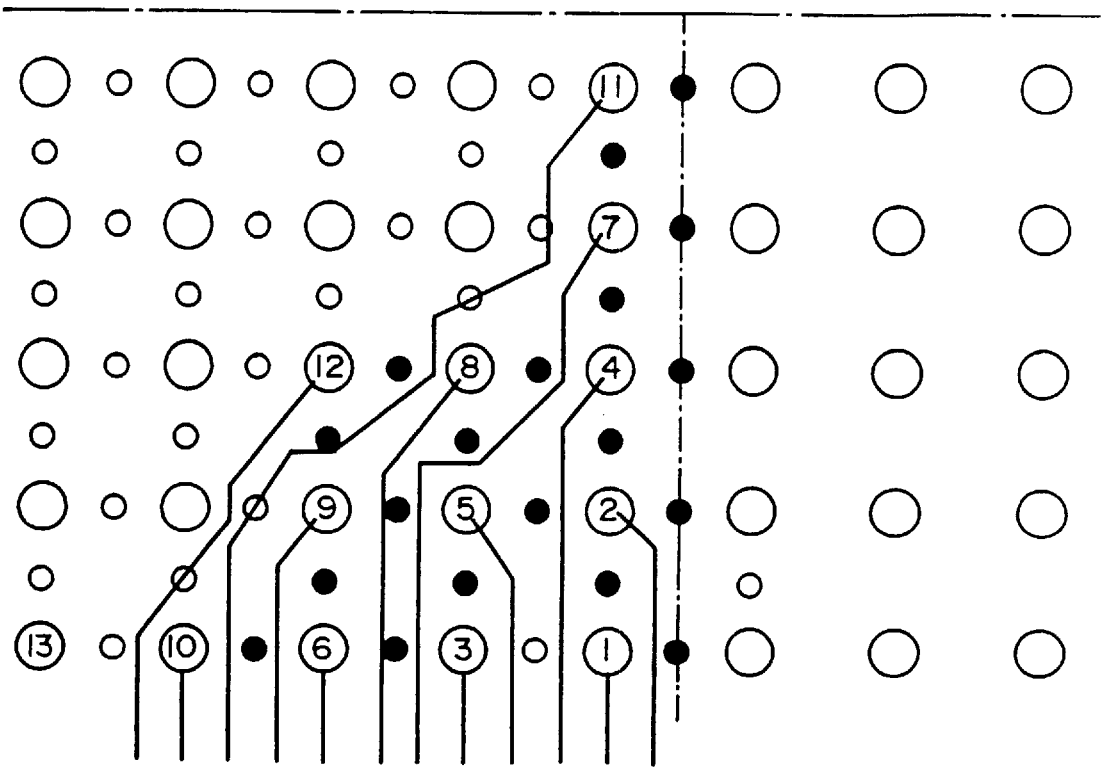
FIG. 73 is a diagram illustrating an interconnect rout determination process when the thirteenth priority land is the interconnect land.

13. The case where the thirteenth priority land is the interconnect target land (FIG. 73)

The rule O1 is applied, whereby the interconnect route of the interconnect lead 40 is determined.

By performing the above processings 1 to 13, all interconnect routes in the process surface 230-1 on the left side of centerline 204-1 shown in FIG. 54 are determined. 14. Next, interconnect in the process surface 230-2 on the right side of the centerline 204 is performed using the same technique (FIG. 74).

In the interconnect route determination for these two process surfaces 230-1 and 230-2, it is important to cause the surface common portions 220-1 and 220-2 to intersect each other. In FIG. 74, for example, the interconnect target lands are the total of three lands which are selected every one other in the process surfaces 230-1 on the diagonal of the land 30. In another process surface 230-2, on the other hand, the remaining two lands which are not processed in the process surfaces 230-1 on the diagonal are selected as the interconnect target lands.

Figure 74:
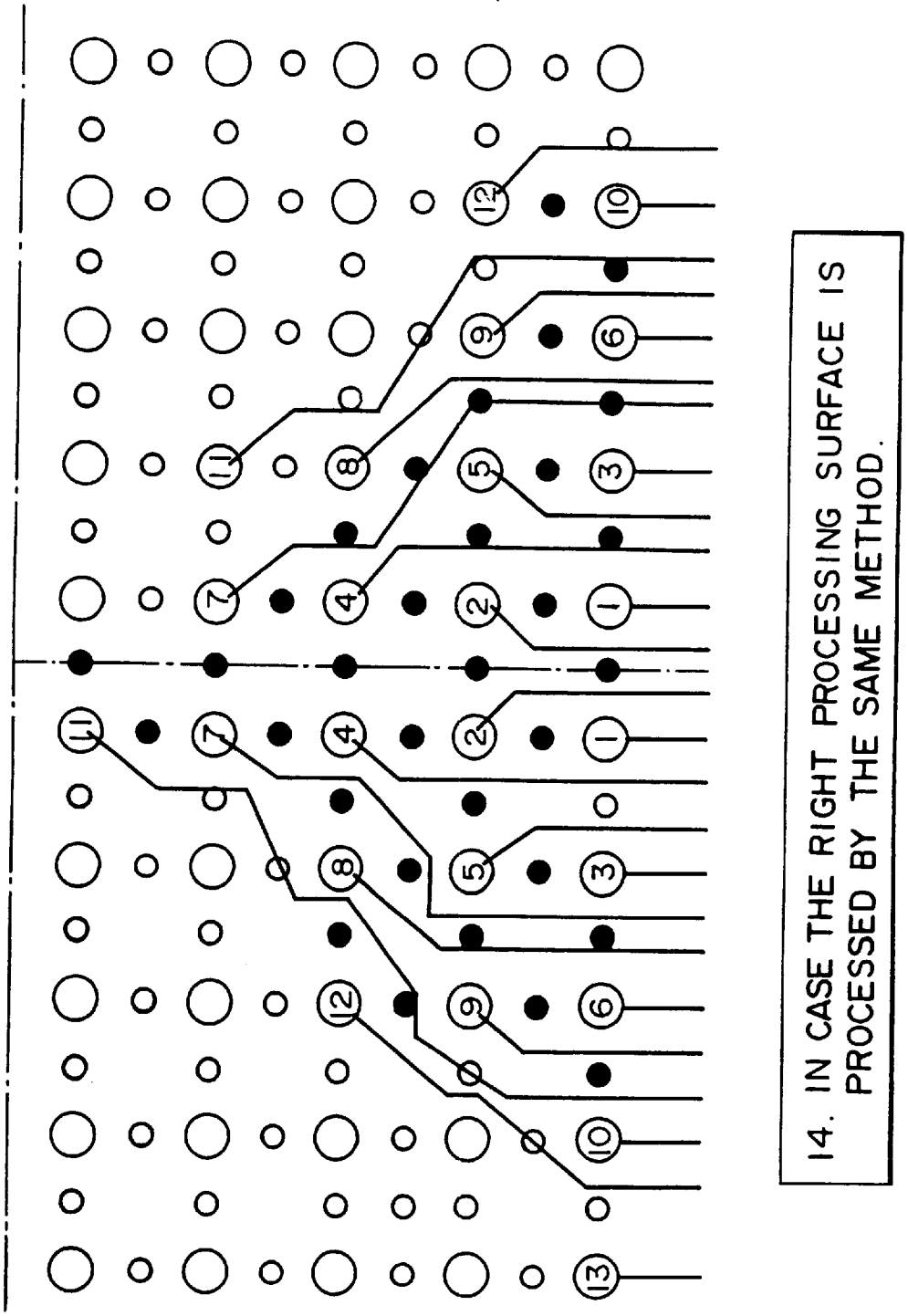
FIG. 74 is a diagram illustrating a process of interconnect route determination to the area on the other side from the centerline.

According to this operation, the interconnect routes in the divided area 200-1 which are determined as shown in FIG. 74 can be used as the interconnect routes for other divided areas 200-2 and 200-3.

(4-2-6) Design of Interconnect Routes

Next, the interconnect route designing processing is described using the device shown in FIG. 2.

Figure 64:
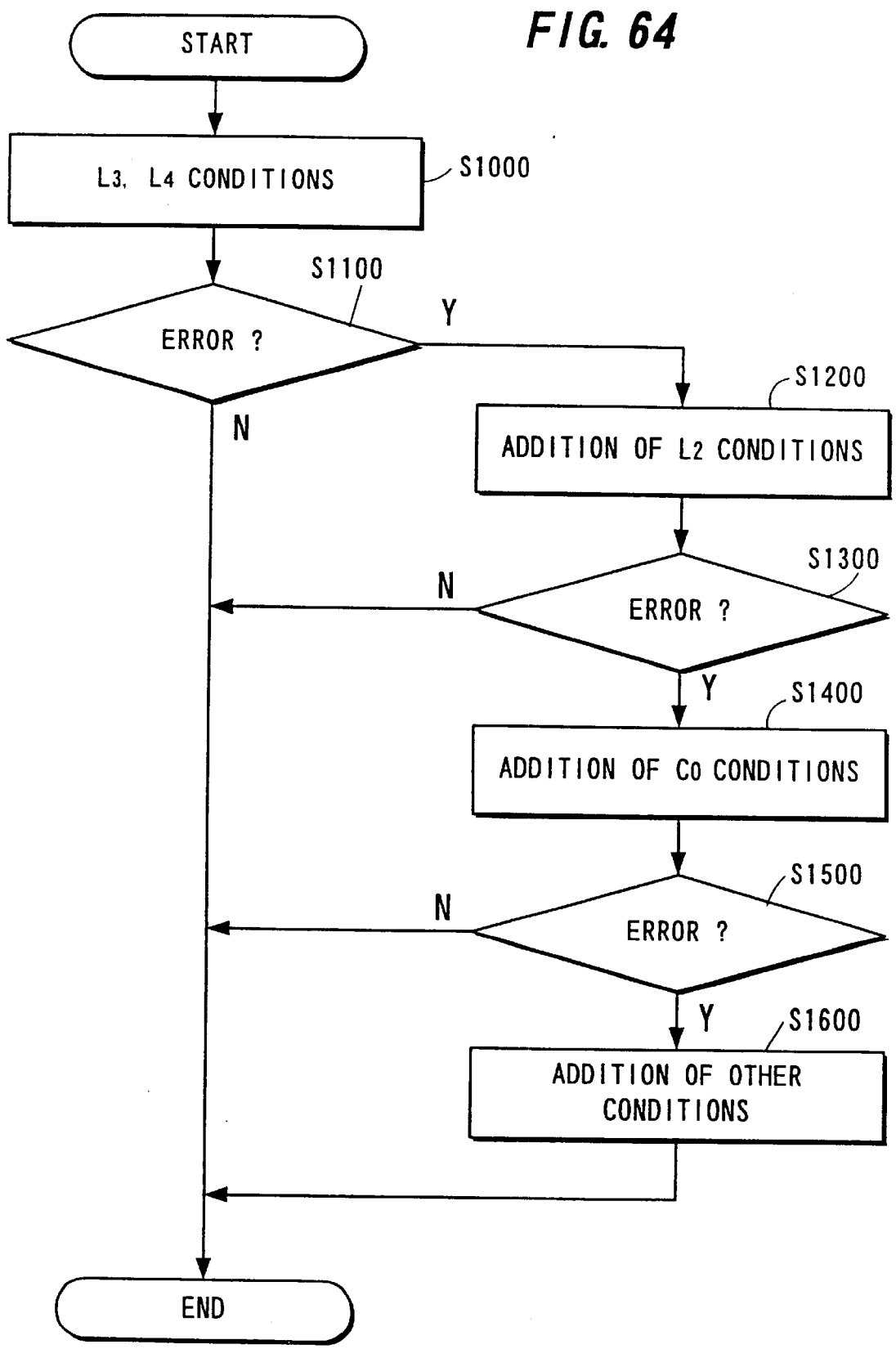
FIG. 64 is a flowchart schematically showing an interconnect rout determination process.

FIG. 64 is a flowchart schematically showing this setting process.

The designer first establishes the conditions for most loose interconnect using the input part 110. In this embodiment, the interconnect route is determined according to the rules L3 and L4, for example, to perform calculations for automatic interconnect (step S1000).

If interconnect is possible under these conditions, this interconnect model is adopted.

According to this interconnect model, the interconnect route is established so that the first interconnect lead 40 is always drawn from each land 22 toward the inner lead 22 in the outer periphery as a straight line or an almost straight line. Simple and efficient interconnect of the interconnect lead 40 is ensured in this manner.

Because the case which satisfy these conditions does not necessarily occur frequently, an error message may be given in step S1100. In such a case, automatic interconnect with additional conditions should be instructed. Here, automatic interconnect instruction is given by adding the conditions of rule L2 to the above-described conditions.

If the interconnect route is determined under these conditions, this interconnect model is adopted.

When an error message is displayed in stem S1300, another automatic interconnect instruction is given in step S1400 by adding the above-described conditions of C0. If the interconnect route is determined under these conditions, this interconnect model is adopted.

If an error message is displayed in step S1500, automatic interconnect instruction with additional conditions, as required, is given again (S1600).

In this manner, determination of interconnect routes can be performed efficiently and certainly by giving automatic interconnect instructions one after another by adding any optional interconnect conditions in addition to indispensable rules.

What is claimed is:

1. A method of determining interconnect routes in a circuit board, said interconnect routes running from a plurality of virtual interconnect targets to lands arranged in a matrix on at least one of inside and outside of said virtual interconnect target, said virtual interconnect target forming a target group arranged into a substantially rectangular frame, said method comprising:

a first step of assigning an order of priority to each of said lands; and a second step of performing processing for determining an interconnect route between a next virtual interconnect target adjacent to another virtual interconnect target of which an interconnect route has been determined and a next interconnect land according to said order of priority, wherein, in said first step, when a rectangle formed by said lands is divided into eight areas by centerlines and diagonals, and when a plurality of oblique lines connecting lands included in said lands which are adjoining each other in a direction parallel to the diagonals are priority order setting lines, priority of each land included in each of said divided areas is set so that higher priority is assigned to a land on one of said priority order setting lines further from the diagonals, and higher priority is assigned to a land positioned further from the target group, on the same priority order setting line.

2. The method of determining interconnect routes in a circuit board according to claim 1, in the case where the interconnect routes for outer lands positioned outside the target group are determined, wherein, in said second step, a number of interconnect routes being able to pass through a space between adjoining lands is previously set to a certain value and when the number of determined interconnect routes has reached said set value in the space between the adjoining lands, said processing for determining an interconnect route is performed to a next interconnect land that is an unconnected land and is one of the lands forming the space in which the number of the interconnects has reached said set value, instead of using said order of priority.

3. A method of determining interconnect routes in a circuit board, said interconnect routes running from a plurality of virtual interconnect targets to lands arranged in a matrix on at least one of inside and outside of said virtual interconnect target, said virtual interconnect target forming a target group arranged into a substantially rectangular frame, said method comprising:

a step of virtually placing a plurality of counters between each of said lands arranged in a matrix, said counters being opened by a specified rule and counting the number of interconnect routes passing through a space between adjoining lands;

an interconnect route determination step in which processing for determining an interconnect route is repeatedly performed, said processing for determining an interconnect route between a next virtual interconnect target adjacent to another virtual interconnect target of which an interconnect route has been determined and a next interconnect land which is selected by a specified rule, so that an interconnect, running through a space between lands in which an open counter exists, passes without intersecting with an interconnect route which has already been determined; and a counter control step in which, when count value of an open counter has reached a set amount, the open counter is closed and another counter associated with the open counter is opened or closed according to a specified rule, so as to set a route for leading a new interconnect.

4. The method of determining interconnect routes in a circuit board according to claim 3, in the case where the interconnect routes for outer lands positioned outside the target group are determined, wherein, in said counter control step, opening and closing conditions of said virtual counter are initially set according to a specified rule, and when a count value of an open counter has reached the set amount, said open counter is closed and another open counter of which an interconnect route to an assigned land thereof has been determined is also closed, then closed counters which are positioned on the opposite side of the open counters to be closed interposing assigned lands therebetween are opened, thereby setting a route for leading a new interconnect.

5. The method of determining interconnect routes in a circuit board according to claim 4, in the case where the interconnect routes for outer lands positioned outside the target group are determined, wherein, in said interconnect route determination step, each of interconnect routes from lands arranged in a matrix to plating leads disposed in the outer periphery of said lands is determined so that an interconnect, running through a space between lands in which an open counter exists, passes without intersecting with an interconnect route which has already been determined, and wherein, in said counter control step, when a count value of an open counter has reached the set amount due to said processing for determining an interconnect route between said plating leads and said lands, said open counter is closed, then a closed counter which is positioned on the opposite side of the open counter to be closed interposing an assigned land therebetween is opened, thereby setting a route for leading a new interconnect.

6. The method of determining interconnect routes in a circuit board according to claim 3, in the case where the interconnect routes for inner lands positioned inside the target group are determined, wherein, in said counter control step, opening and closing conditions of said virtually placed counter are initially set according to a specified rule, and when a count value of an open counter has reached the set amount, said open counter is closed, and other open counters on a centerline side and a target group side of a starting land of an interconnect, running through a space between lands in which said open counter is located are closed, is also closed, thereby setting a route for leading a new interconnect.

7. The method of determining interconnect routes in a circuit board according to any one of claims 3 to 6, comprising a step of inputting an interconnect parameter, wherein, in said interconnect route determination step, said processing for determining an interconnect route is performed based on the inputted parameter.

8. The method of determining interconnect routes in a circuit board according to claim 3, wherein an order of priority is previously assigned to each of said lands arranged in a matrix, and wherein said interconnect route determination step comprises:

a third step of determining a next interconnect land based on said order of priority of each of said lands and a presence or absence of the open counter; and a fourth step of performing processing for determining an interconnect route between the determined interconnect land and a virtual interconnect target based on a position of the open counter.

9. The method of determining interconnect routes in a circuit board according to claim 8, wherein, when a rectangle formed by said lands arranged in a matrix is divided into eight areas by centerlines and diagonals, and when a plurality of oblique lines connecting lands included in said lands which are adjoining each other in a direction parallel to the diagonals are priority order setting lines, priority of each land included in each of said divided areas is set so that higher priority is assigned to a land on one of said priority order setting lines further from the diagonals, and higher priority is assigned to a land positioned further from the target group, on the same priority order setting line.

10. The method of determining interconnect routes in a circuit board according to claim 9, in the case where the interconnect routes for inner lands positioned inside the target group are determined, wherein, when a plurality of oblique lines connecting lands included in said inner lands which are adjoining each other in a oblique direction intersecting with each of priority order setting lines are intersecting lines, an interconnect proceeding point is virtually positioned at each position where a plurality of intersecting lines and said plurality of priority order setting lines intersect each other, and wherein said third step further comprises:

a step of setting an order of priority among four interconnect proceeding points around an interconnect land, in the order of a first point on the target group side and the centerline side, and a second point on the target group side and the diagonal side, determining an interconnect drawing route from the interconnect land toward a point having higher priority on condition that an interconnect route exists, and, when an interconnect drawing route to the second point has been determined, closing a virtual counter on the target group side and the centerline side of the interconnect land; and a step of setting the order of priority for determining an interconnect route from an interconnect proceeding point selected as an interconnect route to a next interconnect proceeding point adjoining to the selected interconnect proceeding point, in the order of the target group side and the diagonal side, and determining an interconnect route toward a point positioned in a direction having higher priority, on condition that a virtual counter positioned on a route toward the next point is open.

11. A semiconductor device of which an interconnect route is determined using any one of the methods according to claims 1 to 10.

12. A device for determining interconnect routes in a circuit board comprising:

means for inputting an interconnect parameter, and means for determining an interconnect route between a virtual interconnect target group arranged in a rectangular shape and at least one of a land group rectangularly arranged around outside said virtual interconnect target group and a rectangular land group arranged inside said virtual interconnect target group, by using the method according to claim 7.

13. An information embodied on a computer-readable information storage medium for determining interconnect routes in a circuit board, said interconnect routes running from a plurality of virtual interconnect targets to lands arranged in a matrix on at least one of inside and outside of said virtual interconnect target, said virtual interconnect target forming a target group arranged into a substantially rectangular frame, said information further comprising:

a first information for assigning an order of priority to each of said lands; and a second information for performing processing for determining an interconnect route between a next virtual interconnect target adjacent to another virtual interconnect target of which an interconnect route has been determined and a next interconnect land according to said order of priority, wherein said first information comprises information for setting priority of each land included in each of said divided areas, when a rectangle formed by said lands is divided into eight areas by centerlines and diagonals, and when a plurality of oblique lines connecting lands included in said lands which are adjoining each other in a direction parallel to the diagonals are priority order setting lines, so that higher priority is assigned to a land on one of said priority order setting lines further from the diagonals, and higher priority is assigned to a land positioned further from the target group, on the same priority order setting line.

14. The information embodied on a computer-readable information storage medium according to claim 13, in the case where the interconnect routes for outer lands positioned outside the target group are determined, wherein said second information comprises information for:

previously setting a number of interconnect routes being able to pass through a space between adjoining lands to a certain value, and when the number of determined interconnect routes has reached said set value in the space between the adjoining lands, performing said processing for determining an interconnect route to a next interconnect land that is an unconnected land and is one of the lands forming the space in which the number of the interconnects has reached said set value, instead of using said order of priority.

15. An information embodied on a computer-readable information storage medium for determining interconnect routes in a circuit board, said interconnect routes running from a plurality of virtual interconnect targets to lands arranged in a matrix on at least one of inside and outside of said virtual interconnect target, said virtual interconnect target forming a target group arranged into a substantially rectangular frame, said information further comprising:

information for virtually placing a plurality of counters between each of said lands arranged in a matrix, said counters being opened by a specified rule and counting the number of interconnect routes passing through a space between adjoining lands;

information for determining an interconnect route in which processing for determining an interconnect route is repeatedly performed, said processing for determining an interconnect route between a next virtual interconnect target adjacent to another virtual interconnect target of which an interconnect route has been determined and a next interconnect land which is selected by a specified rule, so that an interconnect, running through a space between lands in which an open counter exists, passes without intersecting with an interconnect route which has already been determined; and information for counter control which, when count value of an open counter has reached a set amount, closes the open counter and opens or closes another counter associated with the open counter according to a specified rule, so as to set a route for leading a new interconnect.

16. The information embodied on a computer-readable information storage medium according to claim 15, in the case where the interconnect routes for outer lands positioned outside the target group are determined, wherein said information for counter control comprises information for:

initially setting opening and closing conditions of said virtual counter according to a specified rule, and when a count value of an open counter has reached the set amount, closing said open counter and another open counter of which interconnect route to an assigned land thereof has been determined, then opening closed counters which are positioned on the opposite side of the open counters to be closed interposing assigned lands therebetween, thereby setting a route for leading a new interconnect.

17. The information embodied on a computer-readable information storage medium according to claim 16, in the case where the interconnect route s for outer lands positioned outside the target group are determined, wherein said information for determining an interconnect route comprises information for determining each of interconnect routes from lands arranged in a matrix to plating leads disposed in the outer periphery of said lands so that an interconnect, running through a space between lands in which an open counter exists, passes without intersecting with an interconnect route which has already been determined, and wherein said information for counter control comprises information for, when a count value of an open counter has reached the set amount due to said processing for determining an interconnect route between said plating leads and said lands, closing said open counter, then opening a closed counter which is positioned on the opposite side of the open counter to be closed interposing an assigned land therebetween, thereby setting a route for leading a new interconnect.

18. The information embodied on a computer-readable information storage medium according to claim 15 in the case where the interconnect routes for inner lands positioned inside the target group are determined, wherein said information for counter control comprises information for:

initially setting opening and closing conditions of said virtually placed counter according to a specified rule, and when a count value of an open counter has reached the set amount, closing said open counter and other open counters on a centerline side and a target group side of a starting land of an interconnect which runs through a space between lands in which said open counter is located, thereby setting a route for leading a new interconnect.

19. The information embodied on a computer-readable information storage medium according to claim 15, wherein an order of priority is previously assigned to each of said lands arranged in a matrix, and wherein said information for determining an interconnect route comprises:

a third information for determining a next interconnect land based on said order of priority of each of said lands and a presence or absence of the open counter; and a fourth information for performing processing for determining an interconnect route between the determined interconnect land and a virtual interconnect target based on a position of the open counter.

20. The information embodied on a computer-readable information storage medium according to claim 19, wherein, when a rectangle formed by said lands arranged in a matrix is divided into eight areas by centerlines and diagonals, and when a plurality of oblique lines connecting lands included in said lands which are adjoining each other in a direction parallel to the diagonals are priority order setting lines, priority of each land included in each of said divided areas is set so that higher priority is assigned to a land on one of said priority order setting lines further from the diagonals, and higher priority is assigned to a land positioned further from the target group, on the same priority order setting line.

21. The information embodied on a computer-readable information storage medium according to claim 20, in the case where the interconnect routes for inner lands positioned inside the target group are determined, wherein, when a plurality of oblique lines connecting lands included in said inner lands which are adjoining each other in a oblique direction intersecting with each of priority order setting lines are intersecting lines, an interconnect proceeding point is virtually positioned at each position where a plurality of intersecting lines and said plurality of priority order setting lines intersect each other, and wherein said third information further comprises:

information for setting an order of priority among four interconnect proceeding points around an interconnect land, in the order of a first point on the target group side and the centerline side, and a second point on the target group side and the diagonal side, determining an interconnect drawing route from the interconnect land toward a point having higher priority on condition that an interconnect route exists, and, when an interconnect drawing route to the second point has been determined, closing a virtual counter on the target group side and the centerline side of the interconnect land; and information for setting the order of priority for determining an interconnect route from an interconnect proceeding point selected as an interconnect route to a next interconnect proceeding point adjoining to the selected interconnect proceeding point, in the order of the target group side and the diagonal side, and determining an interconnect route toward a point positioned in a direction having higher priority, on condition that the a virtual counter positioned on a route toward the next point is open.

22. The information embodied on a computer-readable information storage medium according to any one of claims 15 to 21, comprising information for inputting an interconnect parameter, wherein said information for determining an interconnect route comprises information for performing said processing for determining an interconnect route based on the inputted parameter.

23. A program embodied on a computer-readable information storage medium for performing:

inputting an interconnect parameter, and determining an interconnect route between a virtual interconnect target group arranged in a rectangular shape and at least one of a land group rectangularly arranged around outside said virtual interconnect target group and a rectangular land group arranged inside said virtual interconnect target group, by using the method according to claim 7.

* * * * *